US012376357B2

(12) United States Patent
Yeong et al.

(10) Patent No.: US 12,376,357 B2
(45) Date of Patent: Jul. 29, 2025

(54) FIN FIELD-EFFECT TRANSISTOR DEVICE AND METHOD

(71) Applicant: Taiwan Semiconductor Manufacturing Co., Ltd., Hsinchu (TW)

(72) Inventors: Sai-Hooi Yeong, Zhubei (TW); Kai-Hsuan Lee, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 675 days.

(21) Appl. No.: 17/678,554

(22) Filed: Feb. 23, 2022

(65) Prior Publication Data

US 2023/0008128 A1 Jan. 12, 2023

Related U.S. Application Data

(60) Provisional application No. 63/219,898, filed on Jul. 9, 2021.

(51) Int. Cl.
| | | |
|---|---|---|
| *H01L 21/3115* | (2006.01) | |
| *H01L 21/311* | (2006.01) | |
| *H01L 21/768* | (2006.01) | |
| *H10D 30/01* | (2025.01) | |
| *H10D 64/01* | (2025.01) | |
| *H10D 84/83* | (2025.01) | |

(52) U.S. Cl.
CPC ...... *H10D 64/015* (2025.01); *H01L 21/31111* (2013.01); *H01L 21/31155* (2013.01); *H10D 30/024* (2025.01); *H10D 84/834* (2025.01)

(58) Field of Classification Search
CPC .. H10D 64/015; H10D 30/024; H10D 84/834; H10D 30/797; H10D 62/822; H10D 64/017; H01L 21/31111; H01L 21/31155; H01L 21/76825; H01L 21/76897; H01L 2221/1063; H01L 21/31116; H01L 21/7682; H01L 21/76895; H01L 29/6653; H01L 27/0886; H01L 29/66795; H01L 29/165; H01L 29/66545; H01L 29/7848
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |

(Continued)

*Primary Examiner* — Yara B Green
*Assistant Examiner* — Akhee Sarker-Nag
(74) *Attorney, Agent, or Firm* — Slater Matsil, LLP

(57) ABSTRACT

A method includes depositing an interlayer dielectric (ILD) over a source/drain region, implanting impurities into a portion of the ILD, recessing the portion of the ILD to form a trench, forming spacers on sidewalls of the trench, the spacers including a spacer material, forming a source/drain contact in the trench and removing the spacers and the portion of the ILD with an etching process to form an air-gap, the air-gap disposed under and along sidewalls of the source/drain contact, where the etching process selectively etches the spacer material and the impurity.

20 Claims, 66 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2016/0365426 A1* | 12/2016 | Ching .................. H01L 21/283 |
| 2017/0352657 A1* | 12/2017 | Bergendahl .......... H10D 64/015 |
| 2018/0151442 A1* | 5/2018 | Tsai .................. H01L 21/31155 |
| 2019/0385896 A1* | 12/2019 | Chiang ................ H01L 23/485 |
| 2020/0203480 A1* | 6/2020 | Hu ..................... H10D 30/0243 |
| 2021/0376111 A1* | 12/2021 | Chuang ............... H10D 84/038 |

* cited by examiner

FIN FIELD-EFFECT TRANSISTOR DEVICE AND METHOD

PRIORITY CLAIM AND CROSS-REFERENCE

This patent application claims priority to U.S. Provisional Application No. 63/219,898, filed on Jul. 9, 2021 and entitled "Self Aligned MD Contact Fly Circuit Routing with Air Gap Technology," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
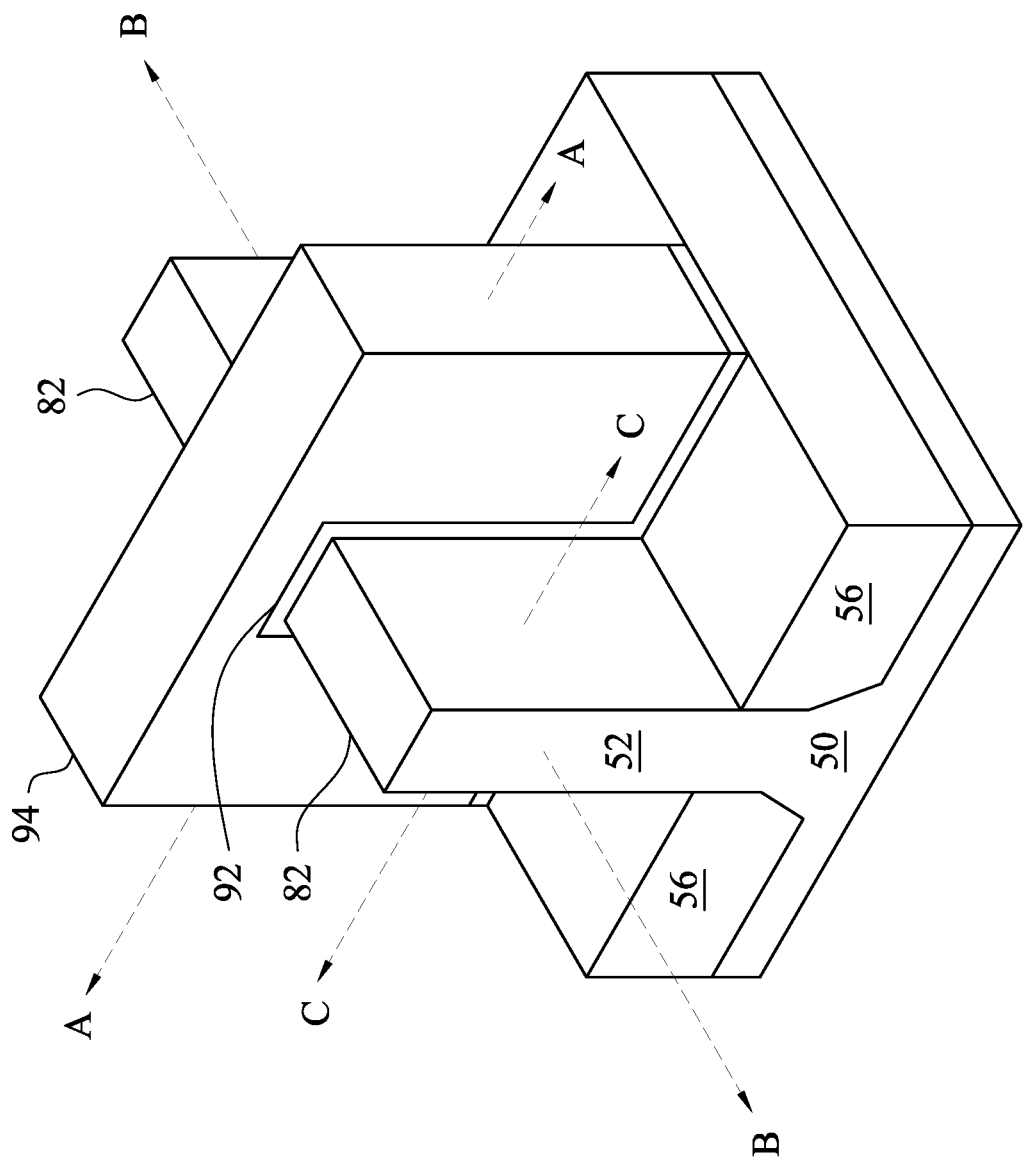
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to the formation of a source/drain contact that overlaps a first and a second semiconductor fin that are adjacent to each other. A sacrificial layer is formed on the sidewalls of the source/drain contact, and the source/drain contact is formed over a first dielectric layer. The first and the second semiconductor fin are oriented in a first direction (e.g., the X-direction) and the source/drain contact is oriented in a second direction (e.g., the Y-direction) perpendicular to the first direction. The source/drain contact extends over source/drain regions in the first and the second semiconductor fins, and is used to apply a voltage to the source/drain region in the second semiconductor fin, but is isolated from and does not apply a voltage to the source/drain region in the first semiconductor fin. Such a contact may be referred to as a "flyover source/drain contact," as it passes over, but is not connected to, the source/drain region in the first semiconductor fin. The source/drain contact is electrically coupled to a conductive line that overlaps the first semiconductor fin, wherein the conductive line has the same orientation (e.g., the X-direction) as the first semiconductor fin. The conductive line may thus be connected to the source/drain region in the second semiconductor fin and isolated from the source/drain region in the first semiconductor fin, even though the conductive line is disposed over the first semiconductor fin. The first dielectric layer and the sacrificial layer are selectively etched to form an air-gap along sidewalls of and under the source/drain contact. A second dielectric layer is then formed over the source/drain contact and the air-gap to seal the air-gap. The air-gap separates the source/drain contact from the underlying source/drain region in the first semiconductor fin. The presence of the air-gap under the source/drain contact results in a reduction in parasitic capacitance while still maintaining adequate isolation and device reliability. Further, the disclosed methods may be integrated easily into existing processes and therefore provides a solution while allowing for lower manufacturing costs.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used.

FIGS. 2 through 14C are various views of intermediate stages in the manufacturing of a semiconductor device, in accordance with some embodiments. FIGS. 2, 3, 4, 5, 6, 7, 8A, 9A, 10A, 11A, 12A, 13A, and 14A are cross-sectional views illustrated along a similar cross-section A-A illustrated in FIG. 1, except for multiple fins/FinFETs. FIGS. 8B, 9B, 10B, 11B, 12B, 13B, and 14B are cross-sectional views illustrated along a similar cross-section B-B illustrated in FIG. 1, except for multiple fins/FinFETs. FIGS. 10C and 10D are cross-sectional views illustrated along reference cross-section C-C illustrated in FIG. 1, except for multiple fins/FinFETs.

Figure 2:
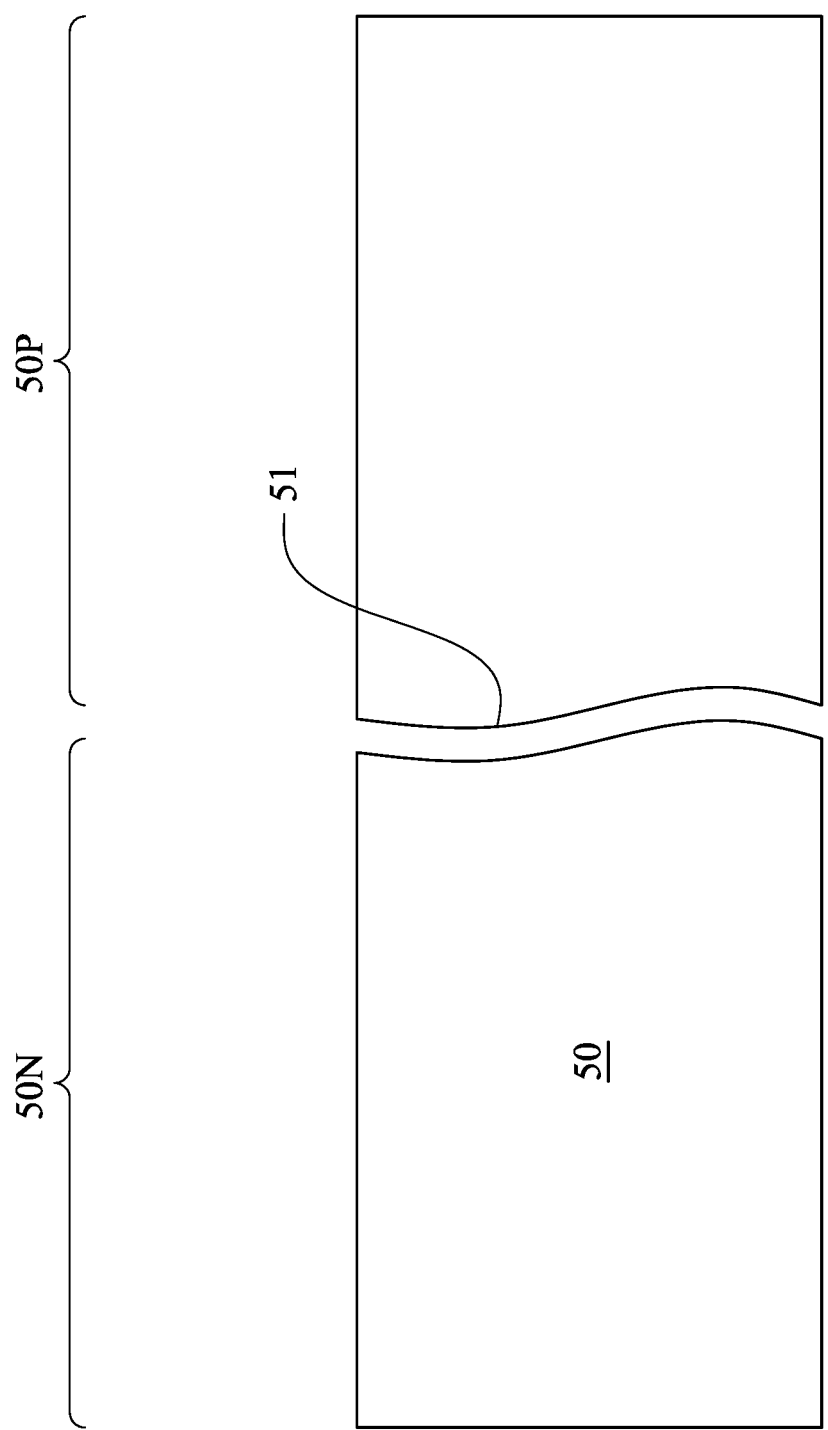
FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, and 15A are cross-sectional views of intermediate stages in the manufacturing of a semiconductor device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
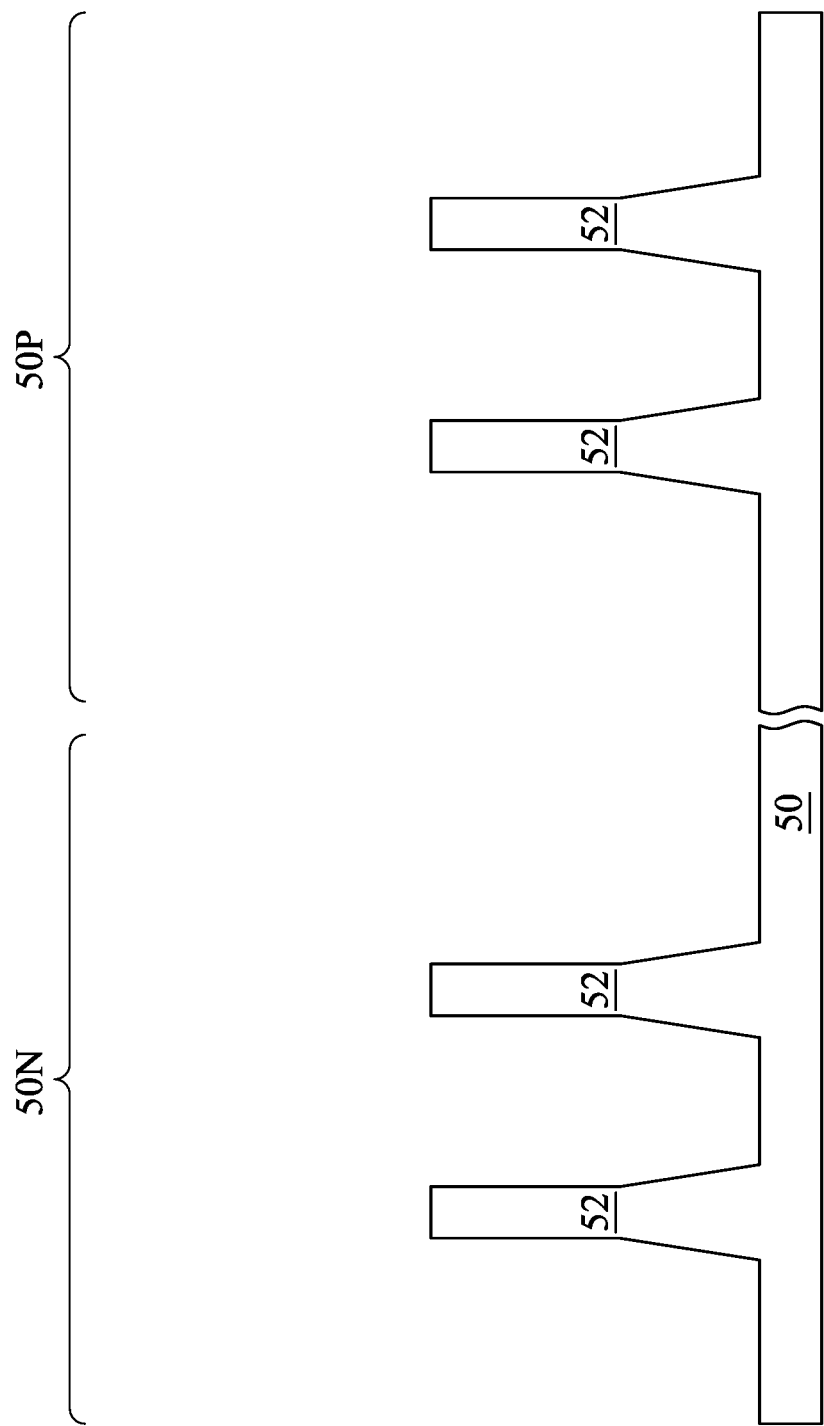

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
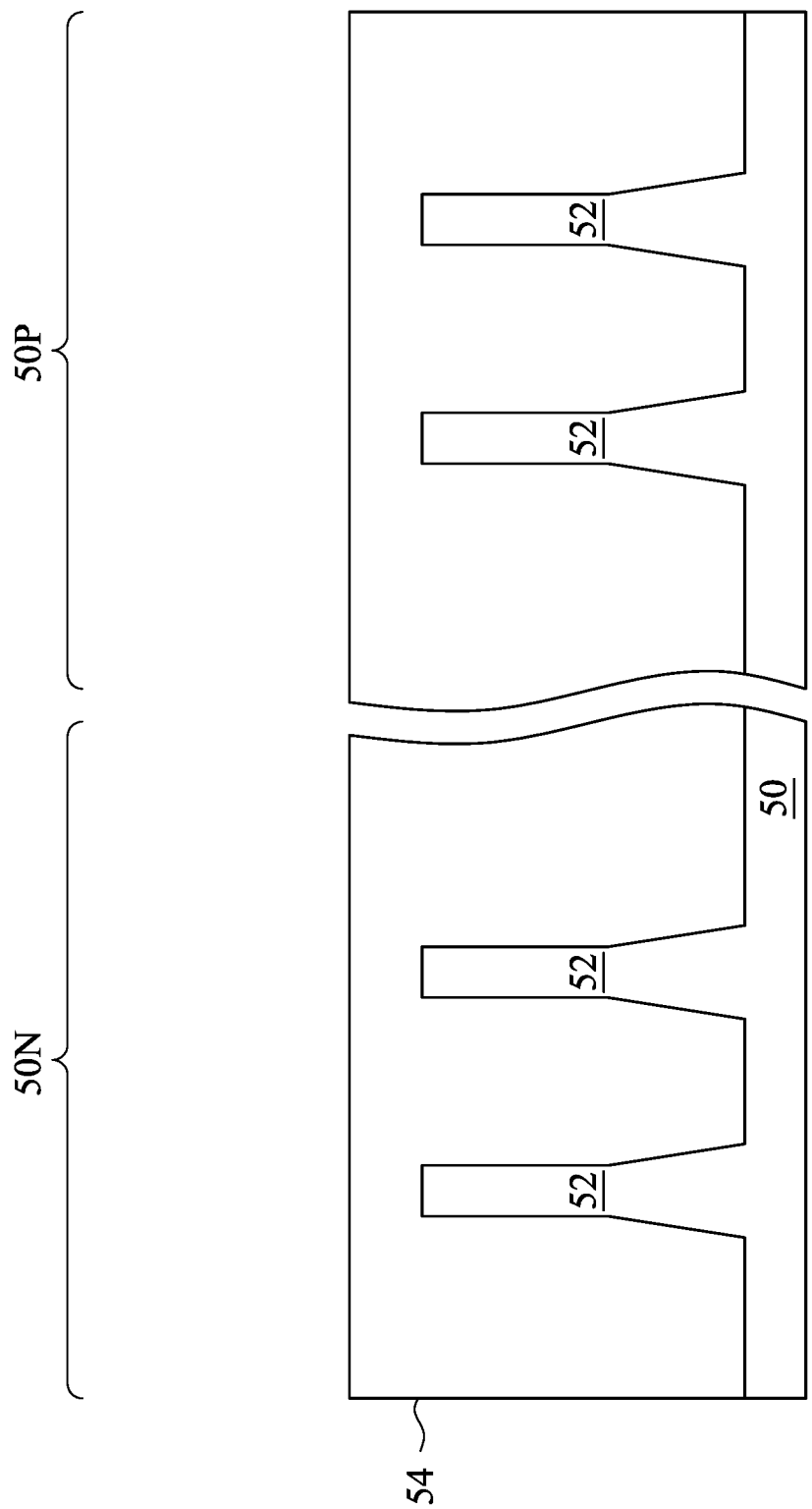

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
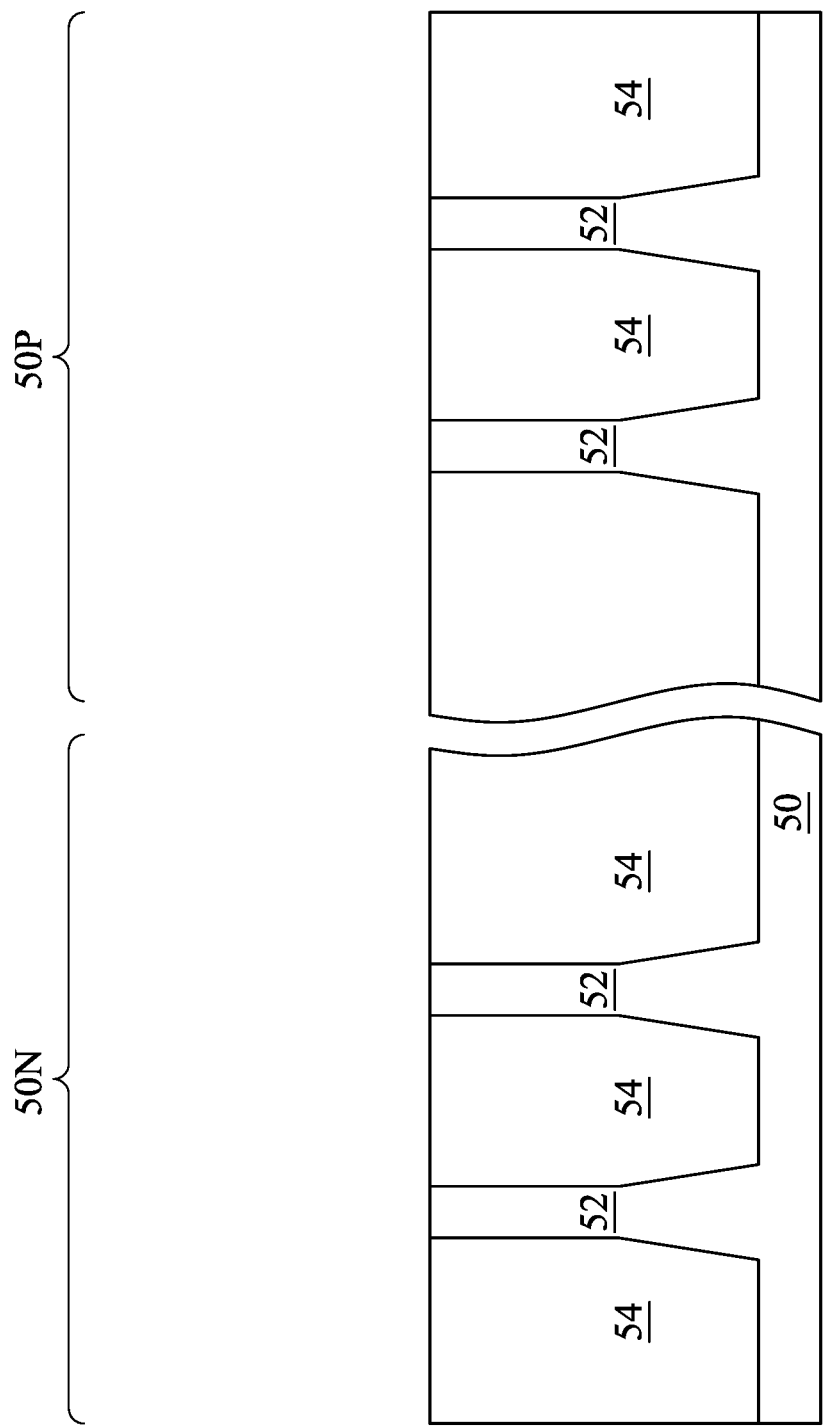

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are coplanar (within process variations) after the planarization process is complete. In embodiments in which a mask remains on the fins 52, the planarization process may expose the mask or remove the mask such that top surfaces of the mask or the fins 52, respectively, and the insulation material 54 are coplanar (within process variations) after the planarization process is complete.

Figure 6:
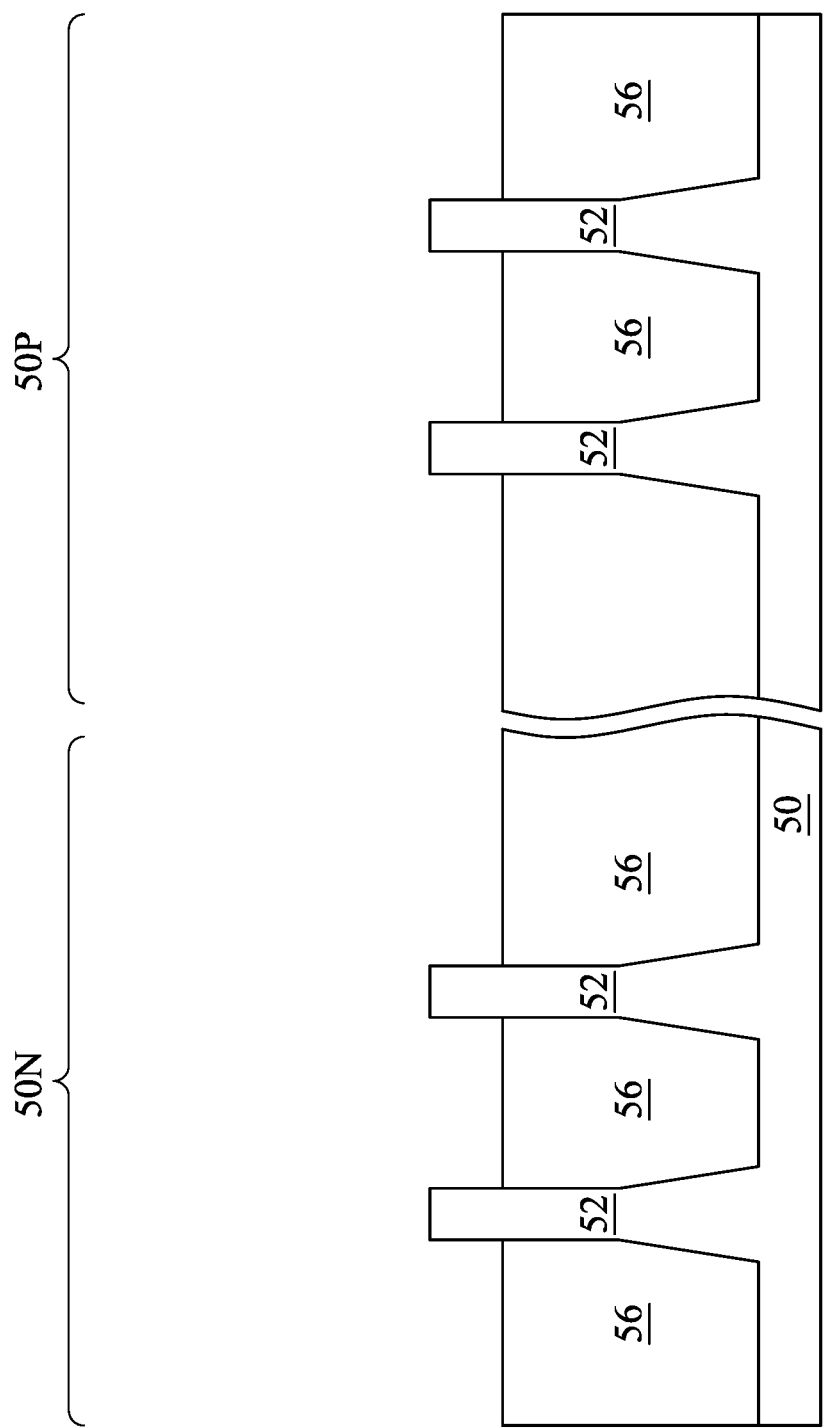

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
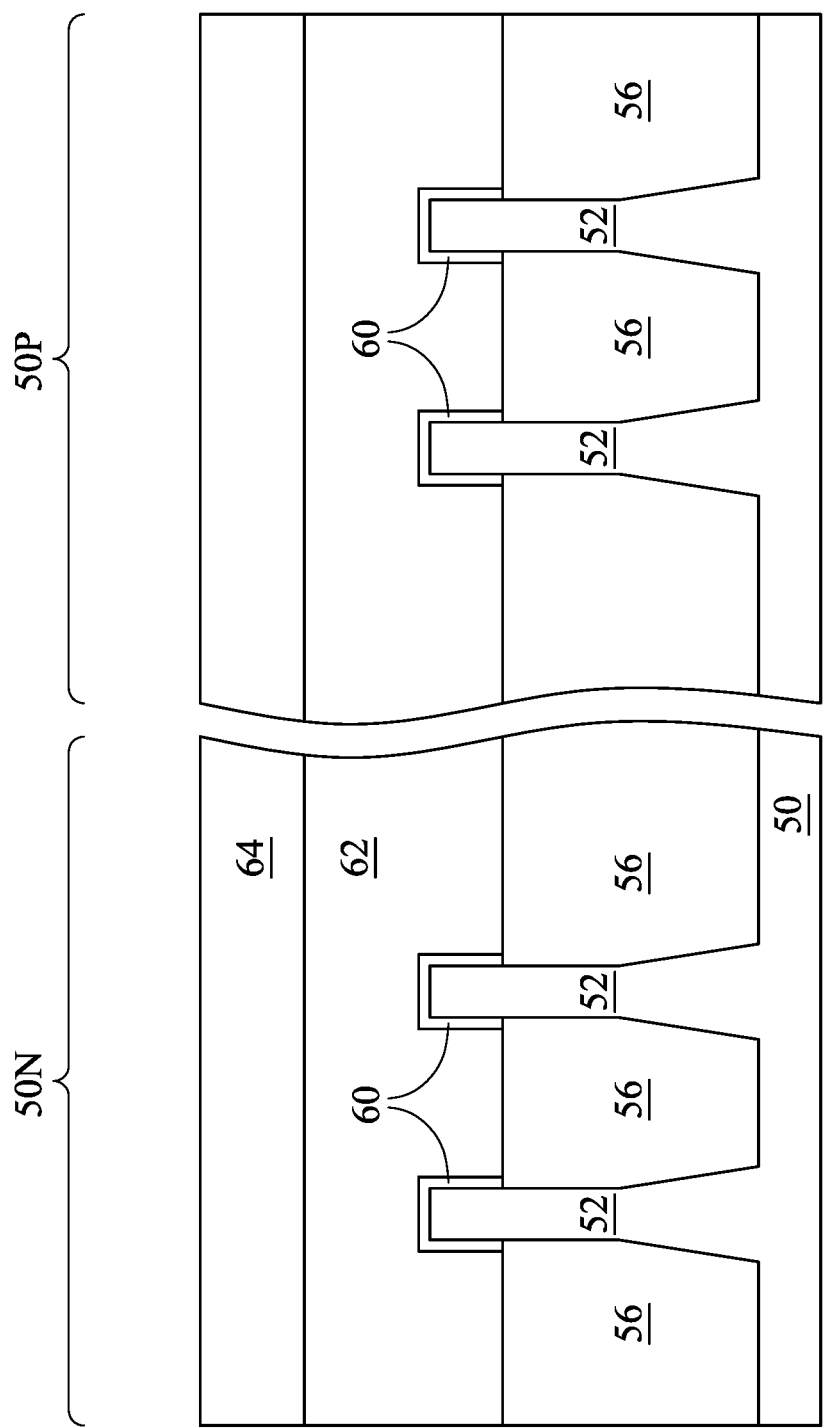

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 14C illustrate various additional steps in the manufacturing of embodiment devices. FIGS. 8A through 14C illustrate features in either of the n-type region 50N and the p-type region 50P. For example, the structures illustrated in FIGS. 8A through 14C may be applicable to both the n-type region 50N and the p-type region 50P.

Differences (if any) in the structures of the n-type region 50N and the p-type region 50P are described in the text accompanying each figure.

Figure 8B:
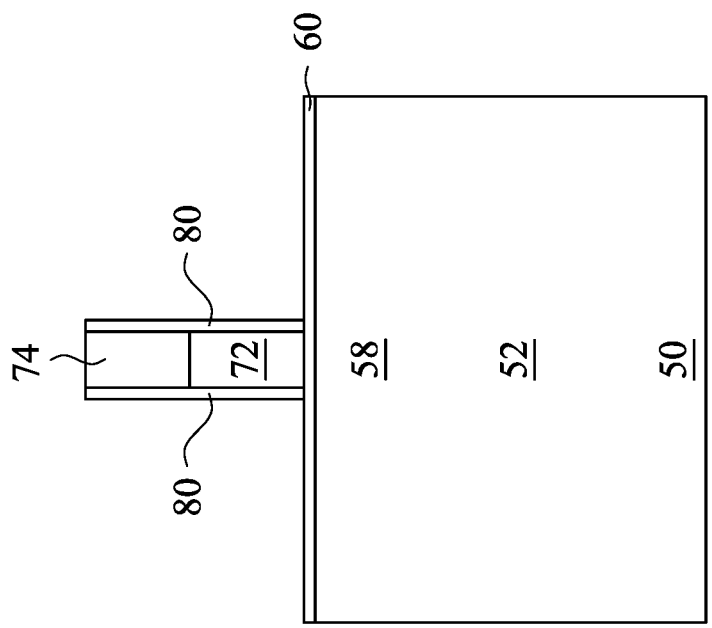
Figure 8A:
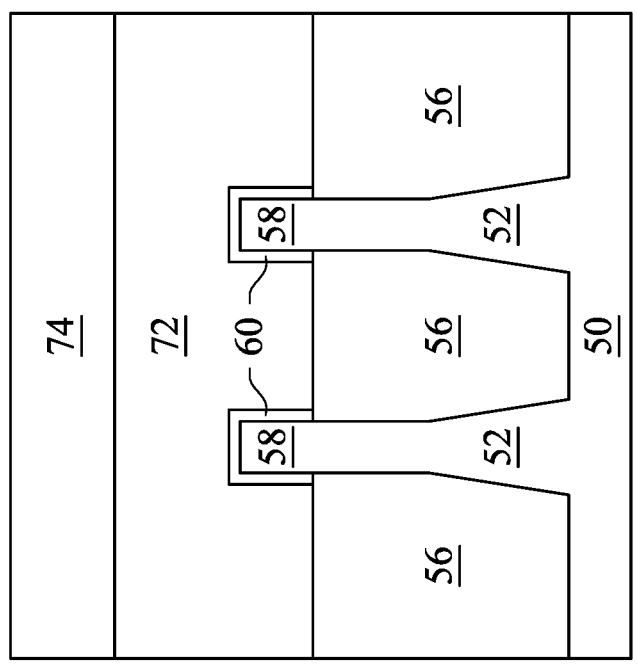

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
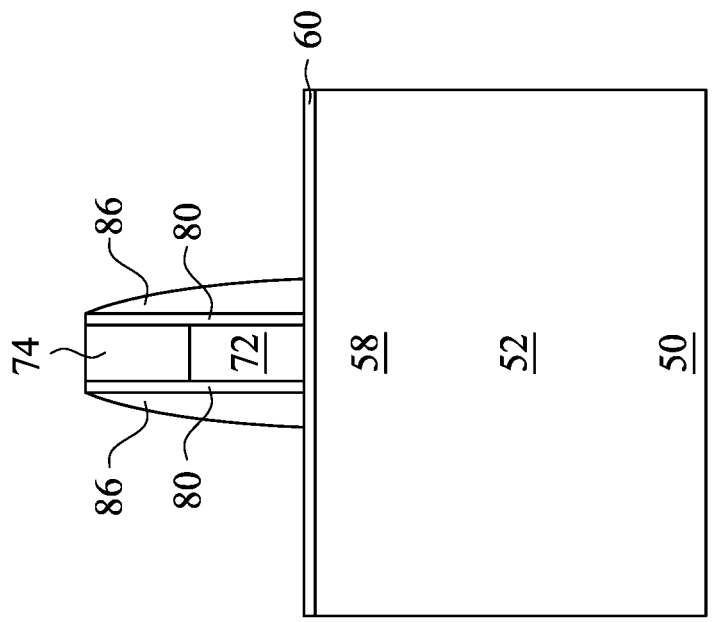
Figure 9A:
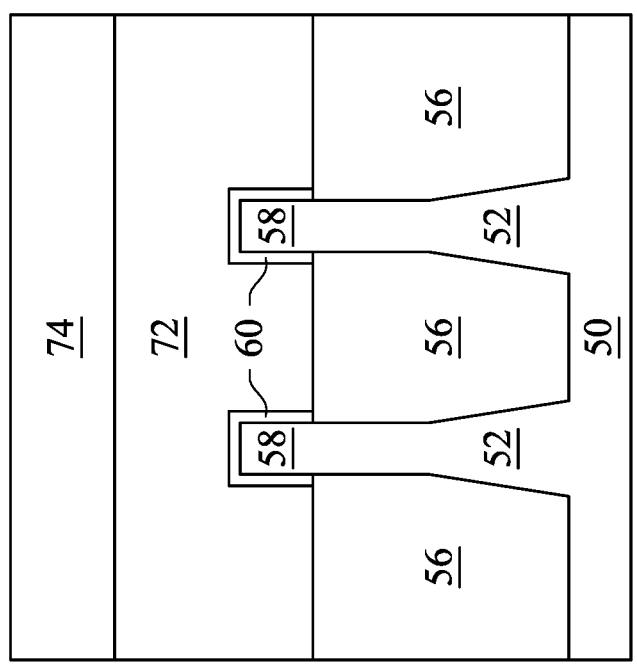

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
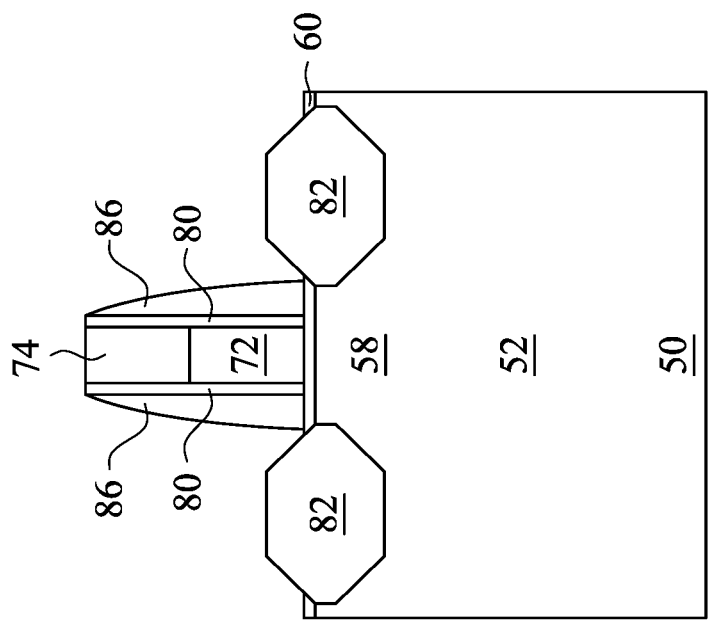
Figure 10A:
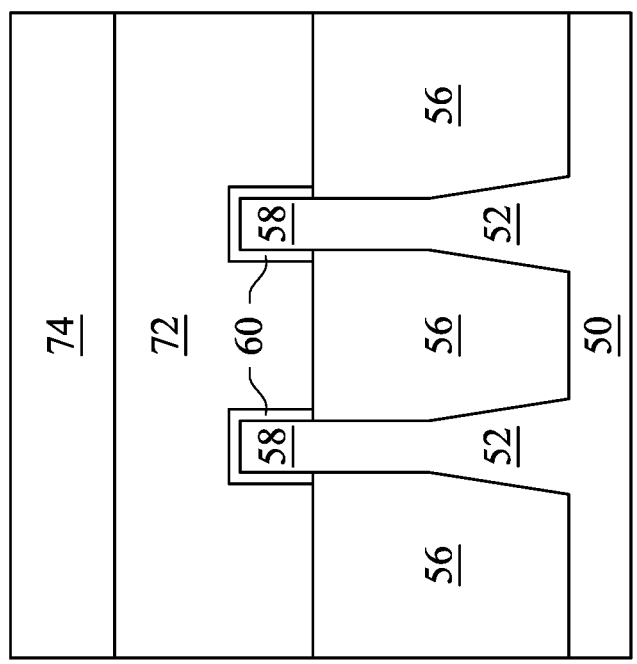
Figure 10C:
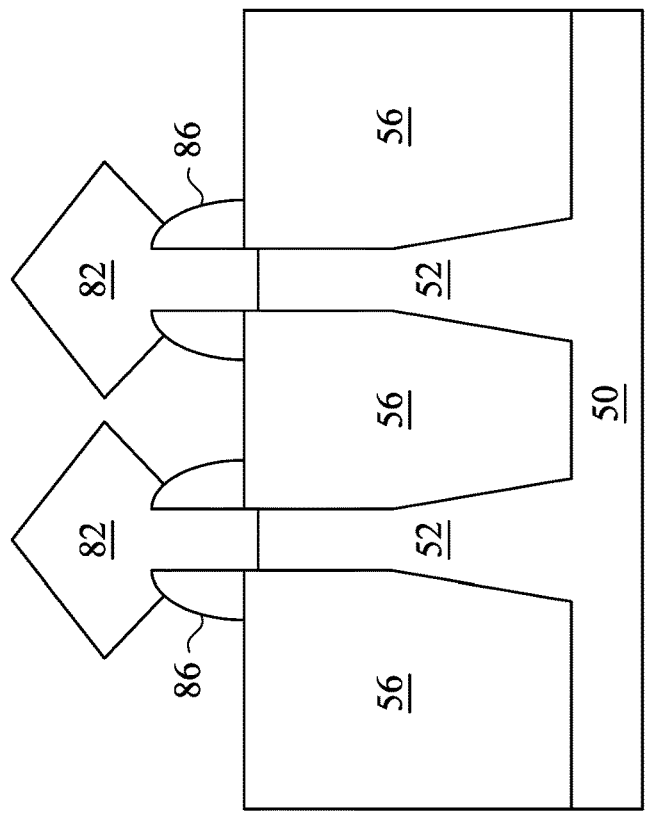
Figure 10D:
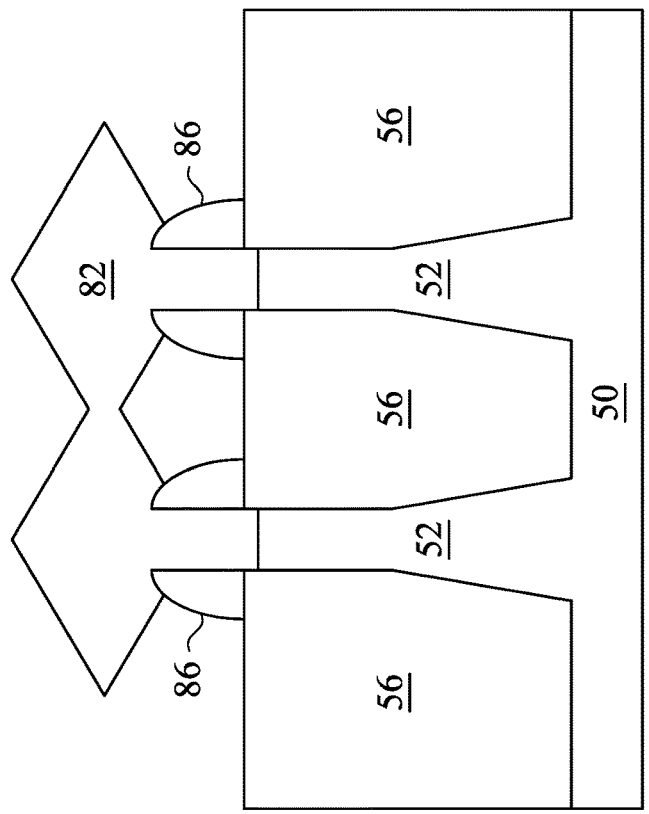

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
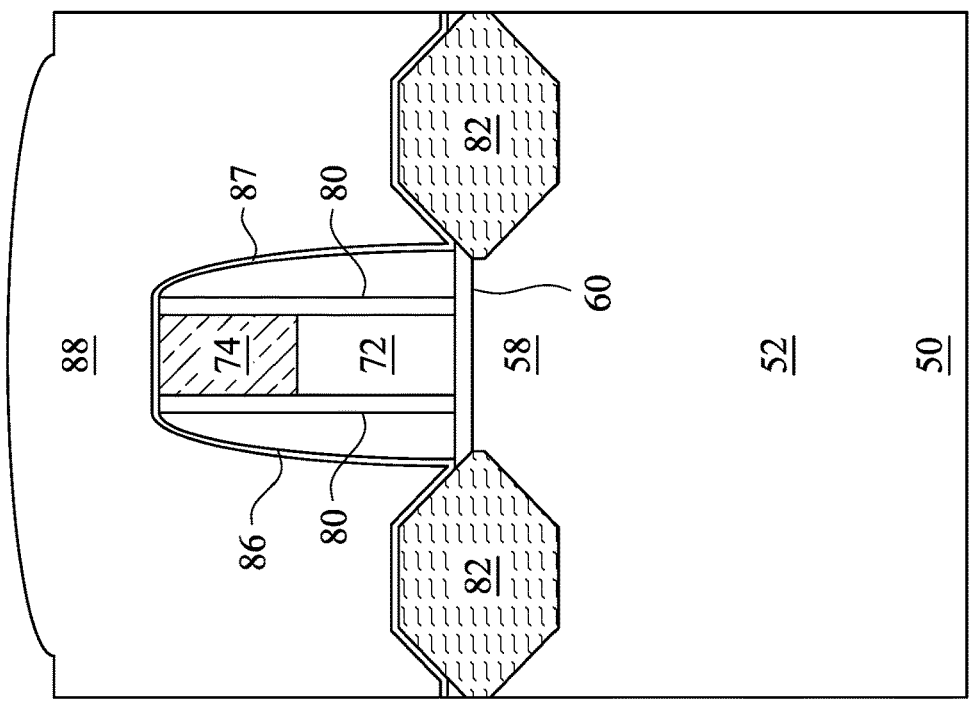
Figure 11A:
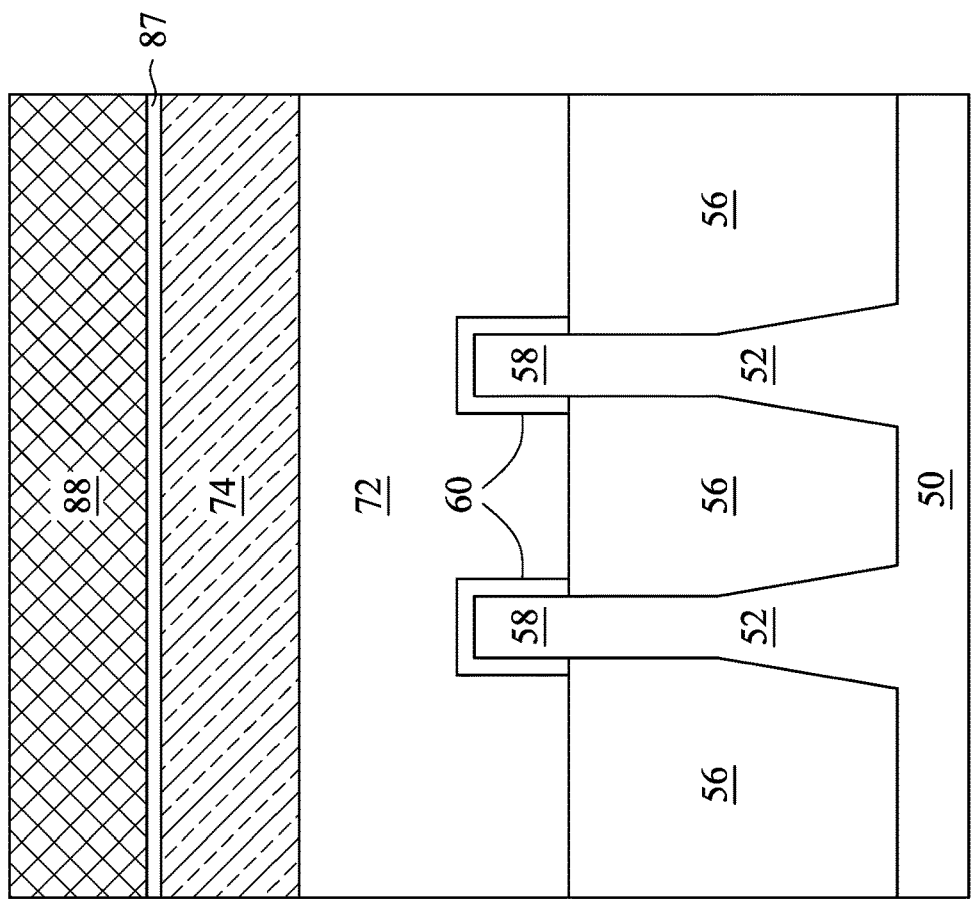

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the first ILD 88.

Figure 12B:
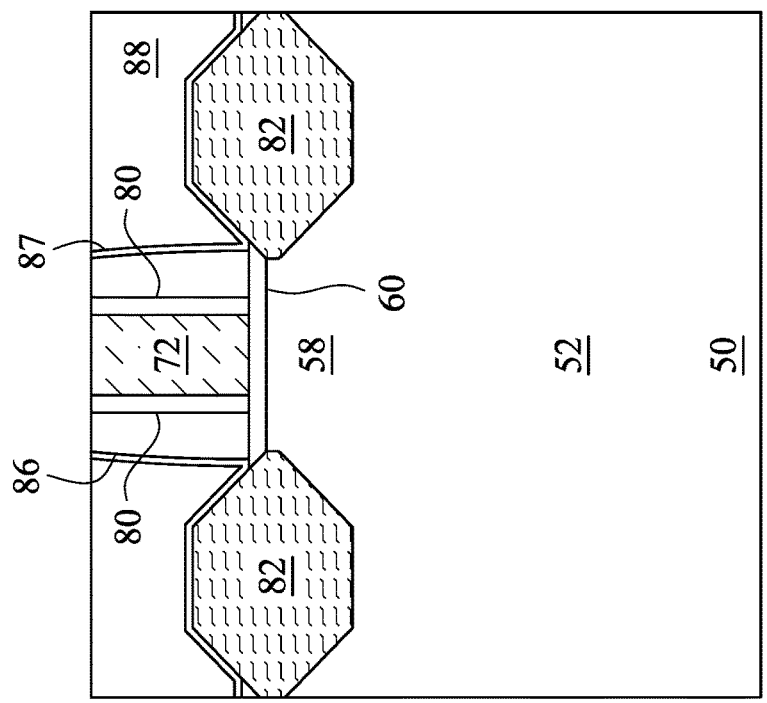
Figure 12A:
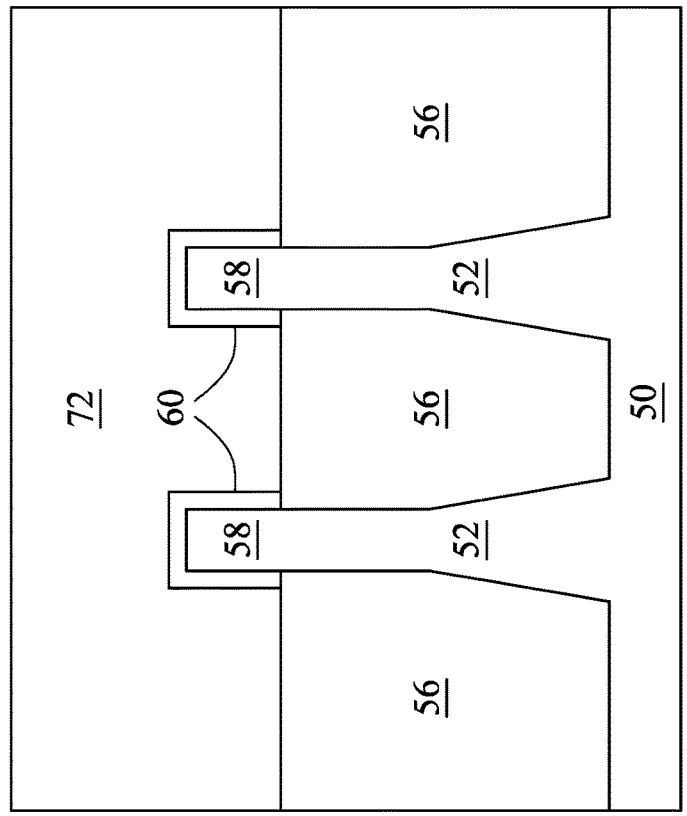

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are coplanar (within process variations). Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
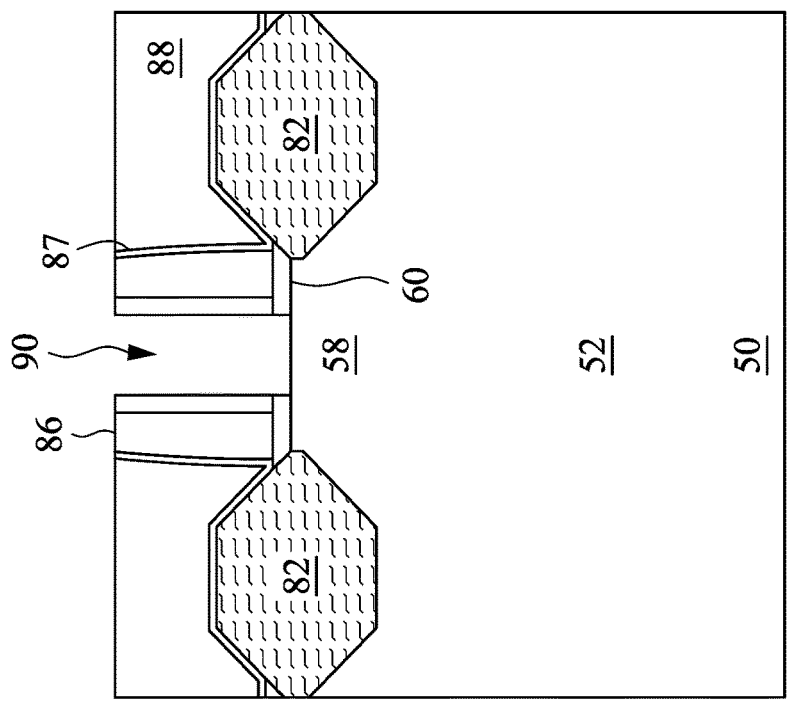
Figure 13A:
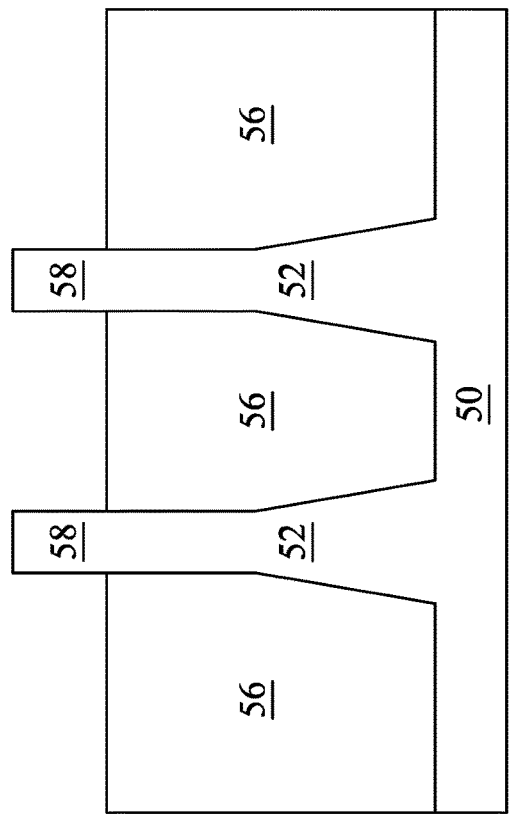

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. Portions of the dummy dielectric layer 60 in the recess 90 may then be optionally removed after the removal of the dummy gates 72.

Figure 14B:
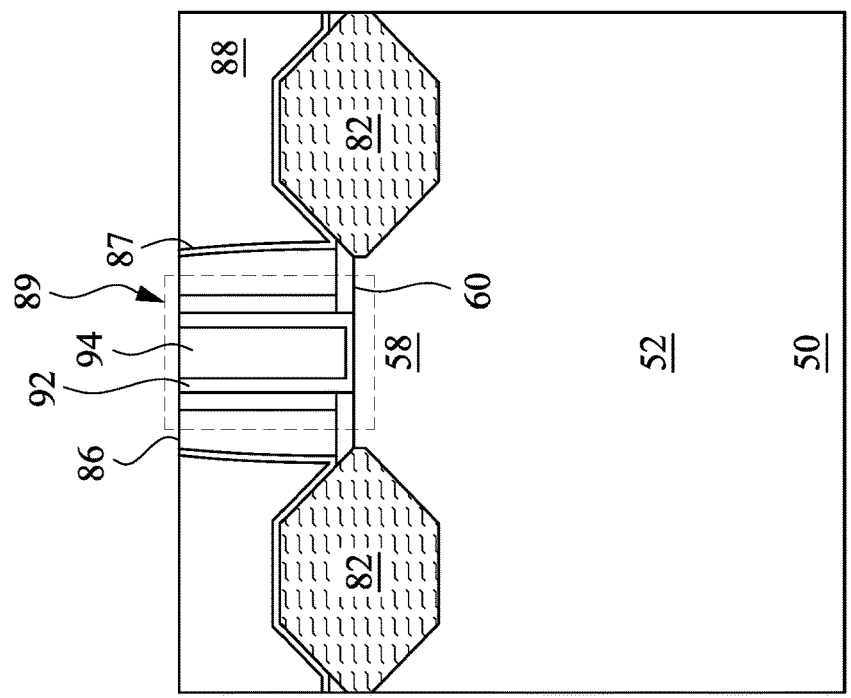
Figure 14A:
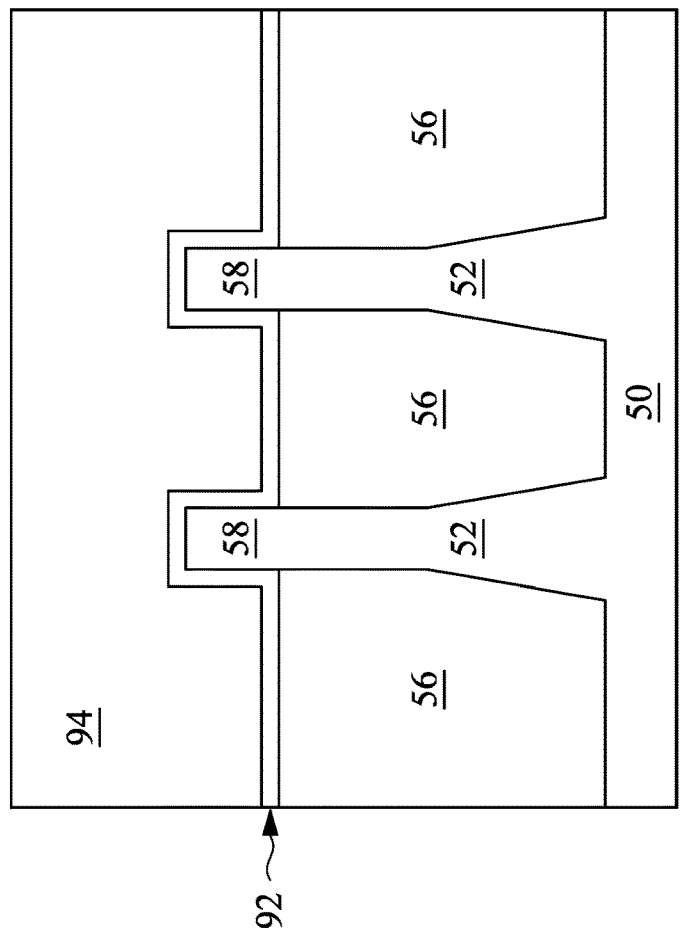
Figure 14C:
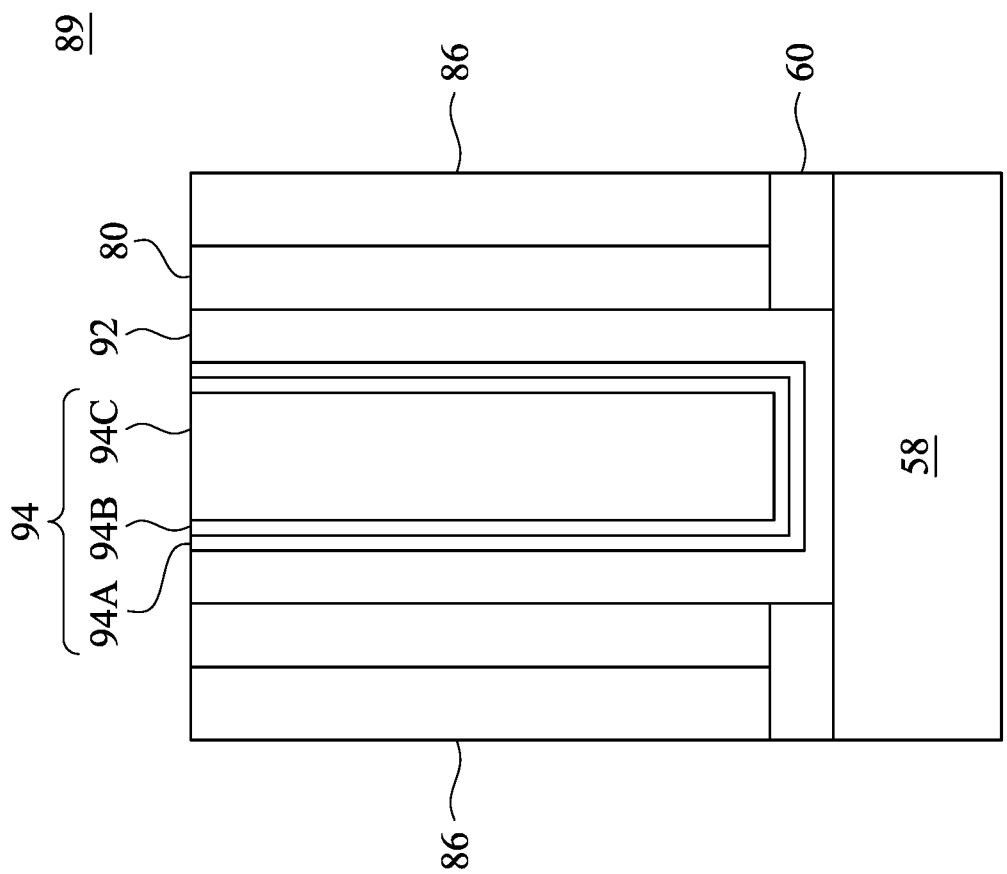

In FIGS. 14A and 14B, gate dielectric layers 92 and gate electrodes 94 are formed for replacement gates. FIG. 14C illustrates a detailed view of region 89 of FIG. 14B. Gate dielectric layers 92 one or more layers deposited in the recesses 90, such as on the top surfaces and the sidewalls of the fins 52 and on sidewalls of the gate seal spacers 80/gate spacers 86. The gate seal spacers 80 may not be shown in subsequent Figures. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate structure." The gate and the gate structures may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15A:
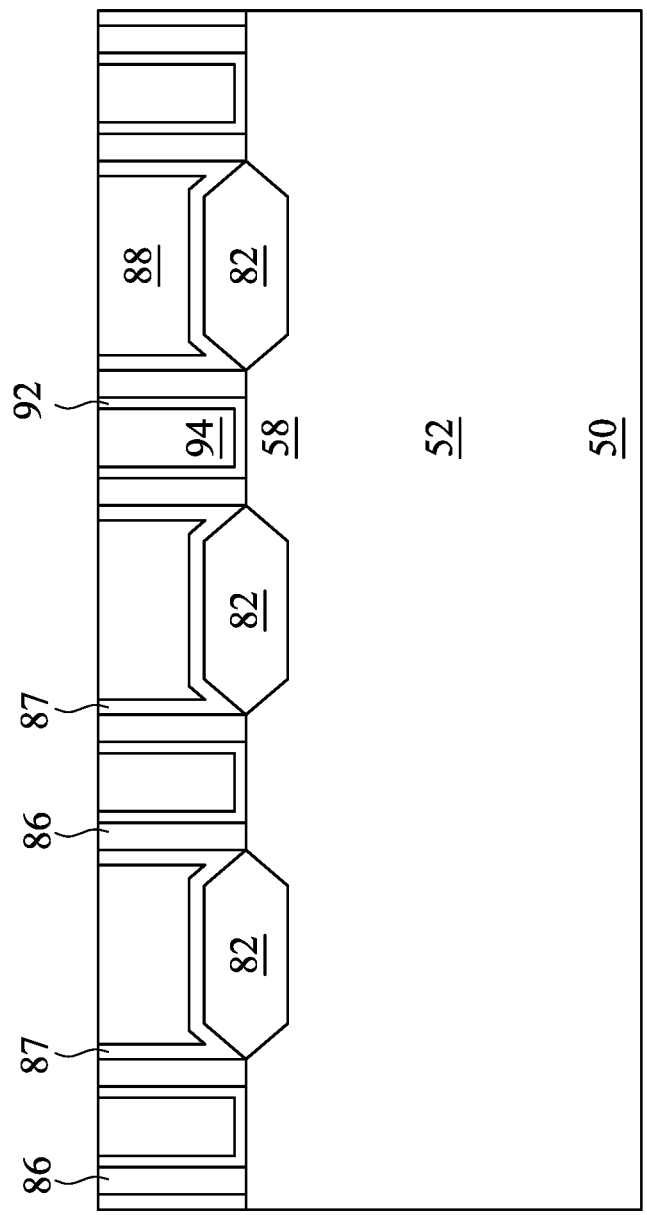
Figure 15B:
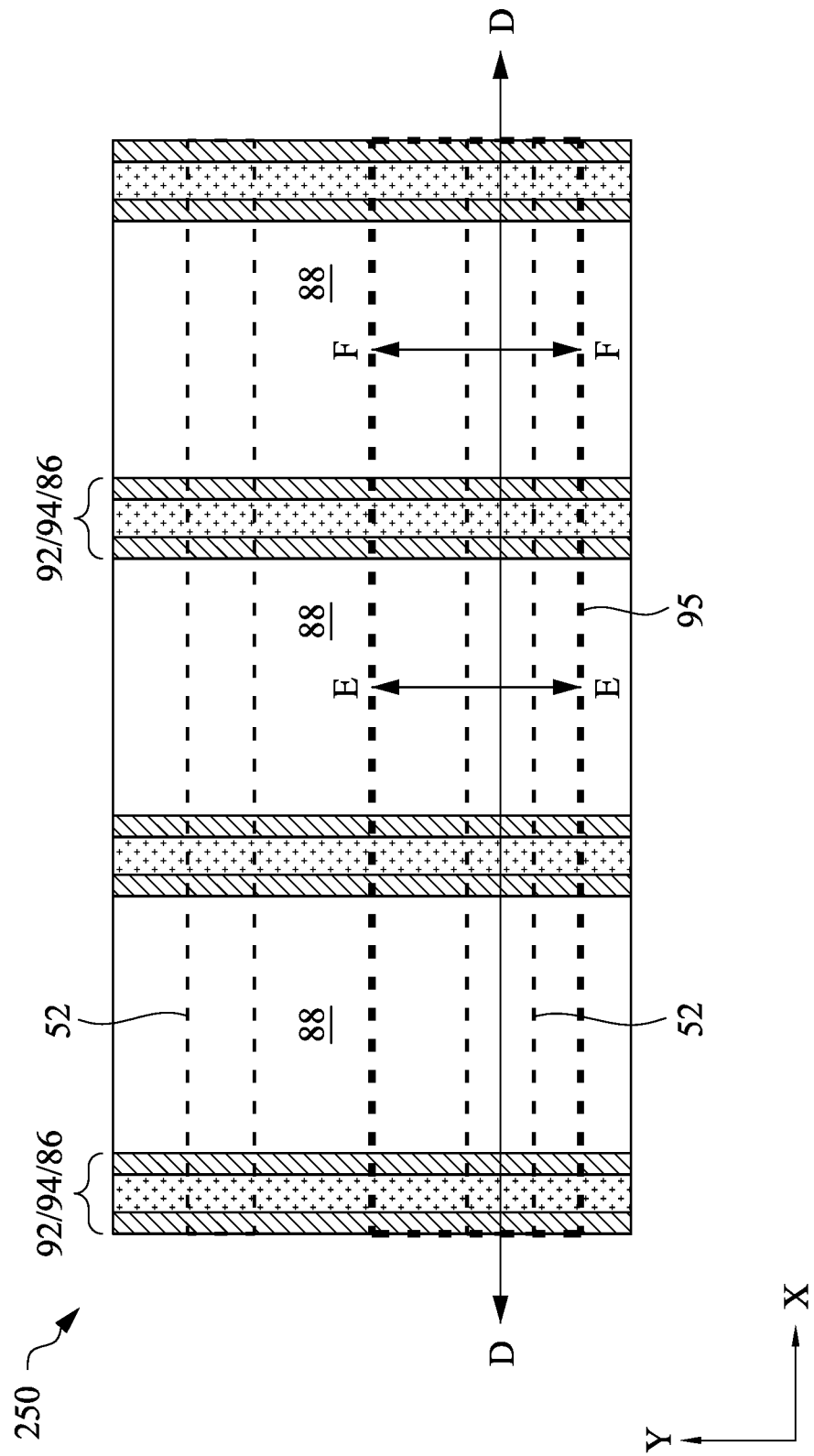
FIG. 15B is a top-view of a semiconductor device, in accordance with some embodiments.

FIG. 15A is cross-sectional view of an intermediate stage in the manufacturing of a semiconductor device 250 along a similar cross-section B-B illustrated in FIG. 1. FIG. 15B illustrates a top-view of the semiconductor device 250 shown in FIG. 15A, where FIG. 15A is shown along cross-section D-D illustrated in FIG. 15B. Unless specified otherwise, like reference numerals in this embodiment (and subsequently discussed embodiments) represent like components in the embodiment shown in FIGS. 1 through 14C formed by like processes. Accordingly, the process steps and applicable materials may not be repeated herein. FIGS. 15A and 15B illustrate the semiconductor device 250 comprising a first and a second fin 52 (shown in ghost in FIG. 15B) that are adjacent to each other. The semiconductor device 250 comprises the first ILD 88 over and between the first fin 52 and the second fin 52. The first fin 52 and the second fin 52 are oriented in a first direction (e.g., the X-direction). FIGS.

15A and 15B also illustrate four gate structures (each gate structure including a gate electrode 94 and a gate dielectric layer 92) extending over and along sidewalls of channel region 58 of the first fin 52 and the second fin 52. Although a first fin 52 and a second fin 52 are shown in FIG. 15B, in an embodiment, the semiconductor device 250 may comprise more than two fins. In addition, although four gate structures are shown in FIGS. 15A and 15B, in an embodiment, the semiconductor device 250 may comprise less than four gate structures or more than four gate structures.

FIGS. 16 through 40F illustrate various additional steps in the manufacturing of embodiment devices. FIGS. 16, 17, 18, 19, 20, 21A, 22A, 23A, 24A, 25A, 26A, 27A, 28A, 29A, 30A, 31A, 32A, 33A, 34A, 35A, 36A, 37A, 38A, 39A, and 40A, are cross-sectional views of the semiconductor device 250 illustrated along a cross-section similar to cross-section D-D illustrated in FIG. 15B. FIGS. 21B, 22B, 23B, 24B, 25B, 26B, 27B, 28B, 29B, 30B, 31B, 32B, 33B, 34B, 35B, 36B, 37B, 38B, and 39B are cross-sectional views of a region 95 (see FIG. 15B) of the semiconductor device 250 along a cross-section similar to cross-section E-E illustrated in FIG. 15B. FIG. 40B is a perspective view of the semiconductor device 250. FIG. 40C is a top-down view of the semiconductor device 250. FIG. 40D is a cross-sectional view of the semiconductor device 250 along a cross-section similar to cross-section G-G illustrated in FIG. 40C. FIG. 40E is a cross-sectional view of the semiconductor device 250 along a cross-section similar to cross-section H-H illustrated in FIG. 40C. FIG. 40F is a cross-sectional view of the semiconductor device 250 along a cross-section similar to cross-section I-I illustrated in FIG. 40C.

Figure 16:
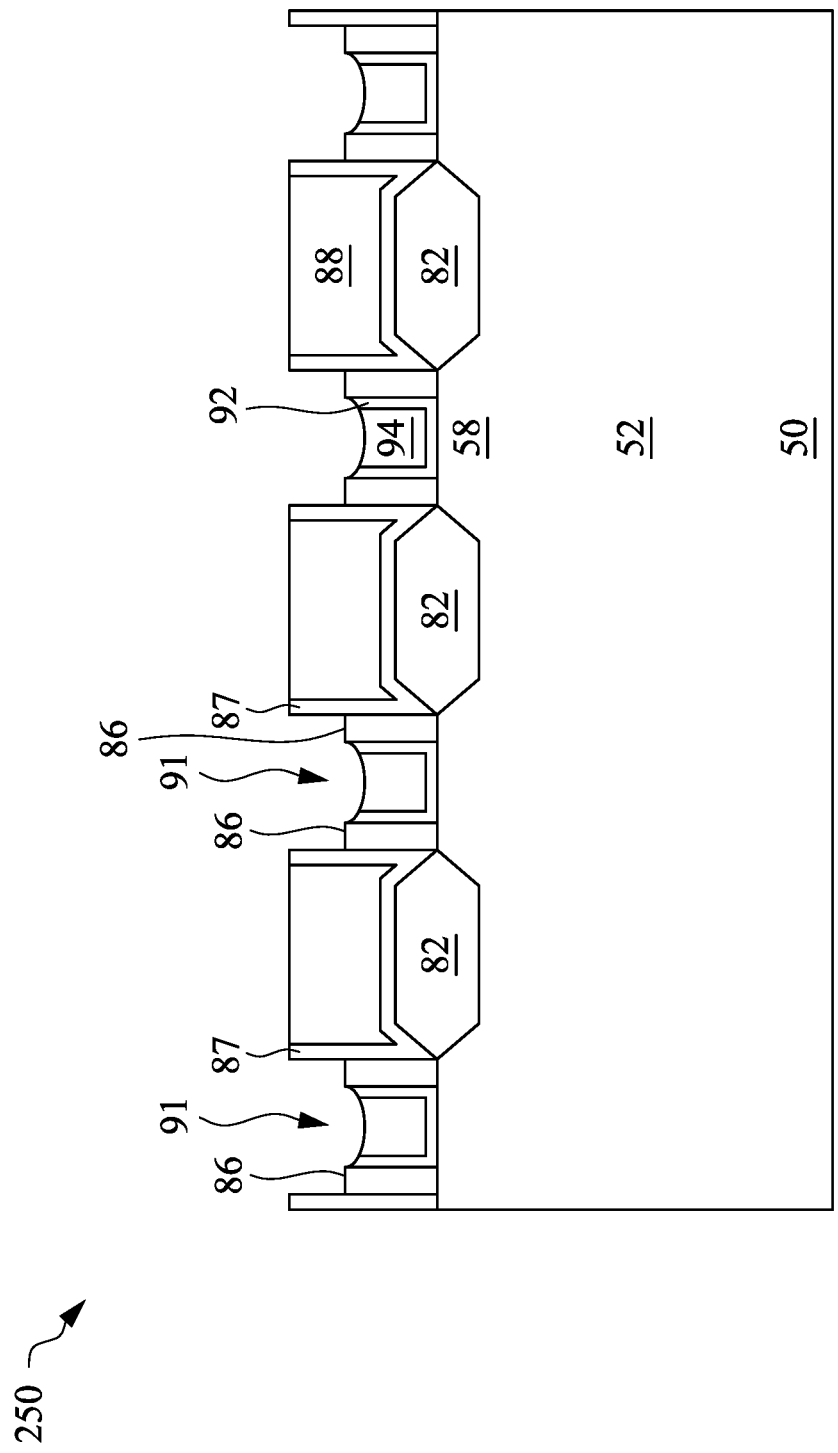
FIGS. 16, 17, 18, 19, 20, 21A, 21B, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, 35B, 36A, 36B, 37A, 37B, 38A, 38B, 39A, 39B and 40A, are cross-sectional views of intermediate stages in the manufacturing of a semiconductor device, in accordance with some embodiments.

In FIG. 16, the gate spacers 86 and the gate structures (each gate structure including a gate electrode 94 and a gate dielectric layer 92) are recessed below the upper surface of the first ILD 88 to form recesses 91. In some embodiments, an anisotropic etching process, such as a dry etch process, is performed to remove upper portions of the gate spacers 86 and the gate structures. After the upper portions of the gate spacers 86 and the gate structures are removed, top surfaces of the gate spacers 86 may be above or below the top surfaces of the gate structures. In an embodiment, after the upper portions of the gate spacers 86 and the gate structures are removed, top surfaces of the gate structures may be curved (e.g., concave).

Figure 17:
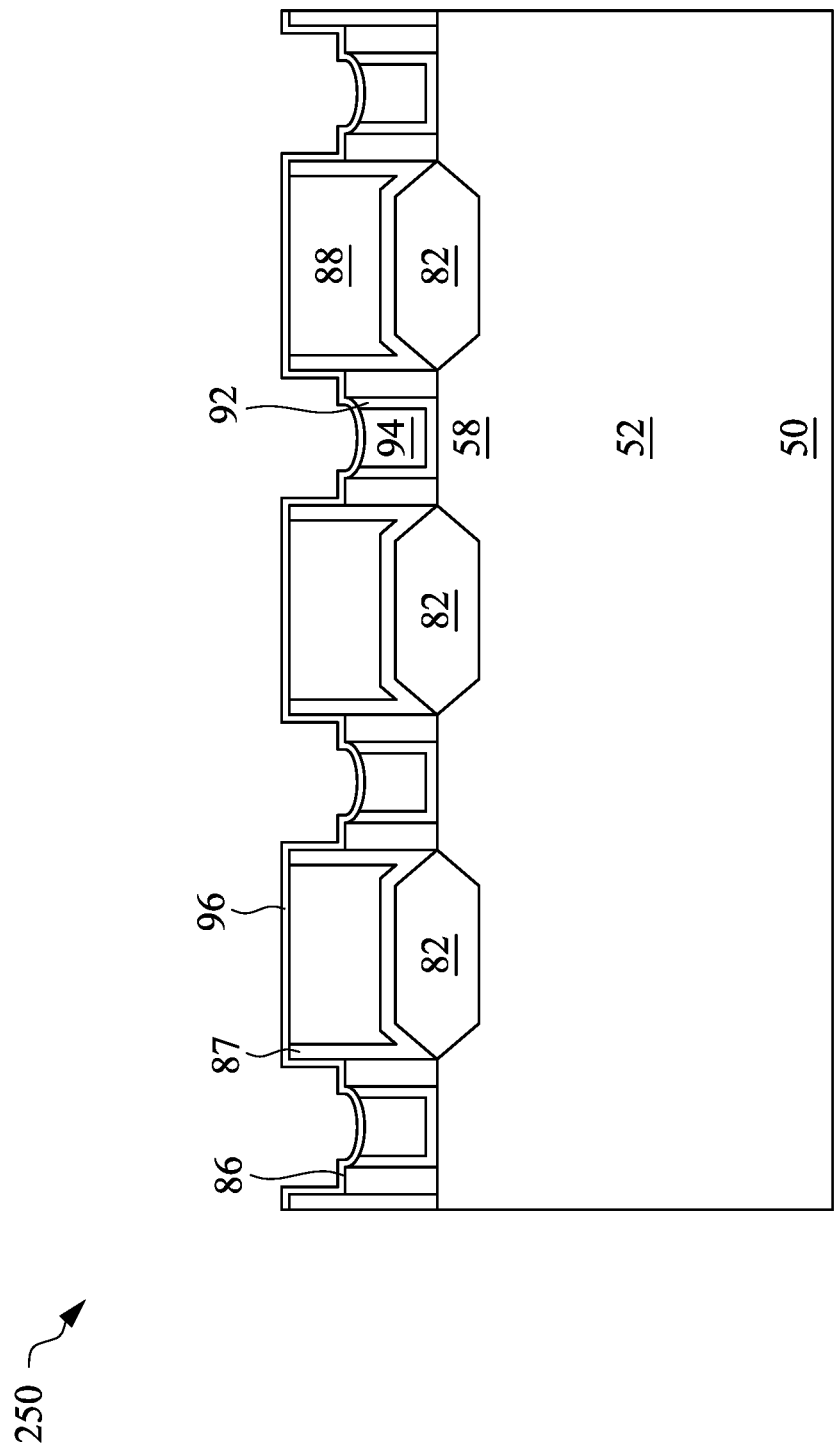

In FIG. 17, a dielectric layer 96 is formed conformally over the structure of FIG. 16, such as over the first ILD 88, the CESL 87, the gate spacers 86, the gate electrodes 94, and the gate dielectric layers 92. The dielectric layer 96 may comprise silicon nitride, silicon oxide, or the like, and may be formed using a suitable formation method such as ALD, plasma enhanced atomic layer deposition (PEALD), or the like. The dielectric layer 96 is formed to line sidewalls and bottoms of the recesses 91.

Figure 18:
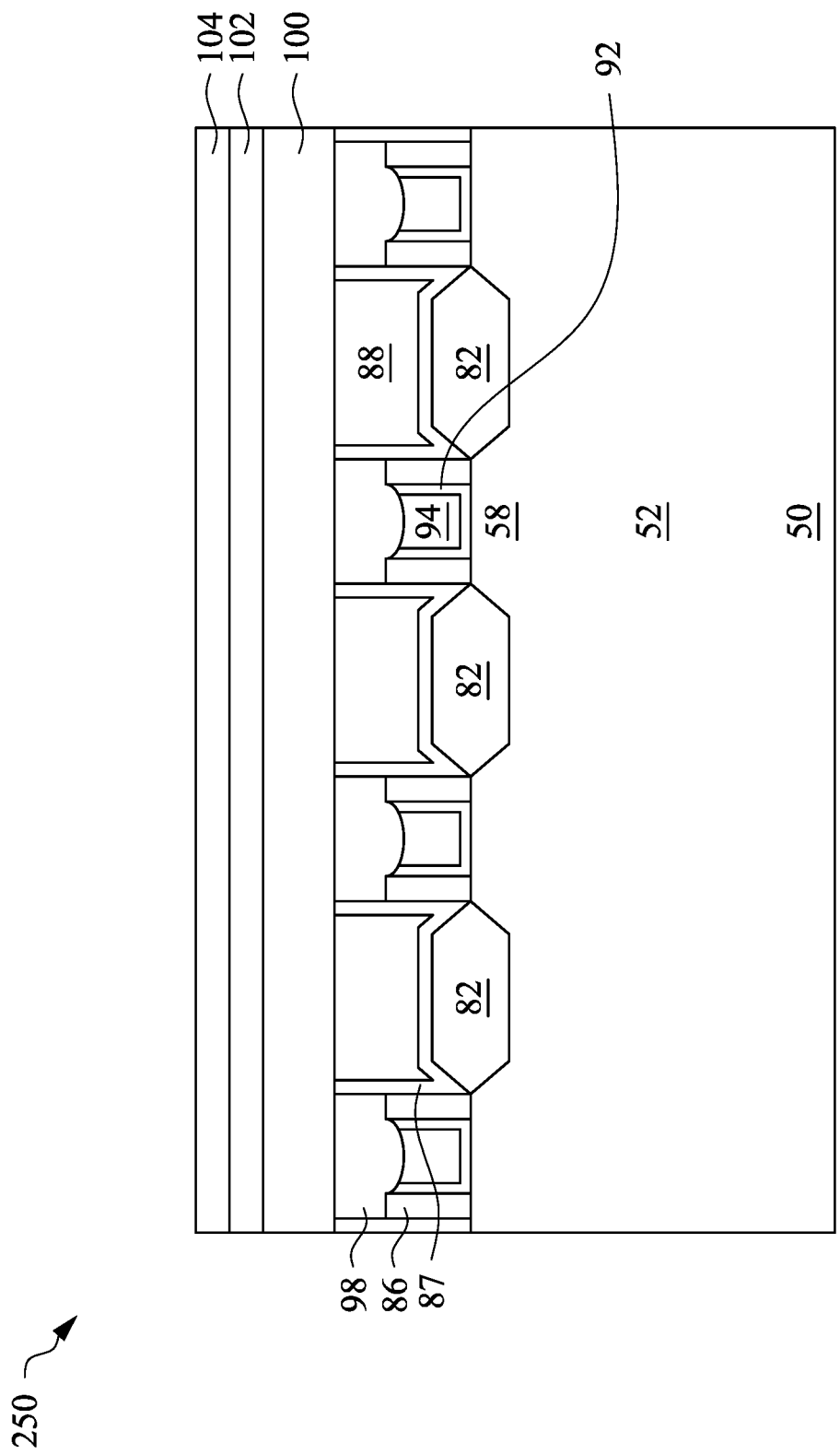

In FIG. 18, gate masks 98 are formed in the recesses 91. The gate masks 98 may be formed by depositing a dielectric material in the recesses 91. In an embodiment, the dielectric material is silicon nitride, or the like, and may be formed using any suitable formation method such as CVD, PECVD, or the like. A planarization process, such as CMP, may be performed next to remove excess portions of the dielectric material from top surfaces of the first ILD 88. The remaining portions of the dielectric material in the recesses 91 form the gate masks 98. After the planarization process, top surfaces of the first ILD 88 and the gate masks 98 may be coplanar (within process variations).

Referring further to FIG. 18, after the planarization process, a dielectric layer 100 is deposited over the gate masks 98, the first ILD 88, the CESL 87 and the substrate 50. The dielectric layer 100 may be formed of any suitable dielectric material, which may be deposited by any suitable method, such as CVD, PECVD, or ALD and may comprise silicon oxide, silicon oxynitride, or the like. In an embodiment, a material of the dielectric layer 100 and a material of the first ILD 88 may be the same. After the deposition of the dielectric layer 100, an etch stop layer 102 may be deposited over the dielectric layer 100. In some embodiments, the etch stop layer 102 may be formed of a material comprising tungsten carbon (WCx), tungsten nitride (WNx), tungsten nitride carbide (WNxCy), or the like, and may be deposited by ALD, PVD, CVD, or the like. A dielectric layer 104 is then deposited over the etch stop layer 102. The dielectric layer 104 may be deposited by any suitable method, such as CVD, PECVD, or ALD and may comprise silicon oxide, silicon oxynitride, or the like. In an embodiment, the dielectric layer 104 and the dielectric layer 100 may be formed of the same material and using similar processes. The material of the etch stop layer 102 has a high etching selectivity from the etching of the dielectric layer 100 and the dielectric layer 104.

Figure 19:
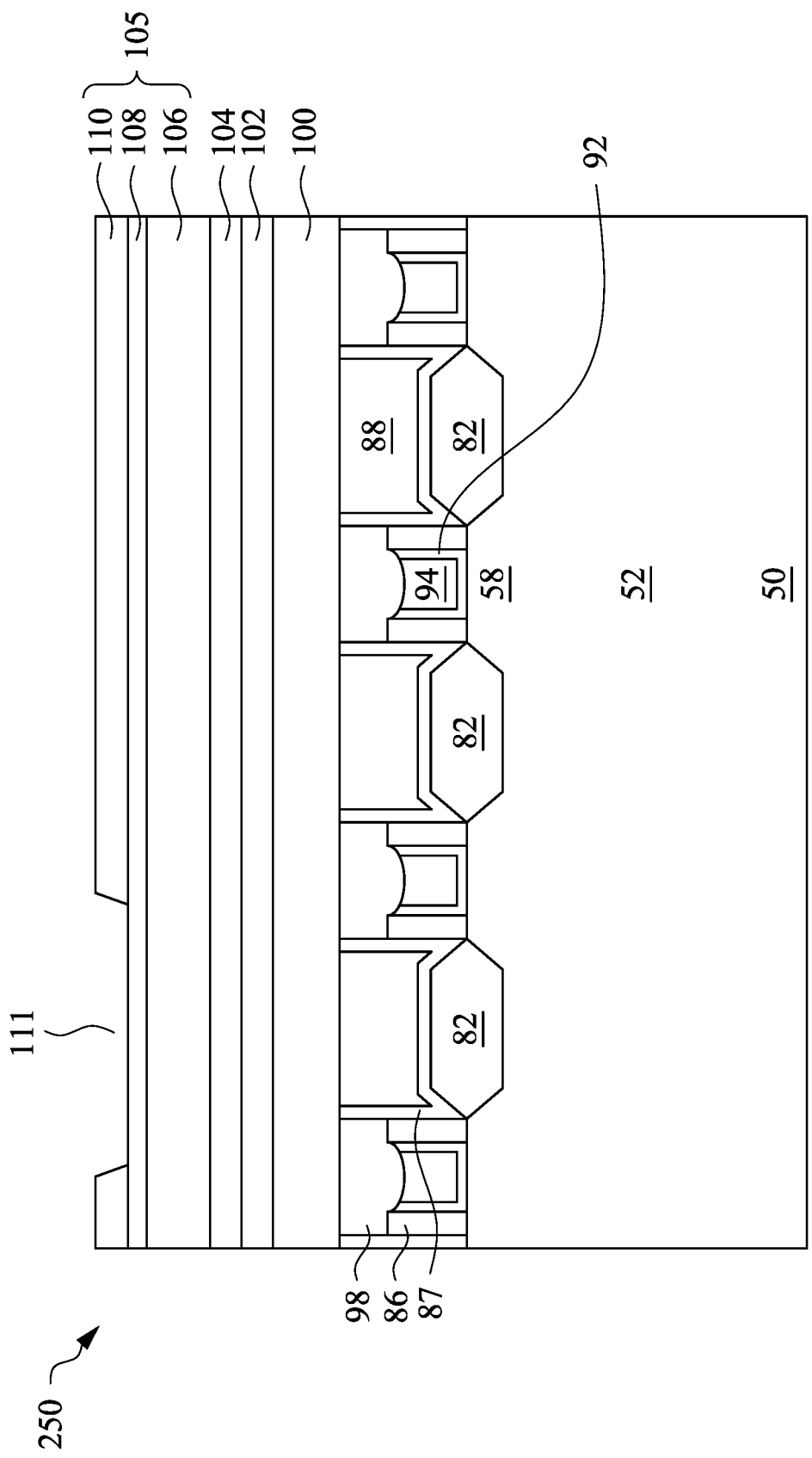

In FIG. 19, a photosensitive mask 105 is formed over the dielectric layer 104. The photosensitive mask 105 may be any acceptable photoresist, such as a single-layer photoresist, a bi-layer photoresist, a tri-layer photoresist, or the like. In the illustrated embodiment, the photosensitive mask 105 is a tri-layer photoresist including a dielectric layer 106, a hard mask layer 108, and a patterned photoresist 110. The dielectric layer 106 may be a bottom anti-reflective coating (BARC) layer that comprises SiN, SiON, $SiO_x$, $SiO_xC_y$, polymer based dielectrics, combinations of these, or the like. The dielectric layer 106 may be formed using a CVD, PVD, PECVD, ALD, spin-coating process, or the like. The hard mask layer 108 may be formed over the dielectric layer 106 to act as a hard mask. In some embodiments the hard mask layer 108 may be formed of a material that comprises a metal (e.g., titanium nitride, titanium, tantalum nitride, titanium oxide, tantalum, a metal-doped carbide (e.g., tungsten dicarbide ($WC_2$), or the like) and/or a metalloid (e.g., silicon nitride, boron nitride, silicon carbide, or the like), and may be formed by ALD, PVD, CVD, or the like. The patterned photoresist 110 is formed over the hard mask layer 108 using a process that includes depositing a photoresist, exposing the photoresist to light, and developing the photoresist to form an opening 111 in the photoresist.

Figure 20:
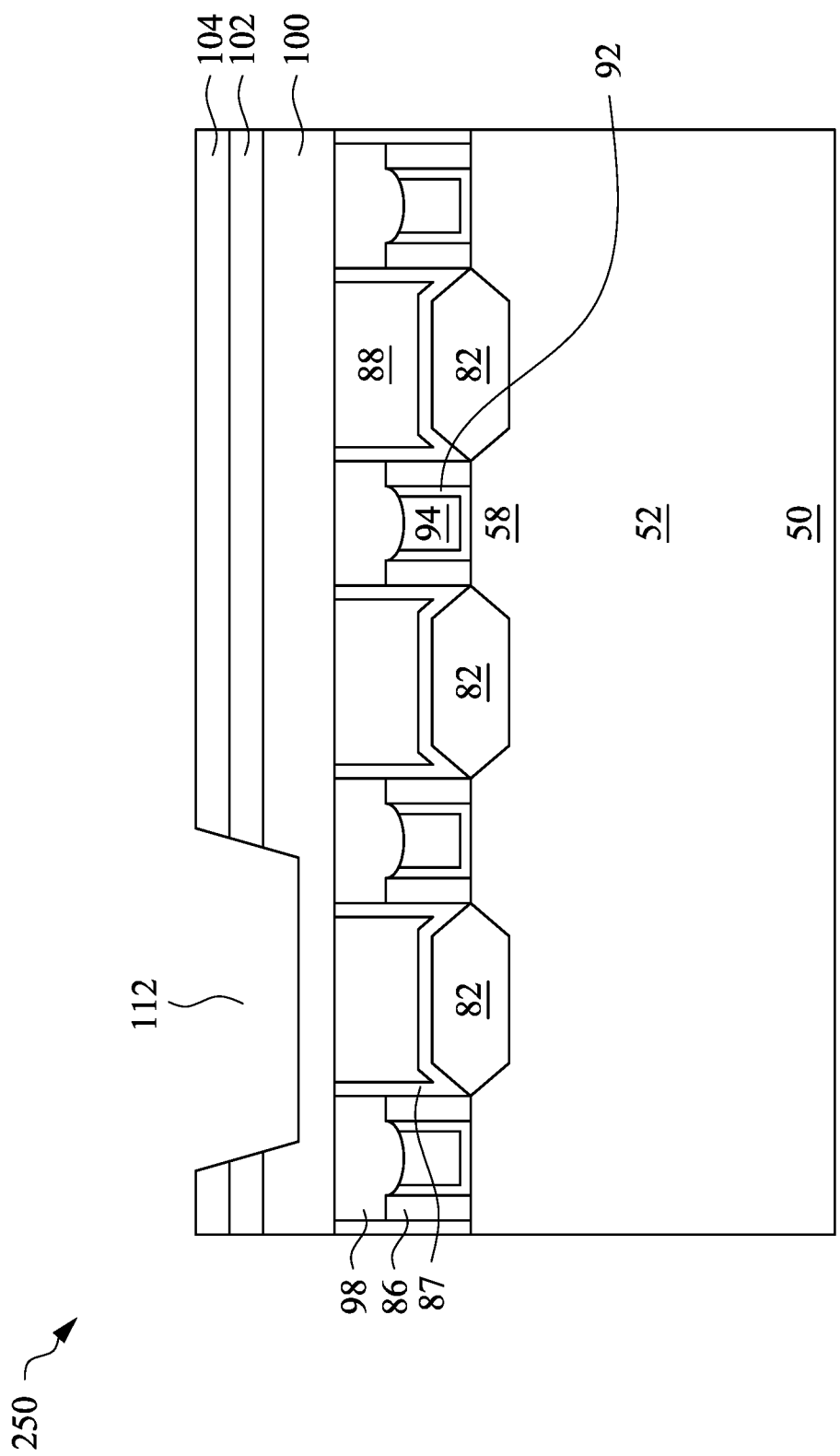

In FIG. 20, the dielectric layer 104 is etched using the photosensitive mask 105 as an etching mask. The etch stop layer 102 is used to stop the etching of the dielectric layer 104. In the illustrated embodiment where the photosensitive mask 105 is a tri-layer photoresist, the hard mask layer 108 is etched using the patterned photoresist 110 as an etching mask. The opening 111 is thus extended into the hard mask layer 108 and exposes a top surface of the dielectric layer 106. The photoresist 110 is then removed, such as by an acceptable ashing process. The hard mask layer 108 is then used as an etching mask to pattern the dielectric layer 106 and the dielectric layer 104, thus extending the opening 111 to form a trench 112. The trench 112 is then extended through the etch stop layer 102 and optionally a portion of the dielectric layer 100. In an embodiment, the dielectric layer 104 may be etched using an anisotropic etching process with $NF_3$, HF, or the like; and the etch stop layer 102 may be etched using an anisotropic etching process with $CF_4$ or the like. After the trench 112 is formed, the hard mask layer 108 and the dielectric layer 106 may each be removed to expose the top surface of the dielectric layer 104. In some embodiments, the hard mask layer 108, and the dielectric layer 106 may be removed using one or more etching processes, such as a series of wet etching processes or dry etching processes.

Figure 21A:
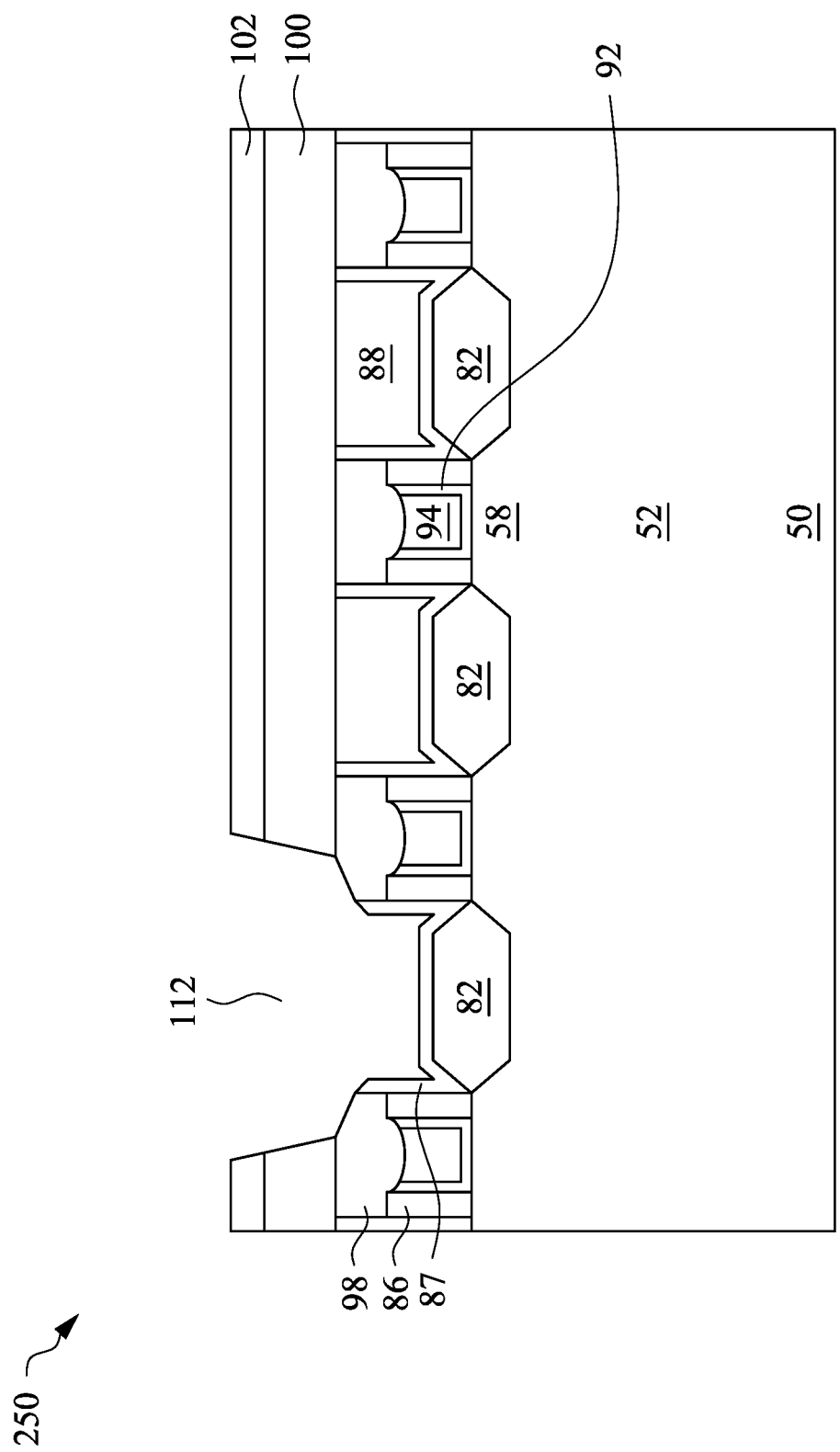
Figure 21B:
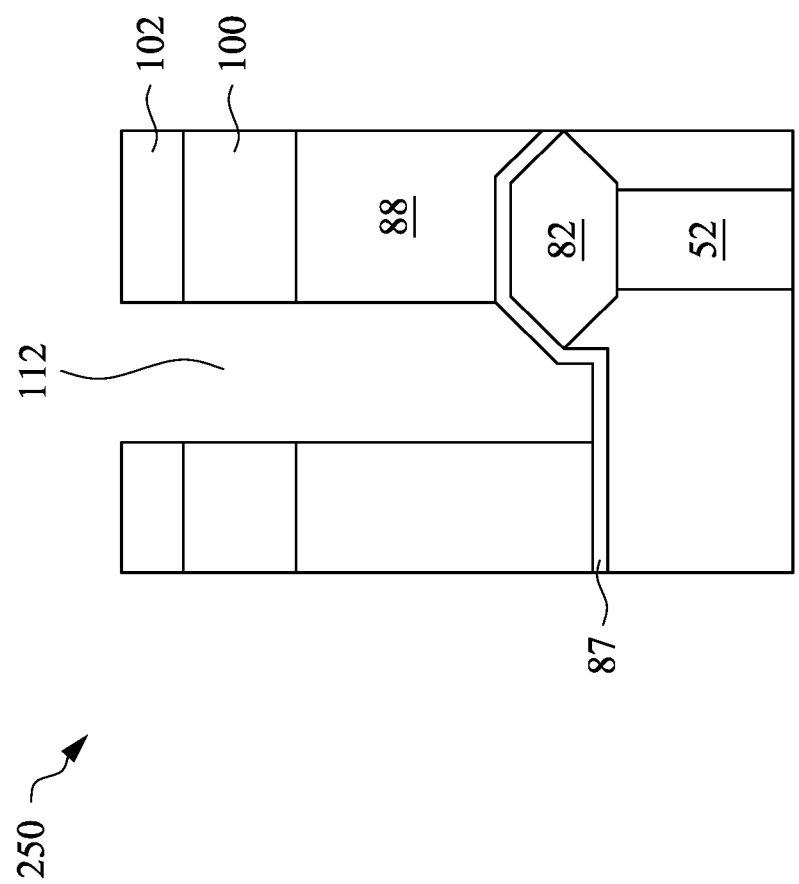

FIGS. 21A and 21B illustrate an etching process that removes the dielectric layer 104 and uses the etch stop layer 102 as a mask to remove portions of the first ILD 88 and the dielectric layer 100, in order to extend the trench 112 through the dielectric layer 100 and the first ILD 88. FIG. 21A is cross-sectional view of a region 95 of the semiconductor device 250 along a cross-section similar to cross-section D-D illustrated in FIG. 15B. FIG. 21B is cross-sectional view of a region 95 of the semiconductor device 250 along a cross-section similar to cross-section E-E illustrated in FIG. 15B. The etching process may use an etchant that is selective to (e.g., having a higher etch rate for) the material(s) of the first ILD 88 and the dielectric layer 100. In an example embodiment, the first ILD 88 and the dielectric layer 100 are formed of silicon oxide, the gate spacers 86 and the CESL 87 are formed of silicon nitride, and the etching process uses an etching gas comprising a fluorocarbon (e.g., $C_xF_y$, where x is between 2 and 5, and y is between 5 and 8, such as $C_2F_6$ or $C_4F_8$). As illustrated in FIGS. 21A and 21B, after the etching process, the trench 112 extends between opposing sidewalls of a portion of the CESL 87 and partially over the epitaxial source/drain regions 82. In an embodiment, during the etching process to extend the trench 112, some etching of the CESL 87 and the gate masks 98 may also occur.

Figure 22A:
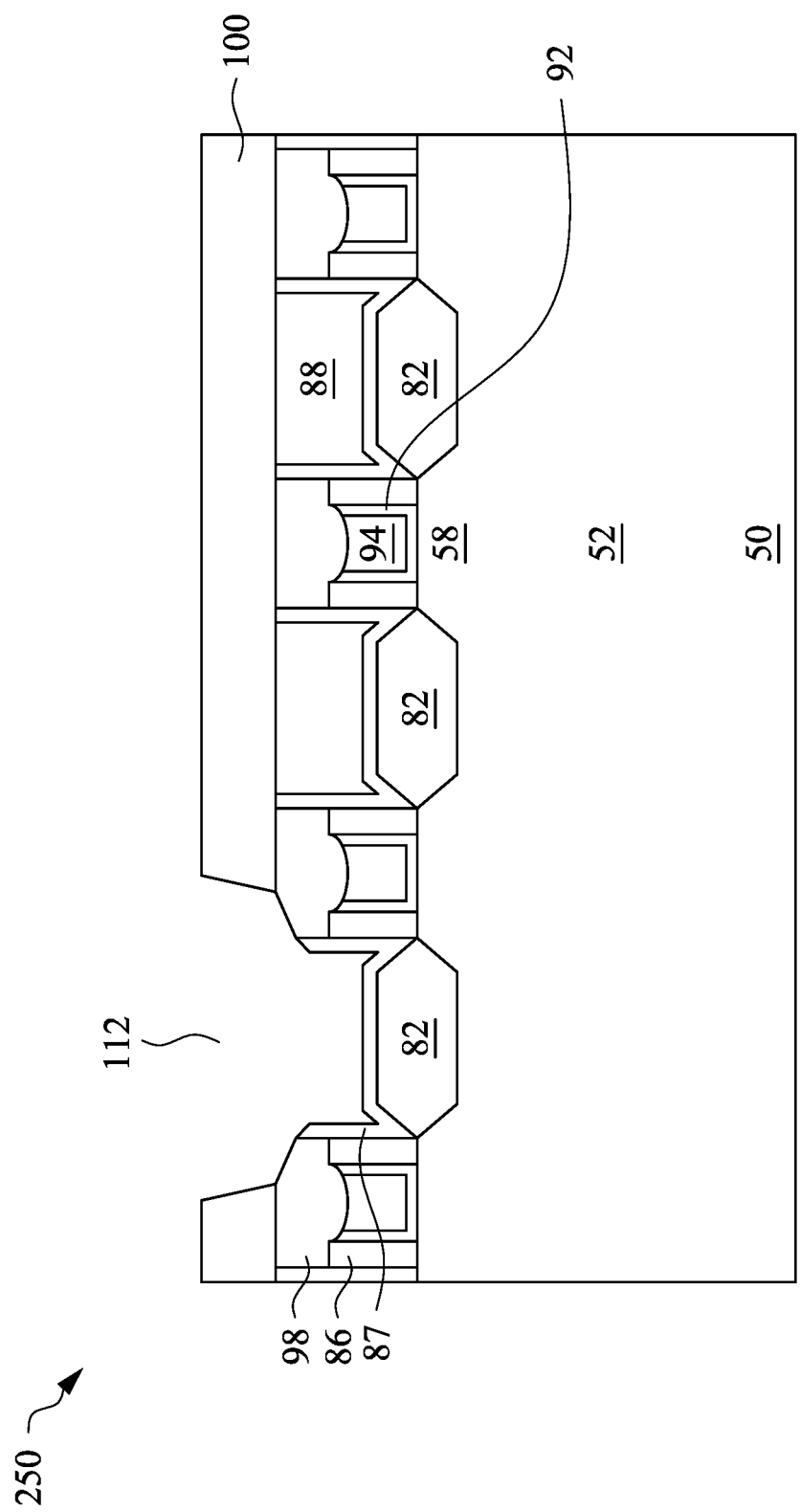
Figure 22B:
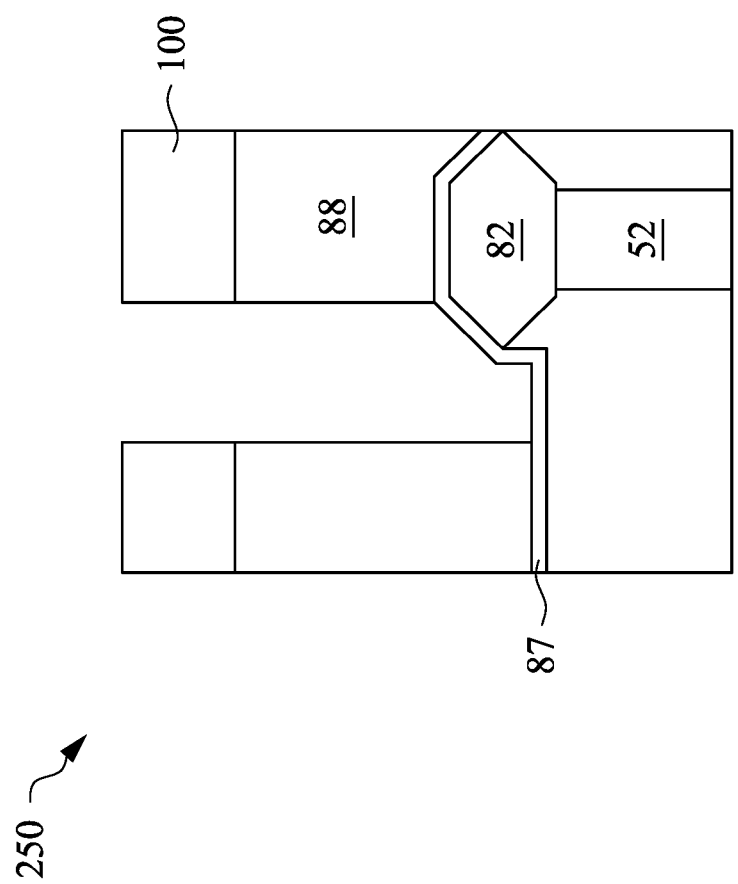

In FIGS. 22A and 22B, one or more cleaning processes (e.g., gamma ash, wet clean, or the like) may be performed to remove the remaining portions of the etch stop layer 102. Additionally, residues in the trench 112, such as residues of the photosensitive mask 105, may also be removed.

Figure 23A:
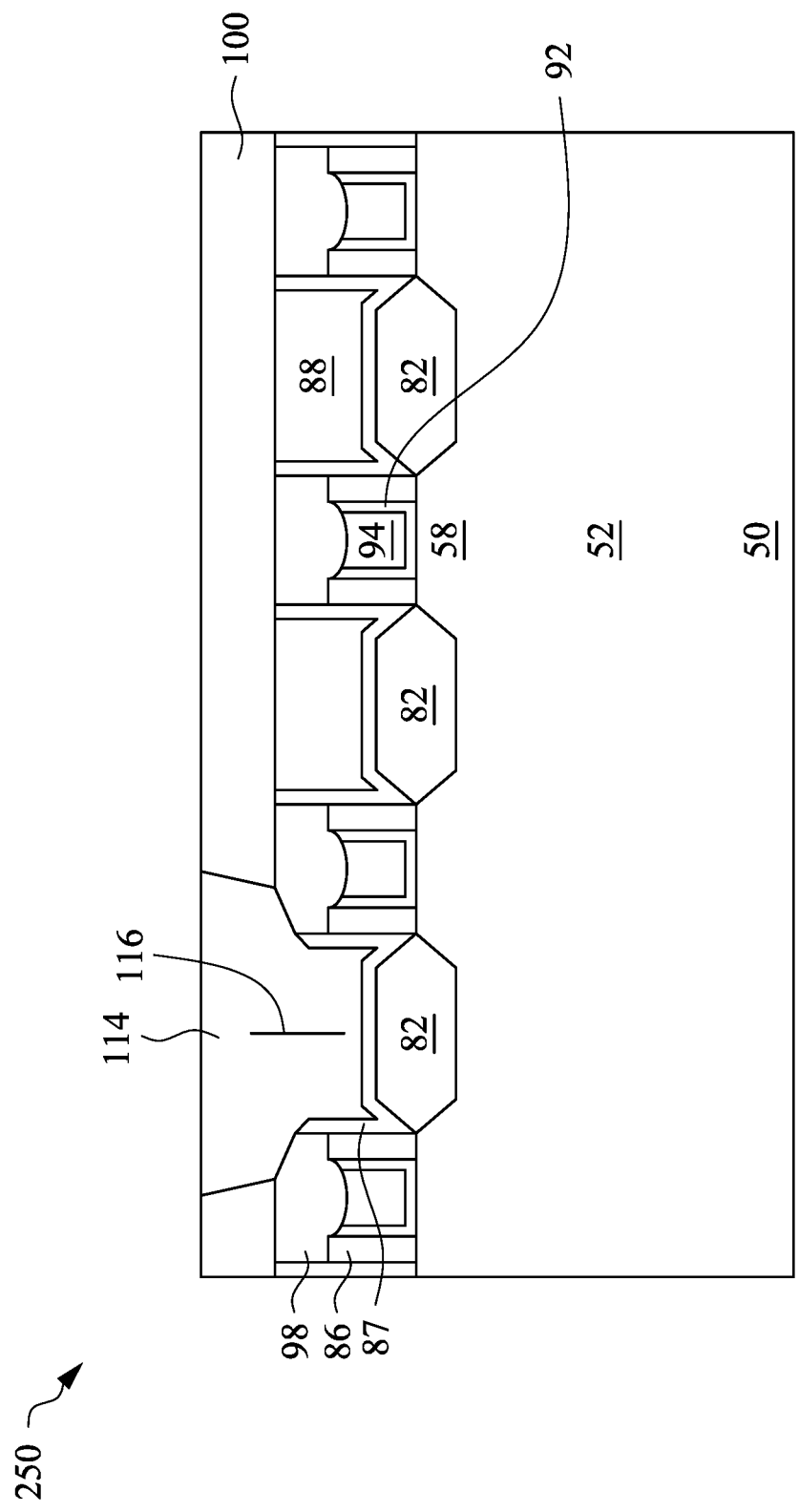
Figure 23B:
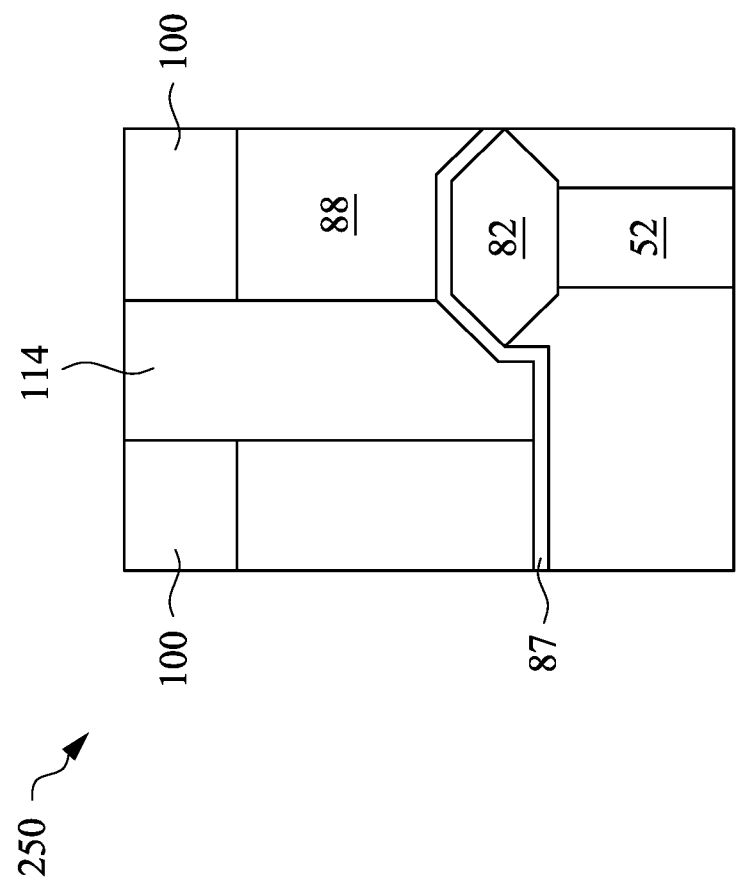

In FIGS. 23A and 23B, a contact mask 114 is formed in the trench 112. The contact mask 114 defines a first area where contacts to the epitaxial source/drain regions 82 will not be formed. The contact mask 114 may be formed by depositing a dielectric material in the trench 112. In an embodiment, the dielectric material is silicon nitride, or the like, and may be formed using any suitable formation method such as CVD, PECVD, or the like. The dielectric material may be deposited on sidewalls and a bottom surface of the trench 112 until it merges together (e.g., physically contacts each other), thereby filling a remaining space in the trench 112 and forming a seam 116. A planarization process, such as CMP, may be performed next to remove excess portions of the dielectric material from a top surface of the dielectric layer 100. After the planarization process, top surfaces of the dielectric layer 100 and the contact mask 114 may be coplanar (within process variations).

Figure 24A:
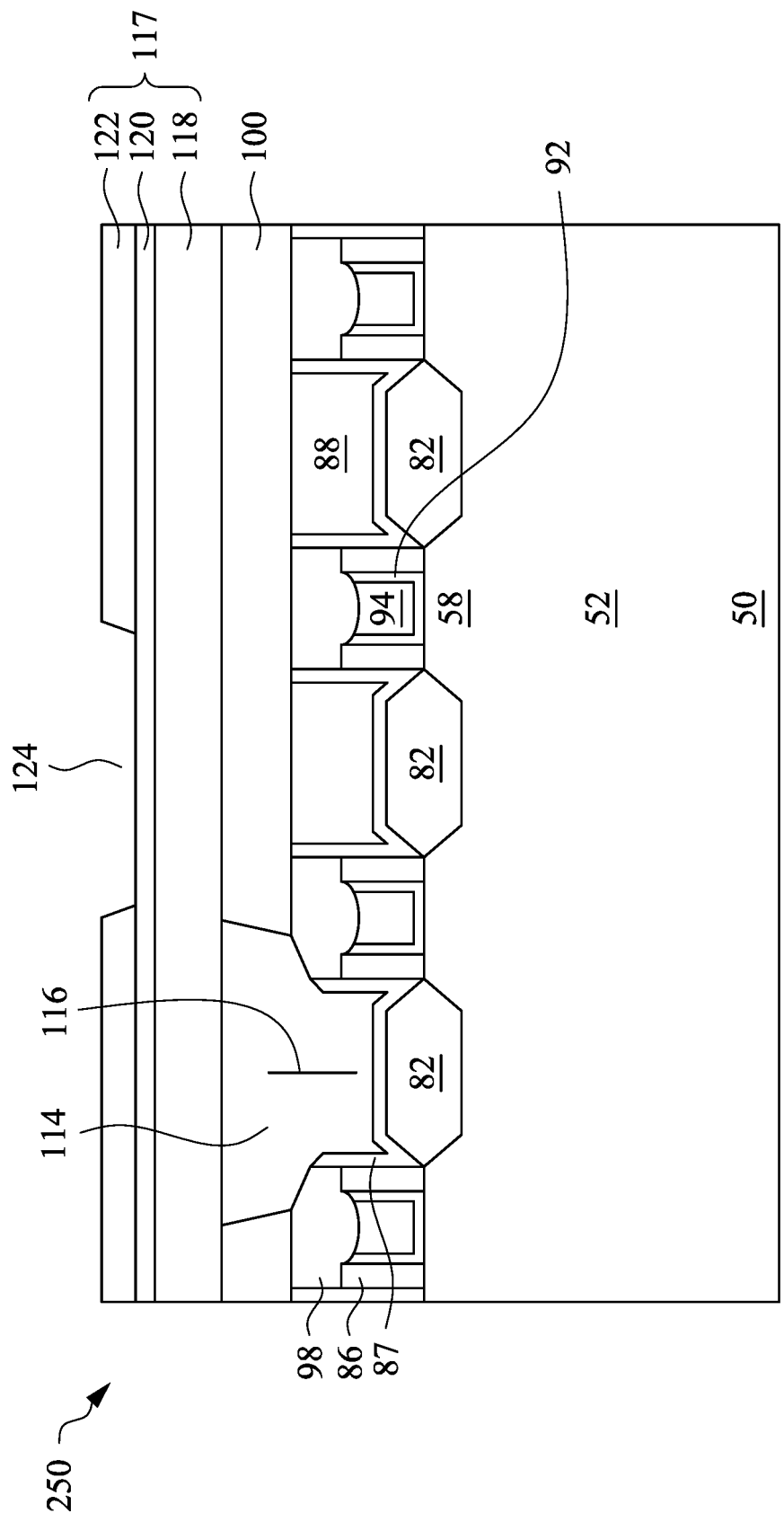
Figure 24B:
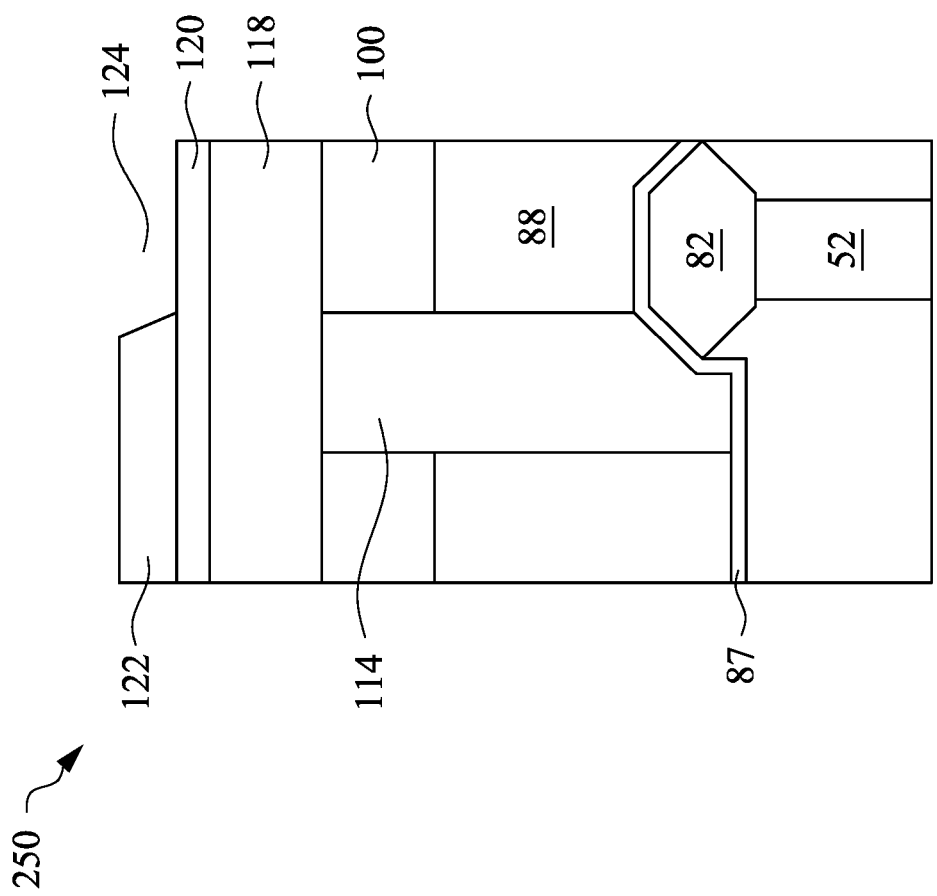

In FIGS. 24A and 24B, a photosensitive mask 117 is formed over the dielectric layer 100 and the contact mask 114. The photosensitive mask 117 may be any acceptable photoresist, such as a single-layer photoresist, a bi-layer photoresist, a tri-layer photoresist, or the like. In the illustrated embodiment, the photosensitive mask 117 is a tri-layer photoresist including a dielectric layer 118, a hard mask layer 120, and a patterned photoresist 122. The dielectric layer 118 may be a bottom anti-reflective coating (BARC) layer that comprises SiN, SiON, $SiO_x$, $SiO_xC_y$, polymer based dielectrics, combinations of these, or the like. The dielectric layer 118 may be formed using a CVD, PVD, PECVD, ALD, spin-coating process, or the like. The hard mask layer 120 may be formed over the dielectric layer 118 to act as a hard mask. In some embodiments the hard mask layer 120 may be formed of a material that comprises a metal (e.g., titanium nitride, titanium, tantalum nitride, titanium oxide, tantalum, a metal-doped carbide (e.g., tungsten dicarbide ($WC_2$), or the like) and/or a metalloid (e.g., silicon nitride, boron nitride, silicon carbide, or the like), and may be formed by ALD, PVD, CVD, or the like. The patterned photoresist 122 is formed over the hard mask layer 120 using a process that includes depositing a photoresist, exposing the photoresist to light, and developing the photoresist to form an opening 124 in the photoresist.

Figure 25A:
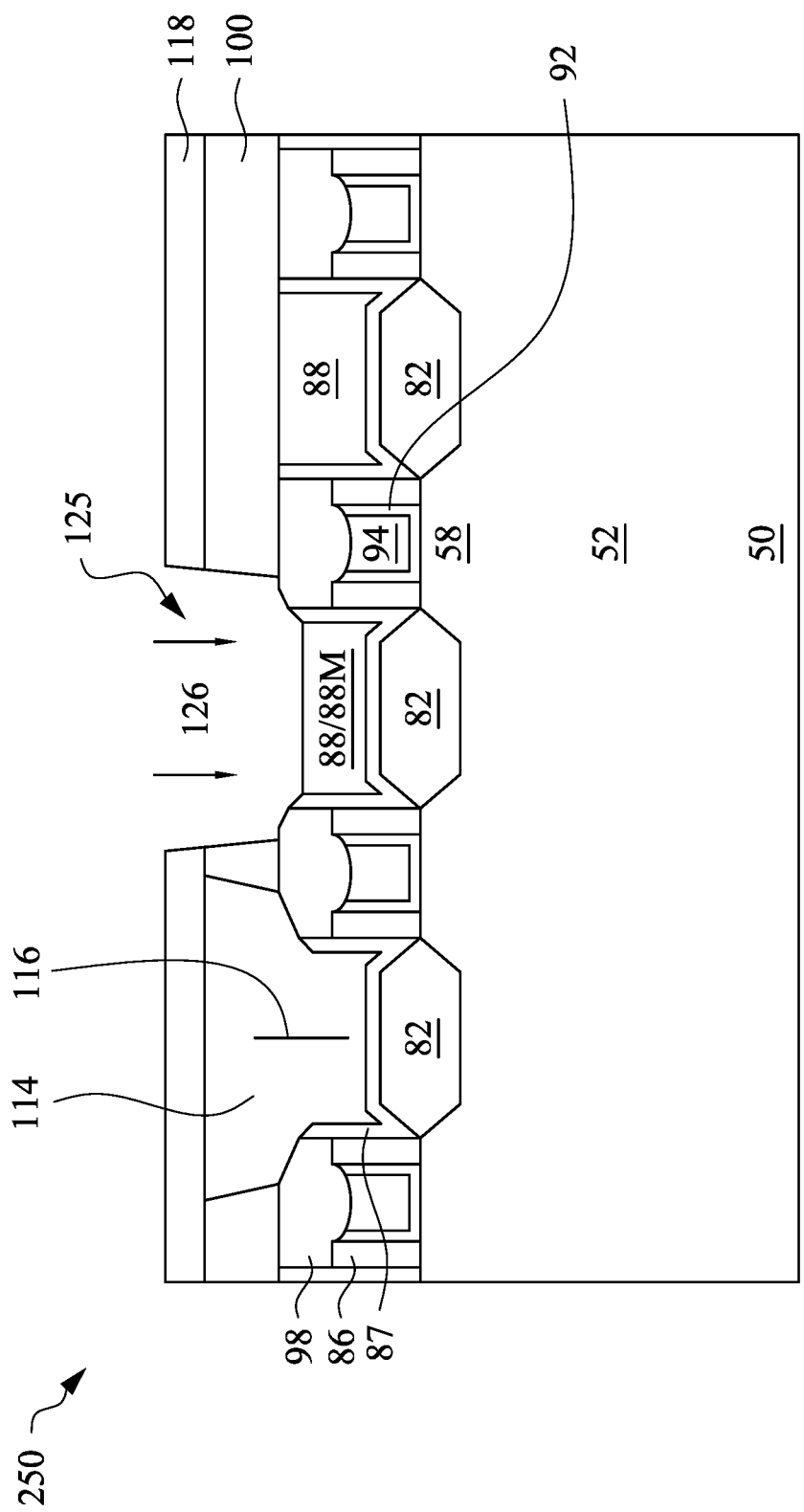
Figure 25B:
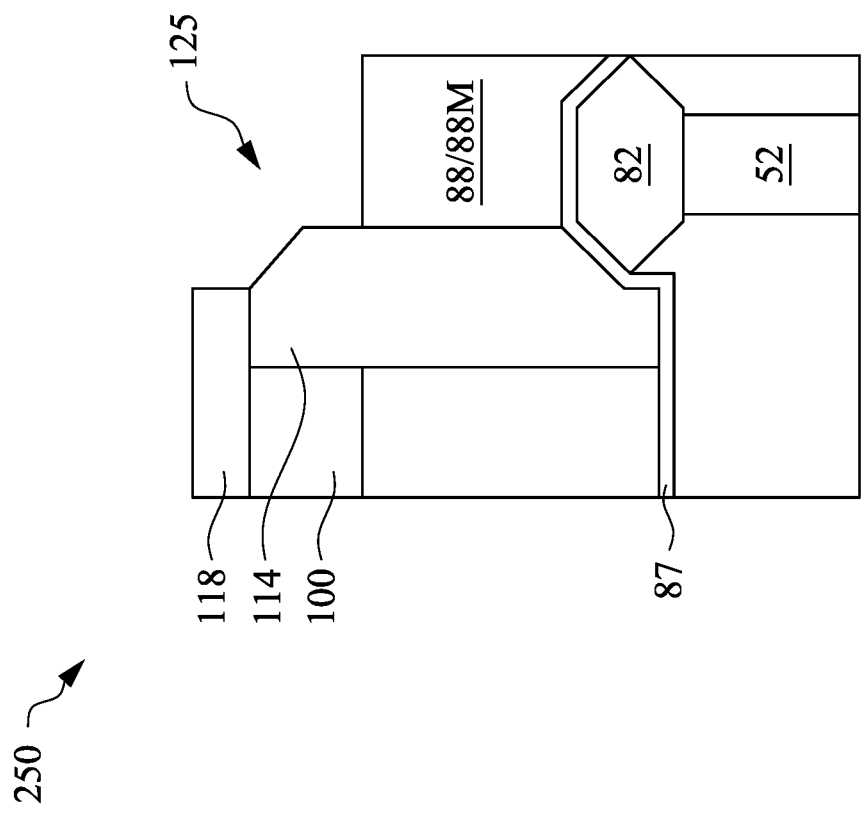

In FIGS. 25A and 25B, the dielectric layer 100 is etched using the photosensitive mask 117 as an etching mask. The first ILD 88 is used to stop the etching of the dielectric layer 100. In the illustrated embodiment where the photosensitive mask 117 is a tri-layer photoresist, the hard mask layer 120 is etched using the patterned photoresist 122 as an etching mask. The opening 124 is thus extended into the hard mask layer 120 and exposes a top surface of the dielectric layer 118. The photoresist 122 is then removed, such as by an acceptable ashing process. An etching process is then performed using the hard mask layer 120 as a mask to pattern the dielectric layer 118 and the dielectric layer 100, thus extending the opening 124 to form a trench 125. In an embodiment, the dielectric layer 100 may be etched using a dry fluorocarbon etching process that comprises $C_2F_4$, $C_2F_6$, $C_4F_8$, or the like, as etching gases. In an embodiment, the dry fluorocarbon etching process may be argon plasma aided. During the etching process, a layer of an etching byproduct (not separately illustrated) may be formed on bottom portions of the trench 125. The etching byproduct may be a polymer such as $C_xH_y$ (with X and Y being integers) or the like. The etching byproduct inhibits (e.g., slows or prevents) further etching of the first ILD 88 during the etching process, such that the layer of the etching byproduct acts as an etch stop layer for the etching process. After the etching process, one or more cleaning processes (e.g., gamma ash, photoresist ash, or the like) may be performed to remove the etching byproduct formed on bottom portions of the trench 125. Other residues, such as residues of the patterned photoresist 122 in the trench 125, may also be removed. After the removal of the etching byproduct from the bottom portions of the trench 125, a top surface of the first ILD 88, portions of the CESL 87 and portions of the gate masks 98 are exposed at the bottom of the trench 125. The hard mask layer 120 may also be removed to expose the top surface of the dielectric layer 118. In some embodiments, the hard mask layer 120 may be removed using an etching process, such as a wet etching process or a dry etching process.

Referring further to FIGS. 25A and 25B, an implantation process 126 is performed to introduce impurities into the first ILD 88 at the bottom of the trench 125, thereby modifying some portions of the first ILD 88M. The portions of the first ILD 88 exposed by the trench 125 in the dielectric layer 100 are modified by the implanting, and the portions of the first ILD 88 covered by the dielectric layer 100 are not modified by the implanting. In an embodiment, the implantation species may include ions formed from silicon, or the like. In an embodiment, after the implantation process 126, an impurity concentration of the first ILD 88M at the bottom of the trench 125 may be in a range from $5 \times 10^{20}$ atoms/cm$^{-3}$ to $3 \times 10^{21}$ atoms/cm$^{-3}$.

Figure 26A:
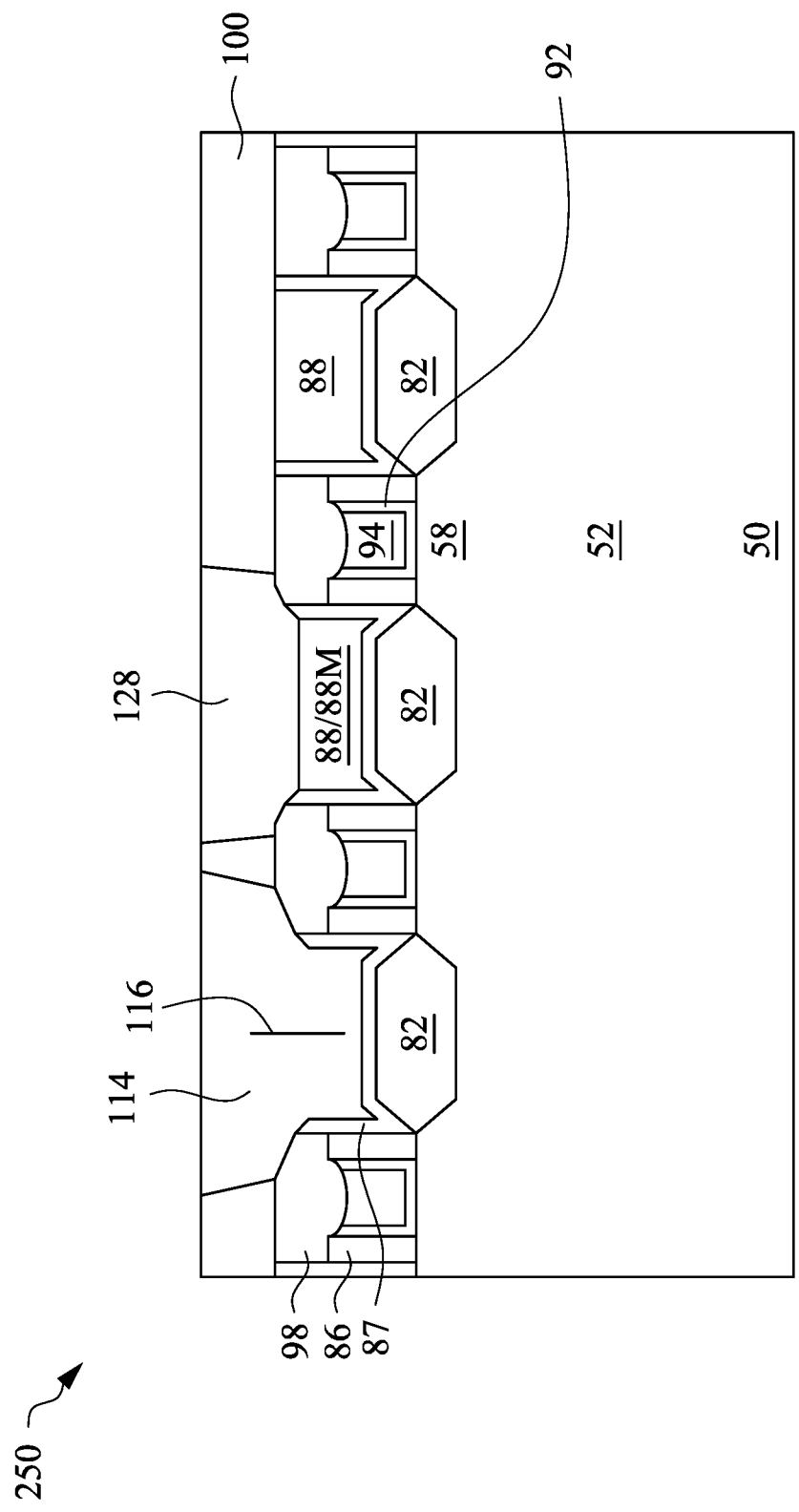
Figure 26B:
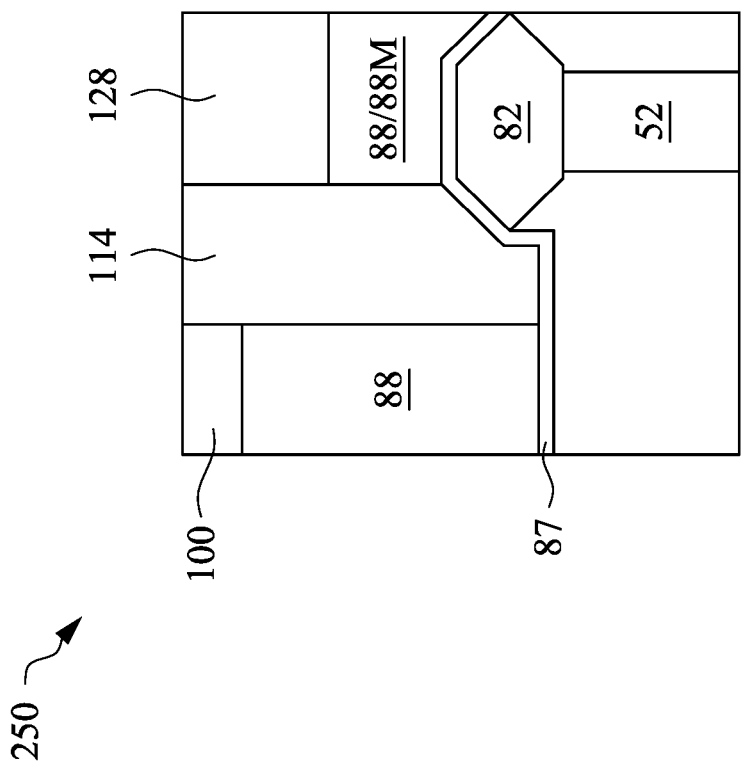

In FIGS. 26A and 26B, a further etching process may be performed to remove further portions of the first ILD 88M and extend the trench 125. The etching process may use an etchant that is selective to (e.g., having a higher etch rate for) the impurity which was implanted in the first ILD 88M, such that the etchant selectively etches materials having a higher silicon concentration (e.g., the first ILD 88M) at a faster rate than materials having lower silicon concentrations (e.g., the CESL 87, the gate masks 98 and the dielectric layer 100). In an embodiment, the etching process uses an etchant selective to silicon and silicon doped materials. In an embodiment, different portions of the trench 125 may be extended to different depths. For example, the trench 125 may overlap both the first fin 52 and the second fin 52 (e.g., extends over the first fin 52 and the second fin 52 as shown previously in FIG. 15B) in an orientation that is perpendicular to the orientation of the first fin 52 and the second fin 52. In an embodiment, a first portion of the trench 125 over the first fin 52 may extend to a first depth such that a top surface of the first ILD 88M is exposed at the bottom of the trench 125. In an embodiment, a second portion of the trench 125 over the second fin 52 may extend to a second depth larger than the first depth such that top surfaces of the epitaxial source/drain regions 82 are exposed at the bottom of the trench 125. In an embodiment, the etching process comprises a dry fluorocarbon etching process that comprises $C_2F_4$, $C_2F_6$, $C_4F_8$, or the like, as etching gases. In an embodiment, the dry fluorocarbon etching process may be argon plasma aided. In an embodiment, during the etching process to extend the trench 125, some etching of the CESL 87 and the gate masks 98 may also occur.

Referring further to FIGS. 26A and 26B, the dielectric layer 118 may be removed to expose the top surface of the dielectric layer 100 and the contact mask 114. In some embodiments, the dielectric layer 118 may be removed using an etching process, such as a wet etching process or dry etching process. A contact mask 128 is then formed to fill the trench 125. The contact mask 128 defines a second area where contacts to the epitaxial source/drain regions 82 will not be formed. The contact mask 128 may be formed by depositing a conductive material in the trench 125. The conductive material may be tungsten, or the like, and may be formed by, PVD, CVD, ALD, or the like. After the conductive material is formed, a planarization process, such as CMP, is performed to remove excess portions of the conductive material from a top surface of the dielectric layer 100. After the planarization process, top surfaces of the contact mask 114, the dielectric layer 100, and the contact mask 128 may be coplanar (within process variations).

Figure 27A:
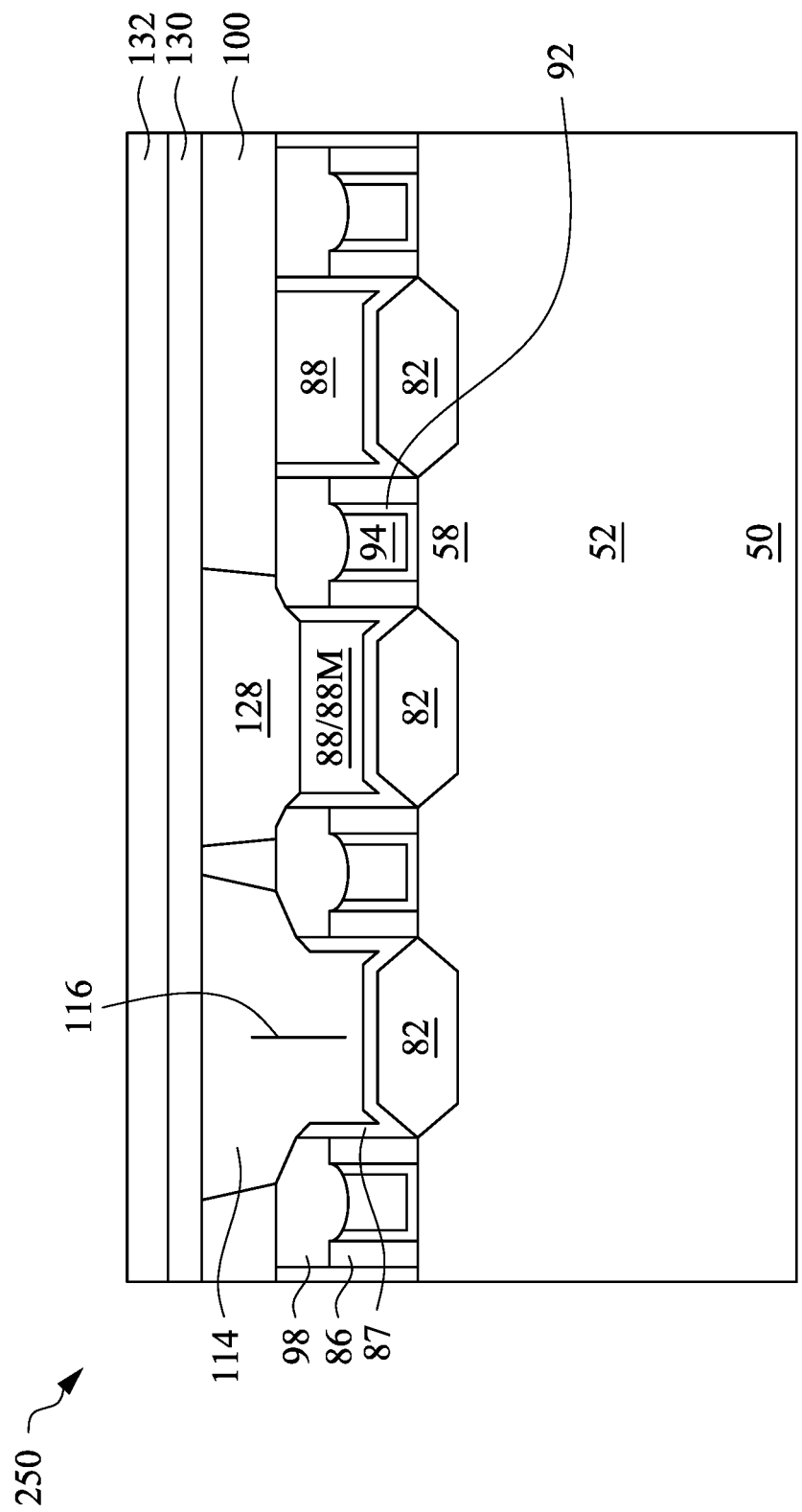
Figure 27B:
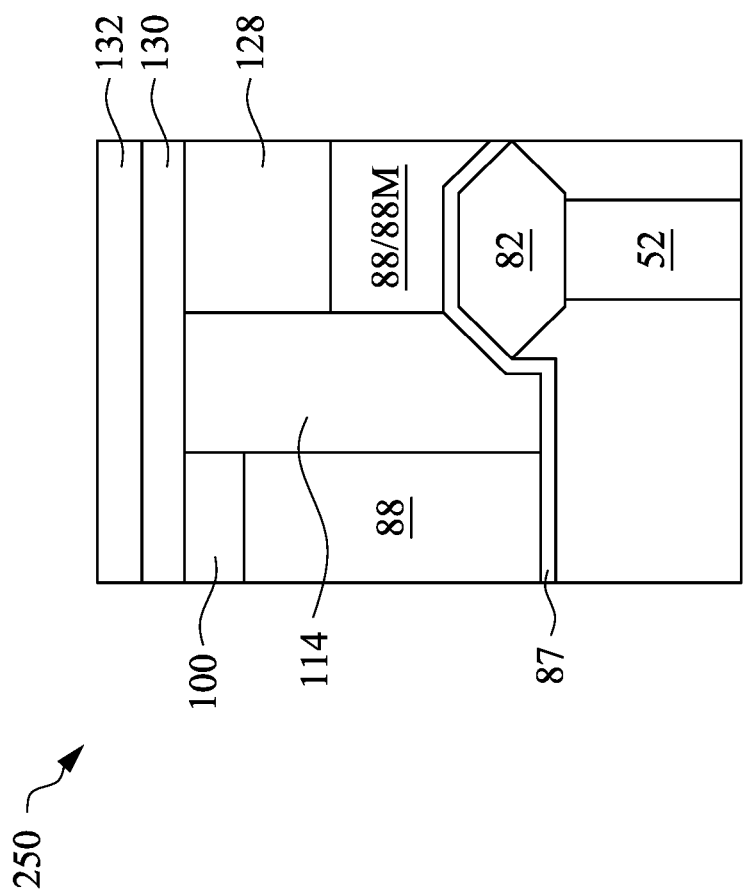

In FIGS. 27A and 27B, an etch stop layer 130 may be deposited over the dielectric layer 100, the contact mask 114 and the contact mask 128. In some embodiments, the etch stop layer 130 may be formed of a material comprising tungsten carbon (WCx), tungsten nitride (WNx), tungsten nitride carbide (WNxCy), or the like, and may be deposited by ALD, PVD, CVD, or the like. A dielectric layer 132 may then be deposited over the etch stop layer 130. The dielectric layer 132 may be deposited by any suitable method, such as CVD, PECVD, or ALD and may comprise silicon oxide, silicon oxynitride, or the like. In an embodiment, the dielectric layer 132 and the dielectric layer 100 may be formed of the same material and using similar processes.

Figure 28A:
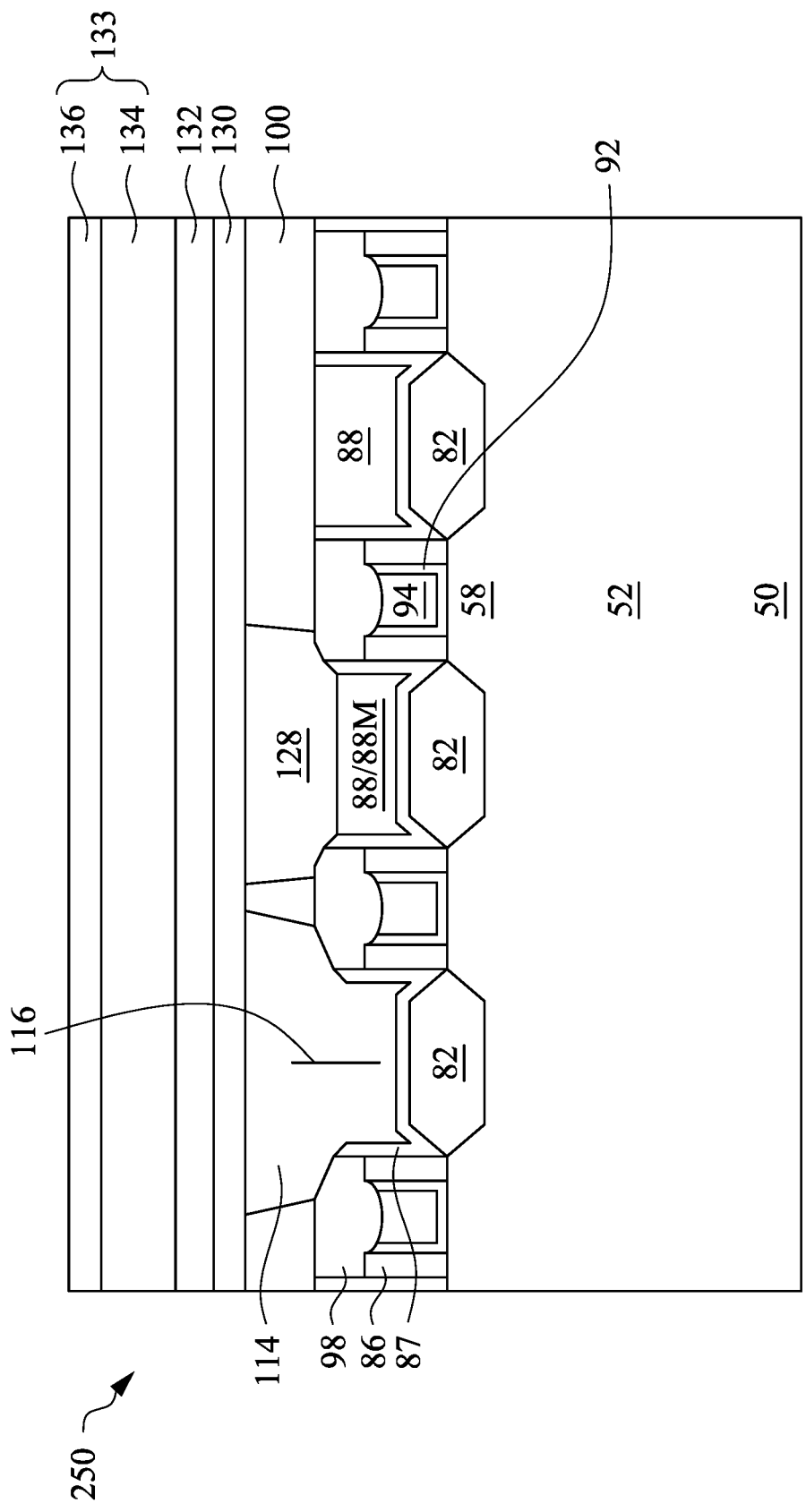
Figure 28B:
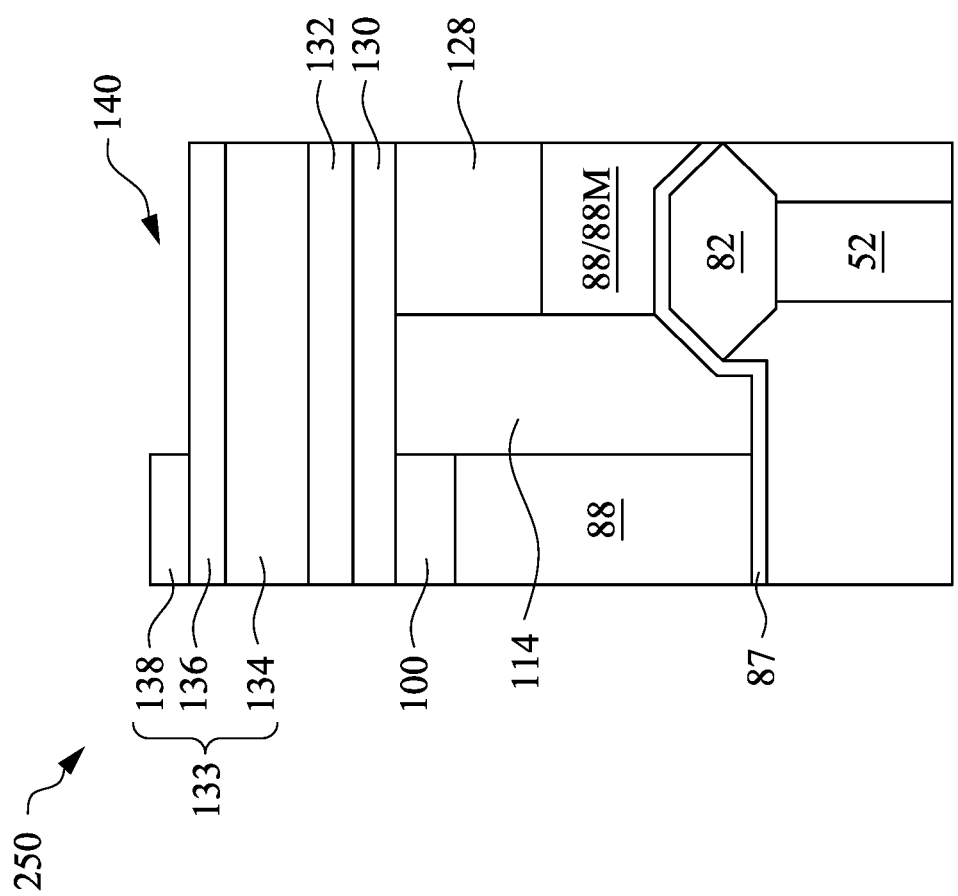

In FIGS. 28A and 28B, a photosensitive mask 133 is formed over the dielectric layer 132. The photosensitive mask 133 may be any acceptable photoresist, such as a single-layer photoresist, a bi-layer photoresist, a tri-layer photoresist, or the like. In the illustrated embodiment, the photosensitive mask 133 is a tri-layer photoresist including a dielectric layer 134, a hard mask layer 136, and a patterned photoresist 138. The dielectric layer 134 may be a bottom anti-reflective coating (BARC) layer that comprises SiN, SiON, $SiO_x$, $SiO_xC_y$, polymer based dielectrics, combinations of these, or the like. The dielectric layer 134 may be formed using a CVD, PVD, PECVD, ALD, spin-coating process, or the like. The hard mask layer 136 may be formed over the dielectric layer 132 to act as a hard mask. In some embodiments the hard mask layer 136 may be formed of a material that comprises a metal (e.g., titanium nitride, titanium, tantalum nitride, titanium oxide, tantalum, a metal-doped carbide (e.g., tungsten dicarbide ($WC_2$), or the like) and/or a metalloid (e.g., silicon nitride, boron nitride, silicon carbide, or the like), and may be formed by ALD, PVD, CVD, or the like. The patterned photoresist 138 is formed over the hard mask layer 136 using a process that includes depositing a photoresist, exposing the photoresist to light, and developing the photoresist to form an opening 140 in the photoresist.

Figure 29A:
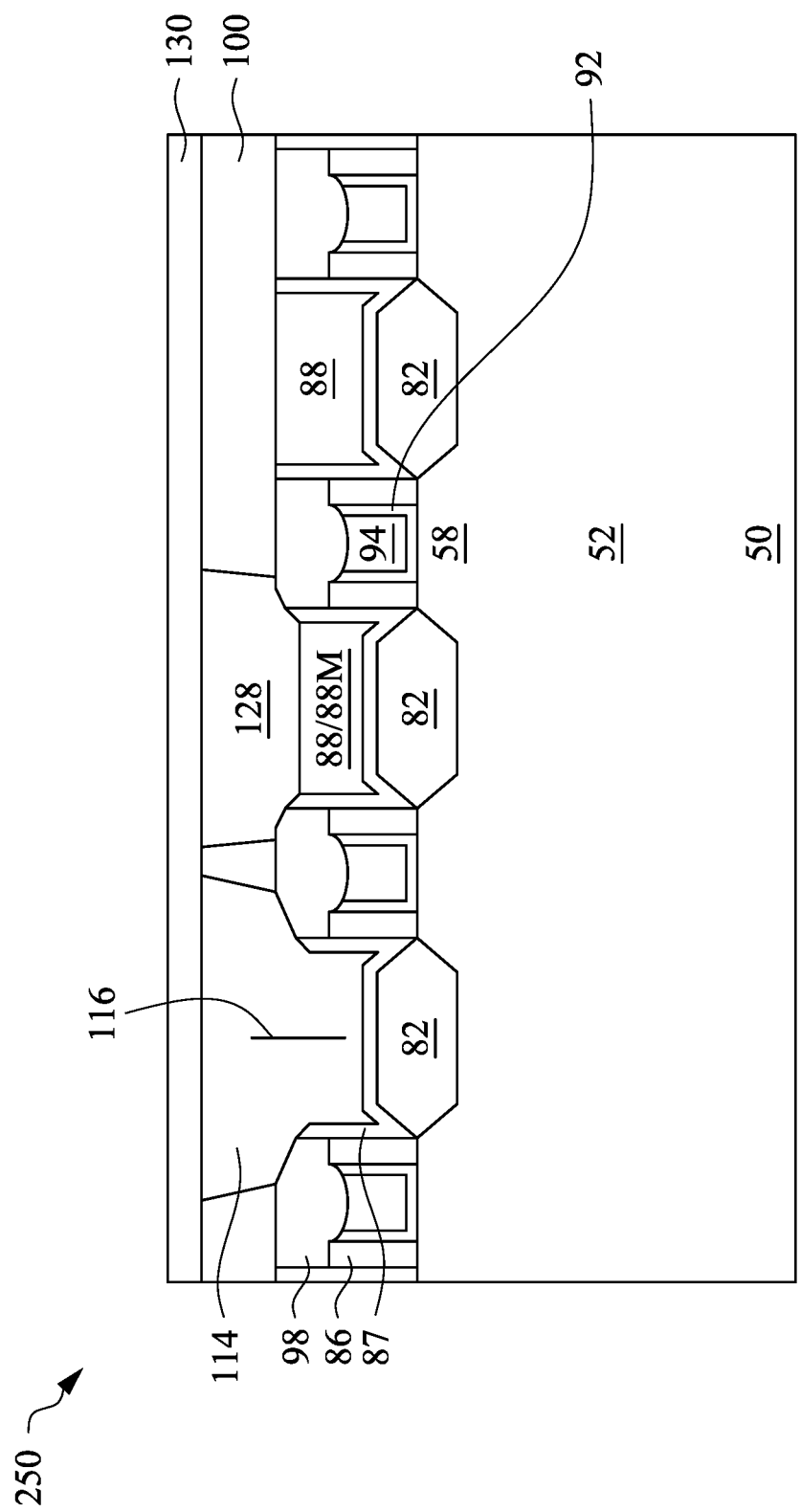
Figure 29B:
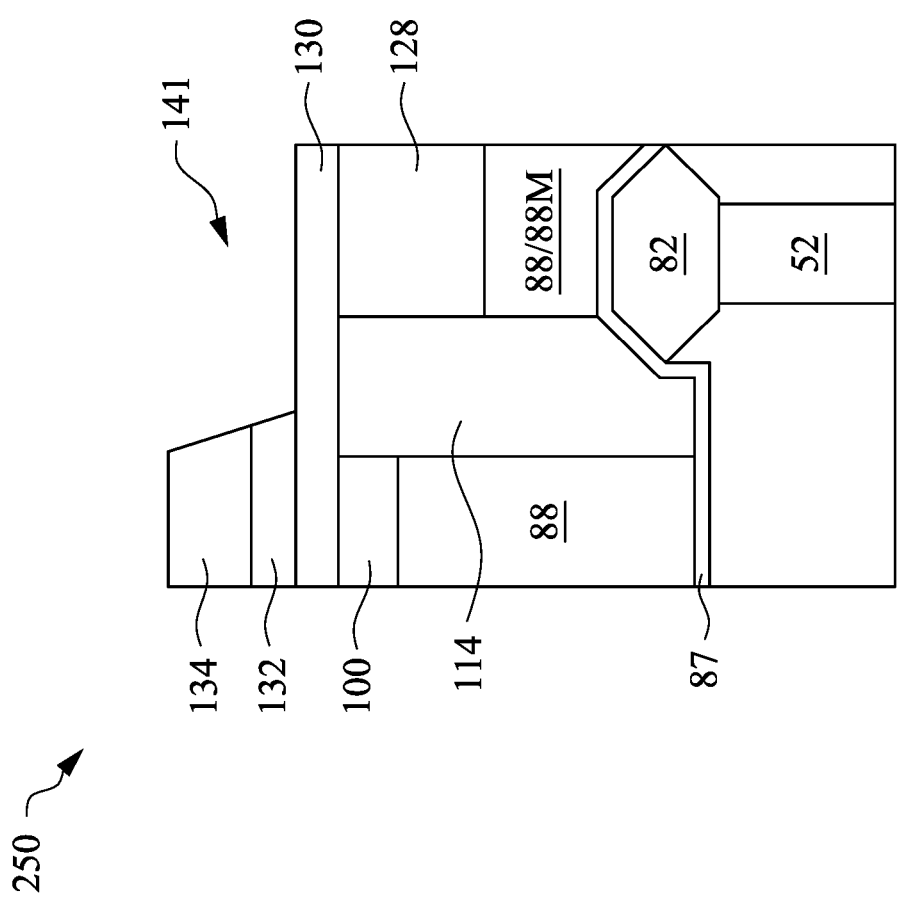

In FIGS. 29A and 29B, the dielectric layer 132 is etched using the photosensitive mask 133 as an etching mask. The etch stop layer 130 is used to stop the etching of the dielectric layer 132. In the illustrated embodiment where the photosensitive mask 133 is a tri-layer photoresist, the hard mask layer 136 is etched using the patterned photoresist 138 as an etching mask. The opening 140 is thus extended into the hard mask layer 108 and exposes a top surface of the dielectric layer 134. The photoresist 138 is then removed, such as by an acceptable ashing process. The hard mask layer 136 is then used as an etching mask to pattern the dielectric layer 134 and the dielectric layer 132, thus extending the opening 140 to form a trench 141. In an embodiment, the dielectric layer 132 may be etched using an anisotropic etching process with $NF_3$, HF, or the like. After the trench 141 is formed, a top surface of the etch stop layer 130 is exposed at the bottom of the trench 141. In some embodiments, the hard mask layer 136 may then be removed using an etching process, such as a wet etching process or a dry etching process.

Figure 30A:
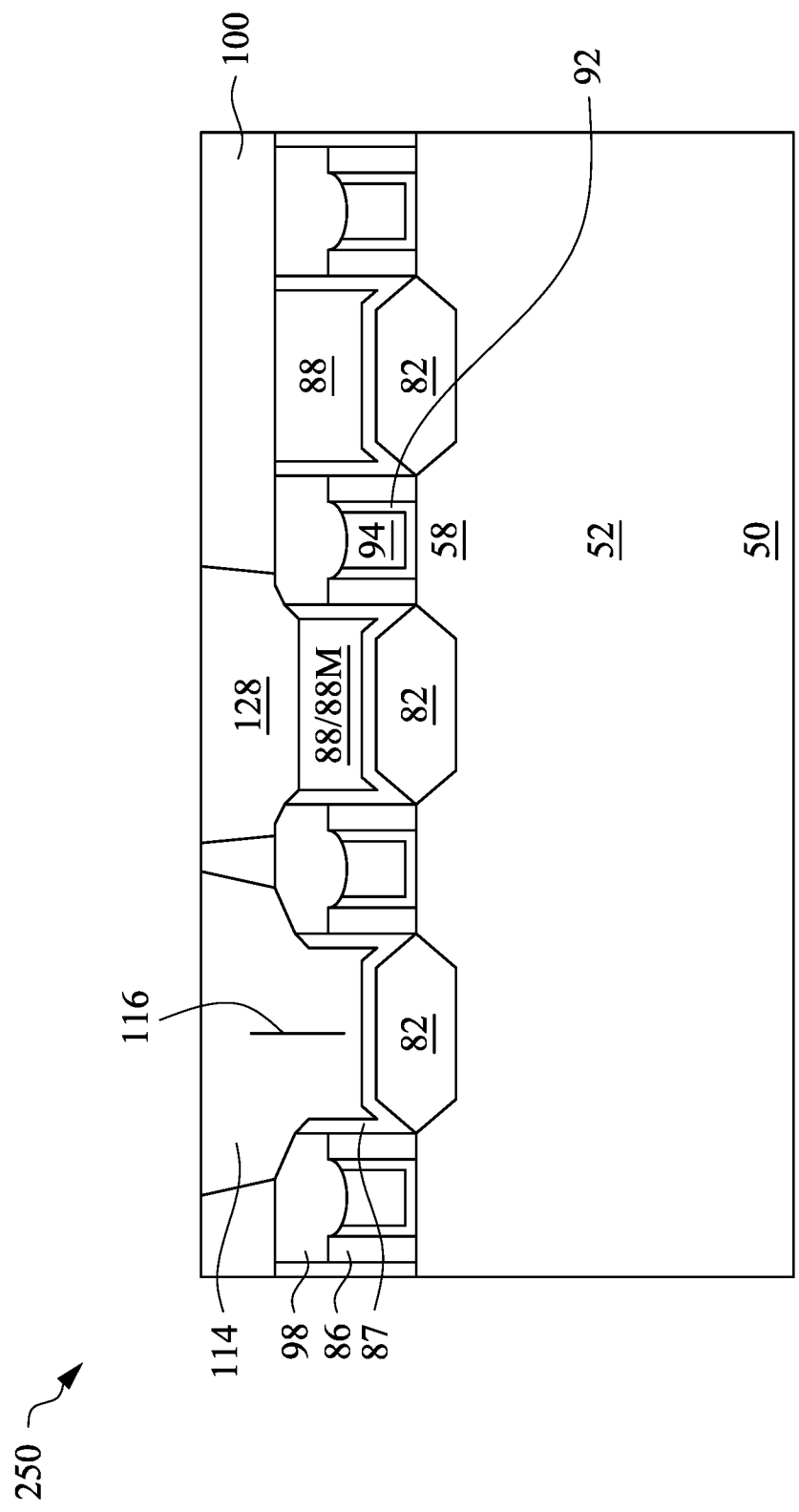
Figure 30B:
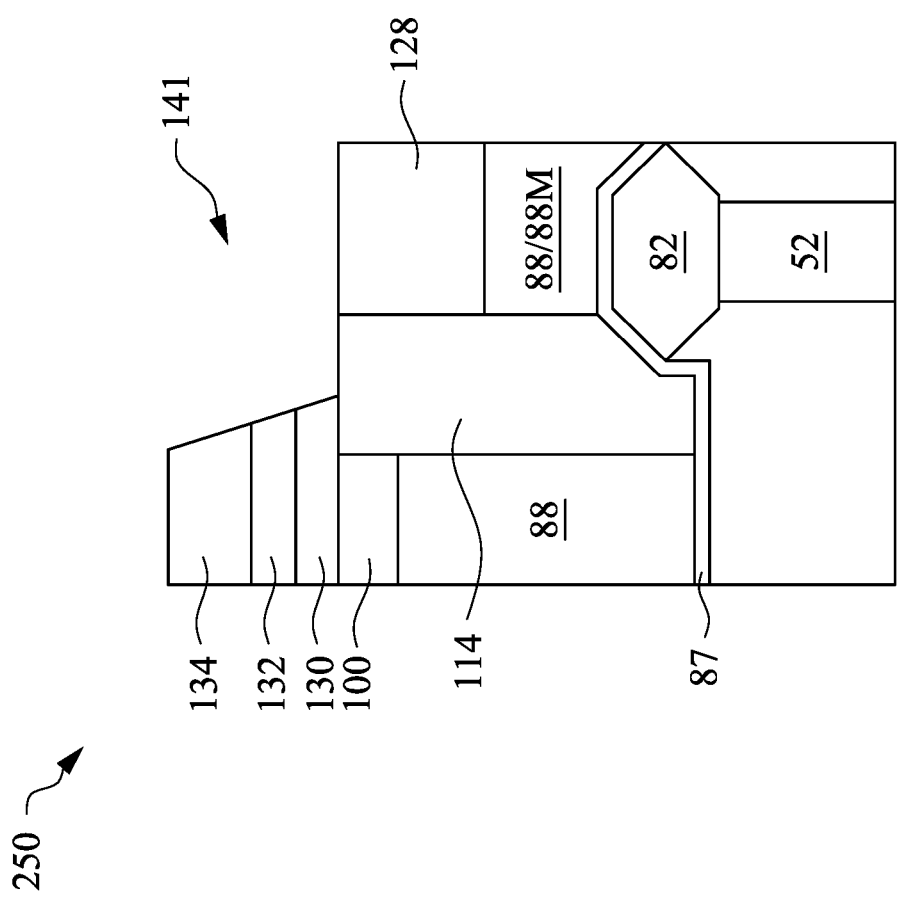

In FIGS. 30A and 30B, the etch stop layer 130 is etched using the dielectric layer 134 as an etching mask. The trench 141 is thus extended through the etch stop layer 130 and exposes a top surface of the dielectric layer 100, the contact mask 114, and the contact mask 128. In an embodiment, etching the etch stop layer 130 may comprise using an anisotropic etching process that comprises fluorine-based reactive gases such as $SF_6$, $CF_4$, $CBrF_3$, coupled halogen (e.g., a combination of $CF_4$ and $Cl_2$) or the like. After the etching process is performed, one or more cleaning processes (e.g., an ash, wet clean, or the like) may be performed to remove residues (e.g., residues of the patterned photoresist 138) in the trench 141.

Figure 31A:
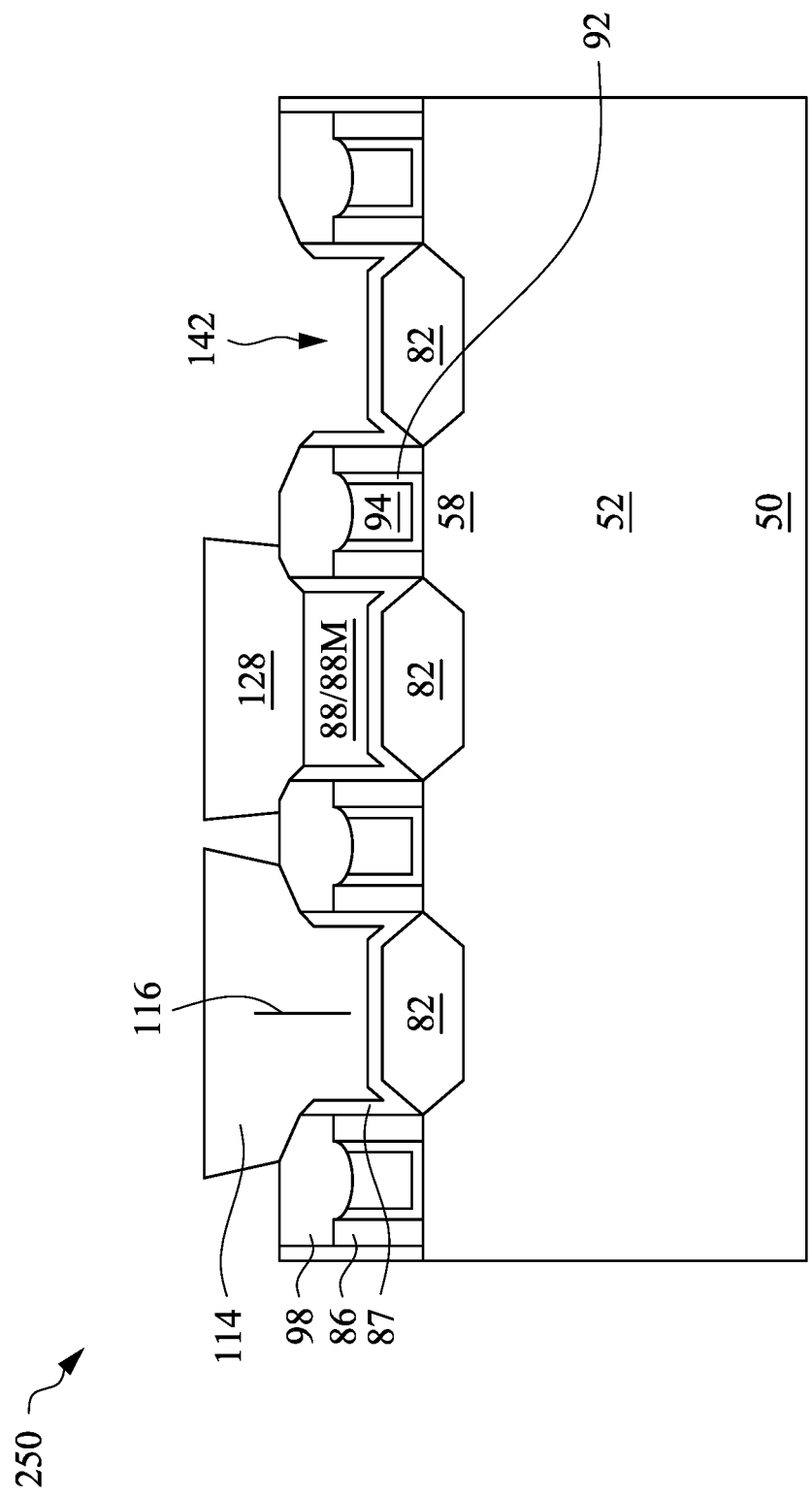
Figure 31B:
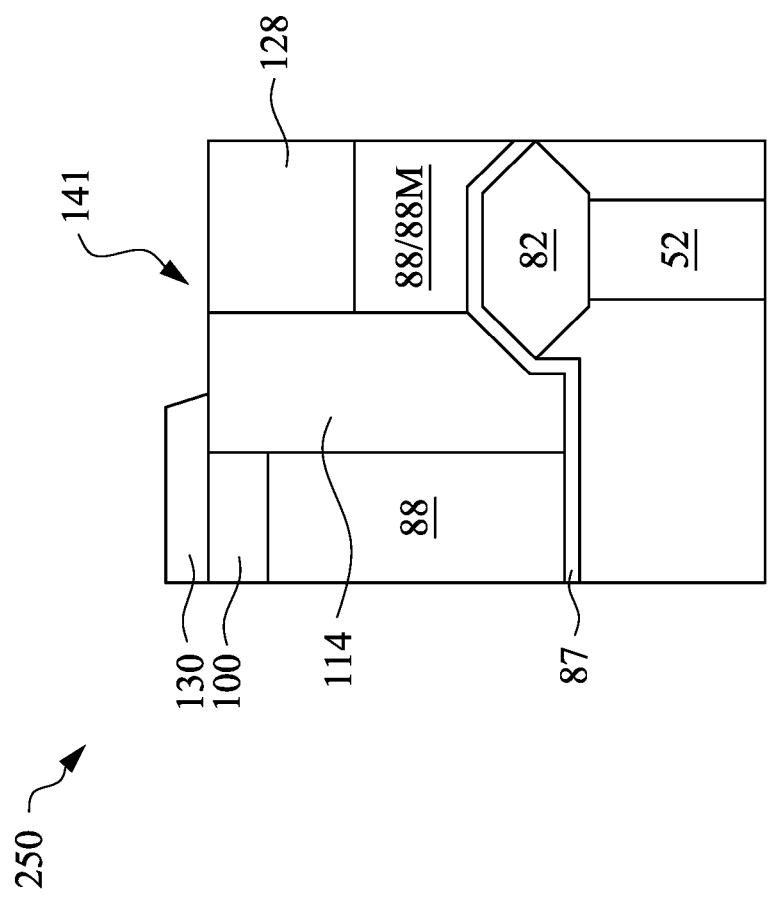

FIGS. 31A and 31B illustrate an etching process that removes the dielectric layer 134 and the dielectric layer 132, and uses the etch stop layer 130 as a mask to remove portions of the first ILD 88 and the dielectric layer 100 exposed by the etch stop layer 130. The etching process may use an etchant that is selective to (e.g., having a higher etch rate for) the material(s) of the first ILD 88 and the dielectric layer 100. In an example embodiment, the first ILD 88 and the dielectric layer 100 are formed of silicon oxide, the gate spacers 86 and the CESL 87 are formed of silicon nitride, and the etching process uses an etching gas comprising a fluorocarbon (e.g., $C_xF_y$, where x is between 2 and 5, and y is between 5 and 8, such as $C_2F_6$ or $C_4F_8$). As illustrated in FIGS. 31A and 31B, the etching process results in the formation of a recess 142 that extends between opposing sidewalls of a portion of the CESL 87 and the gate masks 98, as well as over the epitaxial source/drain regions 82. In an embodiment, during the etching process, some etching of the CESL 87 and the gate masks 98 may also occur. In some embodiments, the etching process also removes the CESL 87 on the epitaxial source/drain regions 82 in the recess 142. In other embodiments, an additional anisotropic etching process is performed to remove the CESL 87 to expose the epitaxial source/drain regions 82 in the recess 142. In an embodiment, after the etching process is performed, one or more cleaning processes (e.g., an ash, wet clean, or the like) may be performed.

Figure 32A:
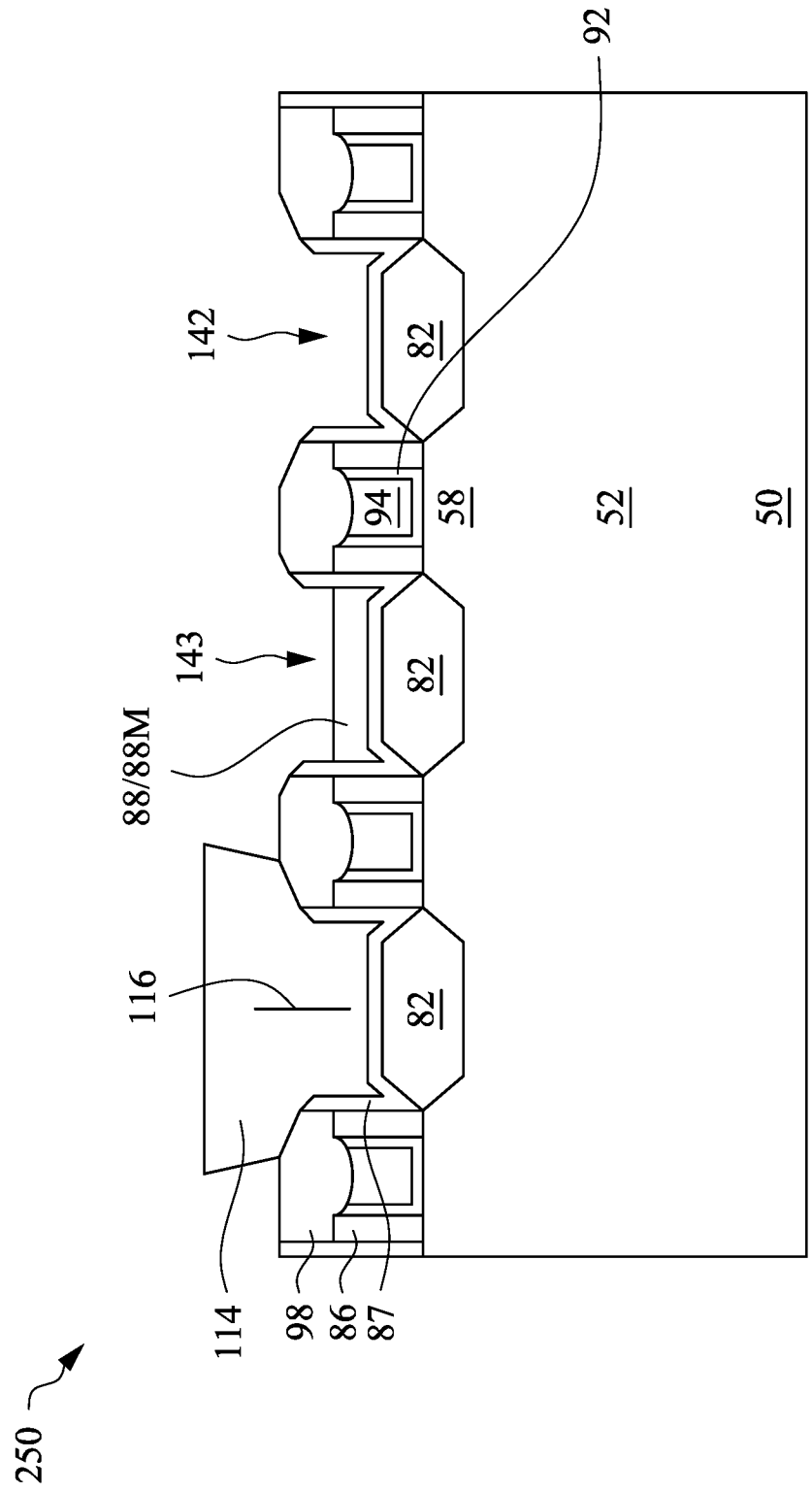
Figure 32B:
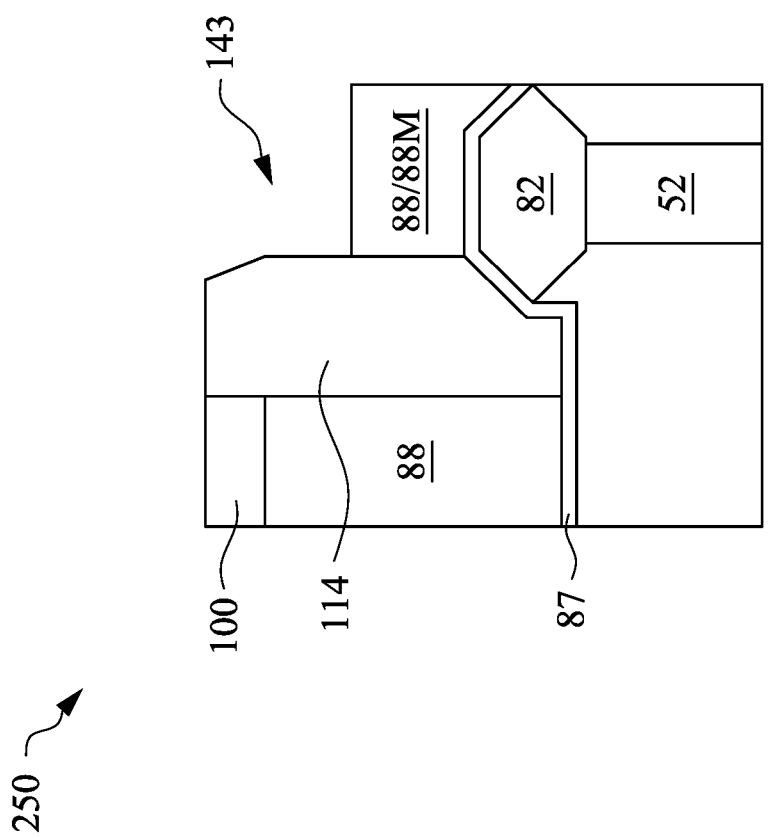

In FIGS. 32A and 32B, one or more cleaning processes (e.g., wet clean or the like) may be performed to remove the etch stop layer 130. An etching process is then performed to remove the contact mask 128 and form a recess 143 that extends between opposing sidewalls of a portion of the CESL 87 and the gate masks 98. The recess 143 overlaps both the first fin 52 and the second fin 52 (e.g., extends over the first fin 52 and the second fin 52 shown previously in FIG. 15B) in an orientation that is perpendicular to the orientation of the first fin 52 and the second fin 52. After the formation of the recess 143, a top surface of the first ILD 88M is exposed at the bottom of the recess 143. The etching process to remove the contact mask 128 may be a dry etch performed with etchants such as $SF_6$, $CF_4$, $CBrF_3$, coupled halogen (e.g., a combination of $CF_4$ and $Cl_2$), or the like.

Figure 33A:
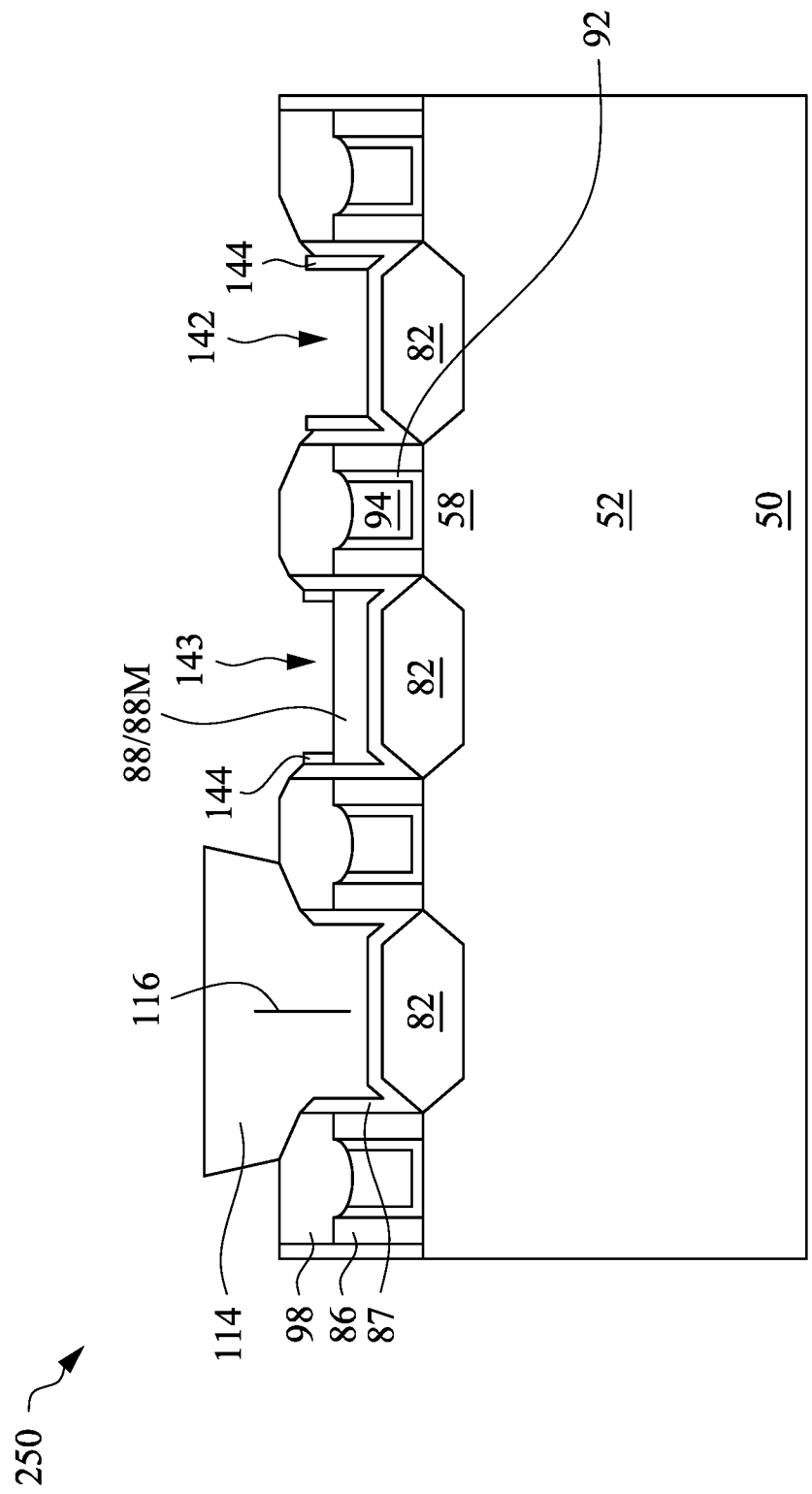
Figure 33B:
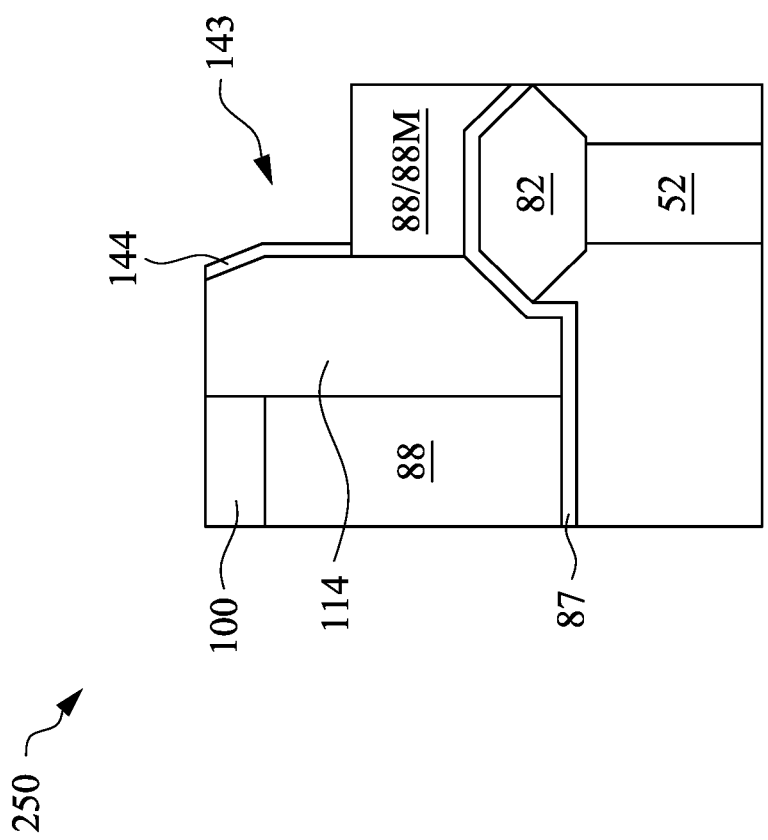

In FIGS. 33A and 33B, semiconductor spacers 144 are formed in the recess 142 and the recess 143. The semiconductor spacers 144 may be formed by conformally depositing a spacer material such as a semiconductor material in the recess 142 and the recess 143. The semiconductor material may comprise silicon, or the like, and may be formed using a suitable formation method such as CVD, PECVD, or the like. More specifically, and as will be subsequently described in greater detail, the semiconductor material is the same material which was implanted in the first ILD 88M (described for FIGS. 25A and 25B). The semiconductor material formed to line sidewalls and bottoms of the recess 142 and the recess 143. Next, an anisotropic etching process is performed to remove horizontal portions of the semiconductor material, such as a portion over a top surface of the contact mask 114, a portion over a top surface of the first ILD 88M, portions over top surfaces of the gate masks 98, a portion over a top surface of the epitaxial source/drain regions 82 and portions over top surfaces of the CESL 87. The remaining portions of the semiconductor material form the semiconductor spacers 144.

Figure 34A:
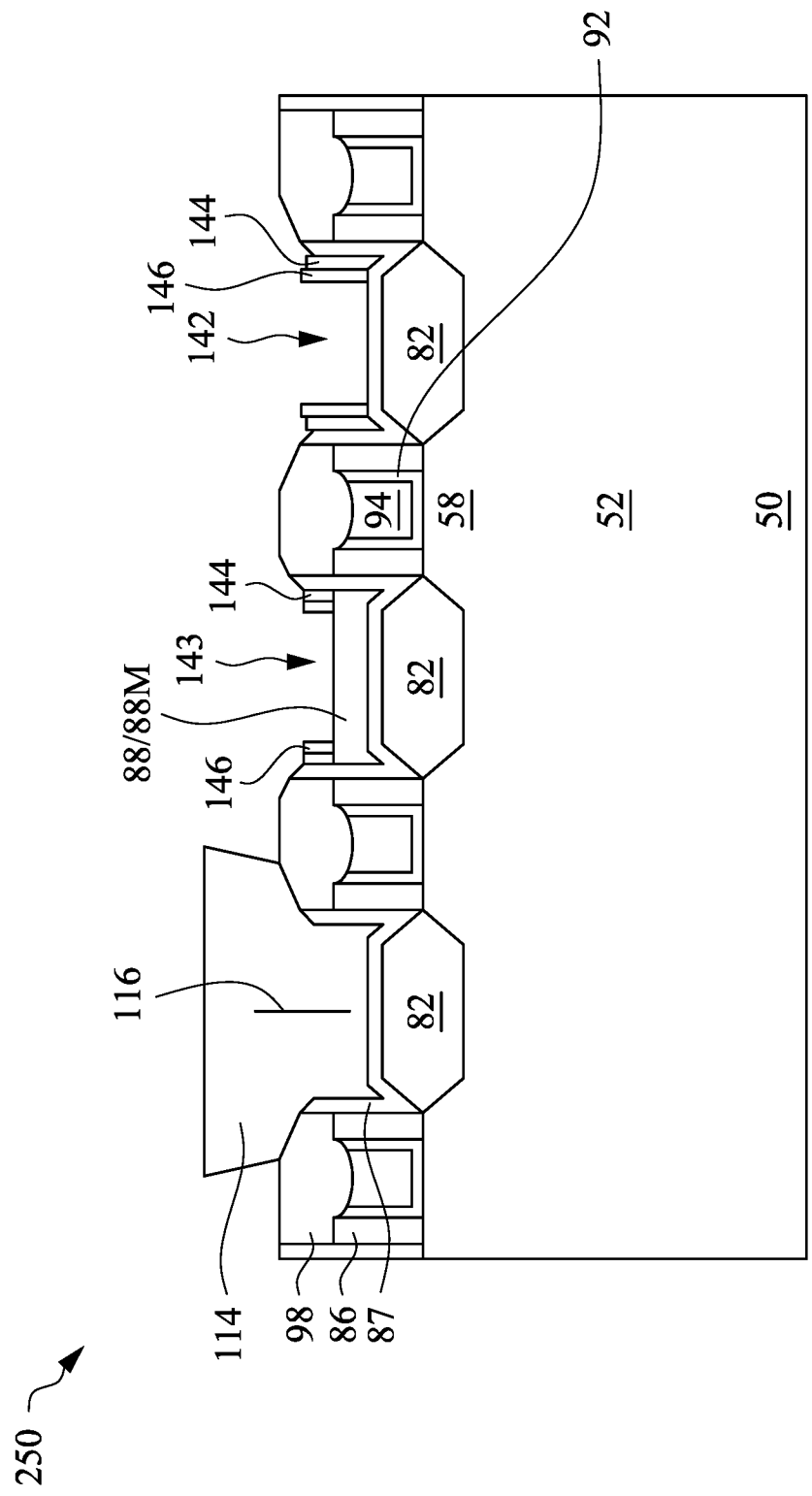
Figure 34B:
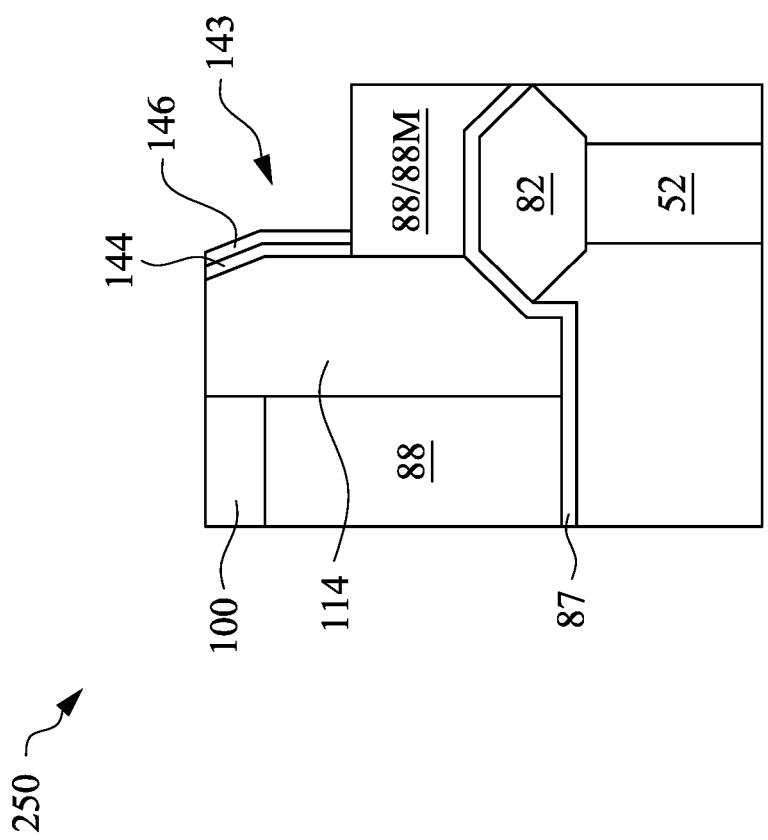

In FIGS. 34A and 34B, dielectric spacers 146 are formed in the recess 142 and the recess 143, adjacent the semiconductor spacers 144. The dielectric spacers 146 may be formed by conformally depositing a dielectric material in the recess 142 and the recess 143. The dielectric material may comprise silicon nitride, or the like, and may be formed using a suitable formation method such as ALD, CVD, PEALD, or the like. The dielectric material is formed to line sidewalls and bottoms of the recess 142 and the recess 143. Next, an anisotropic etching process is performed to remove horizontal portions of the dielectric material, such as a portion over top surfaces of the semiconductor spacers 144, a top surface of the contact mask 114, a portion over a top surface of the first ILD 88M, portions over top surfaces of the gate masks 98, a portion over a top surface of the epitaxial source/drain regions 82 and portions over top surfaces of the CESL 87. The remaining portions of the dielectric material form the dielectric spacers 146. Each semiconductor spacer 144 is between a respective dielectric spacer 146 and a respective portion of the CESL 87.

Figure 35A:
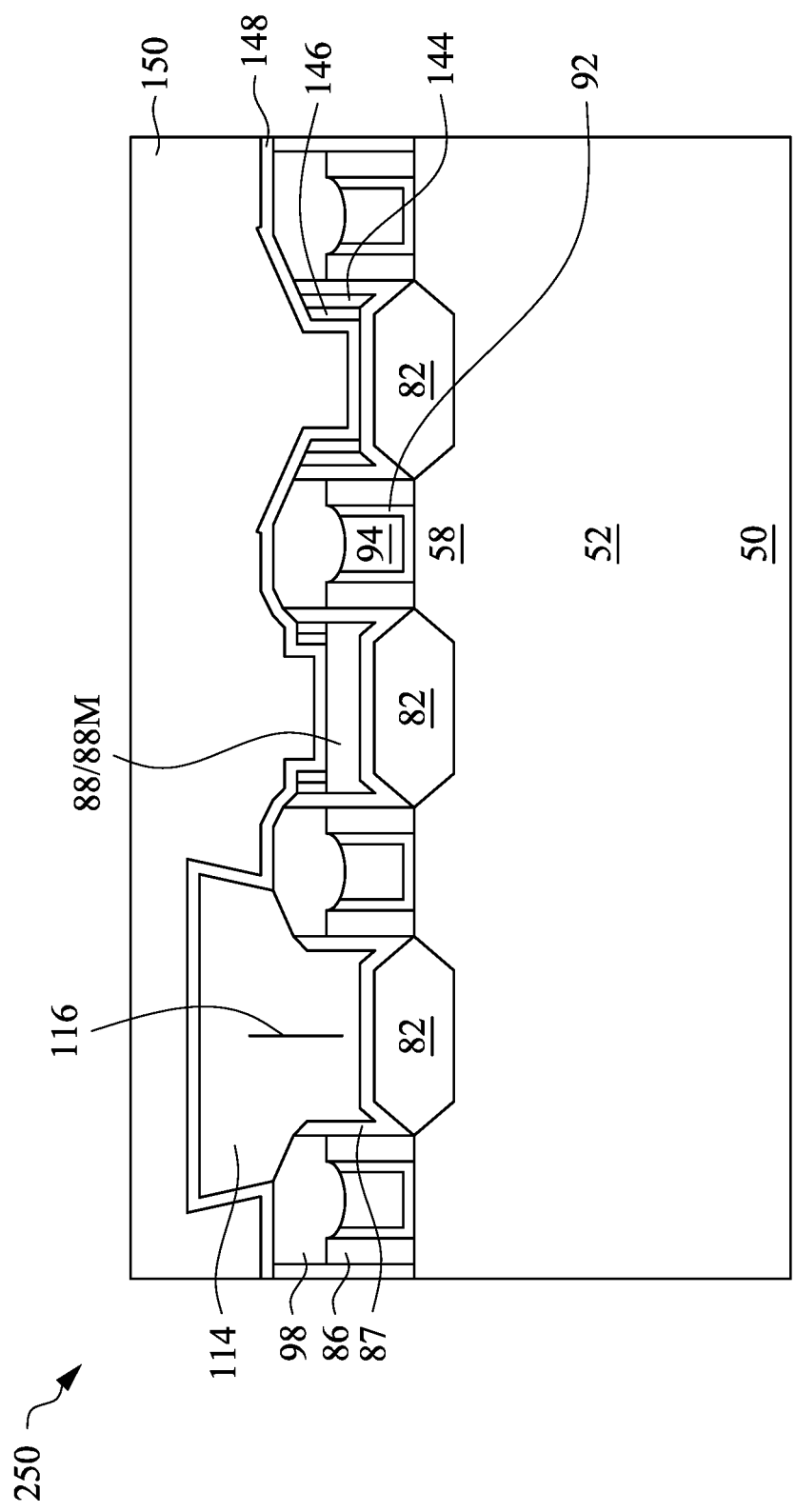
Figure 35B:
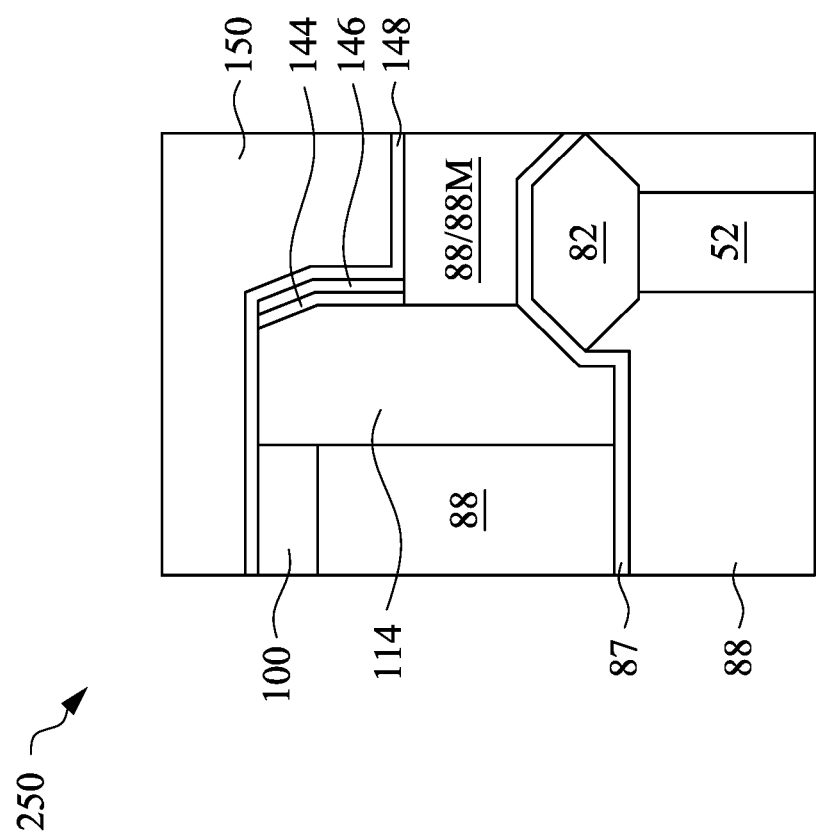

In FIGS. 35A and 35B, a metal layer 148 is deposited over the structure shown in FIGS. 34A and 34B, such as over the dielectric spacers 146, the semiconductor spacers 144, the contact mask 114, the dielectric layer 100, the gate masks 98, the first ILD 88M, and the CESL 87. A pre-cleaning process may be performed before the metal layer 148 is deposited. The metal layer 148 may comprise a metal capable of reacting with semiconductor materials (e.g., silicon, germanium, or the like, of the epitaxial source/drain regions 82) to form silicide or germanide regions, such as nickel, cobalt, titanium, tantalum, platinum, tungsten, other noble metals, other refractory metals, rare earth metals or their alloys. A thermal anneal process is then performed to form the silicide regions on the epitaxial source/drain regions 82. In some embodiments (not separately illustrated), the un-reacted portions of the deposited metal layer 148 are removed (e.g., by an etching process after the thermal anneal process). Although a thermal anneal process to describe silicide regions is described, in other embodiments, germanide regions, silicon germanide regions (e.g., regions comprising silicide and germanide), or the like may also be formed.

Still referring to FIGS. 35A and 35B, a conductive material 150, such as tungsten, cobalt, copper, ruthenium, or the like, is formed over the metal layer 148, including in the recess 142 and the recess 143. The conductive material 150 fills the recess 142 and the recess 143.

Figure 36A:
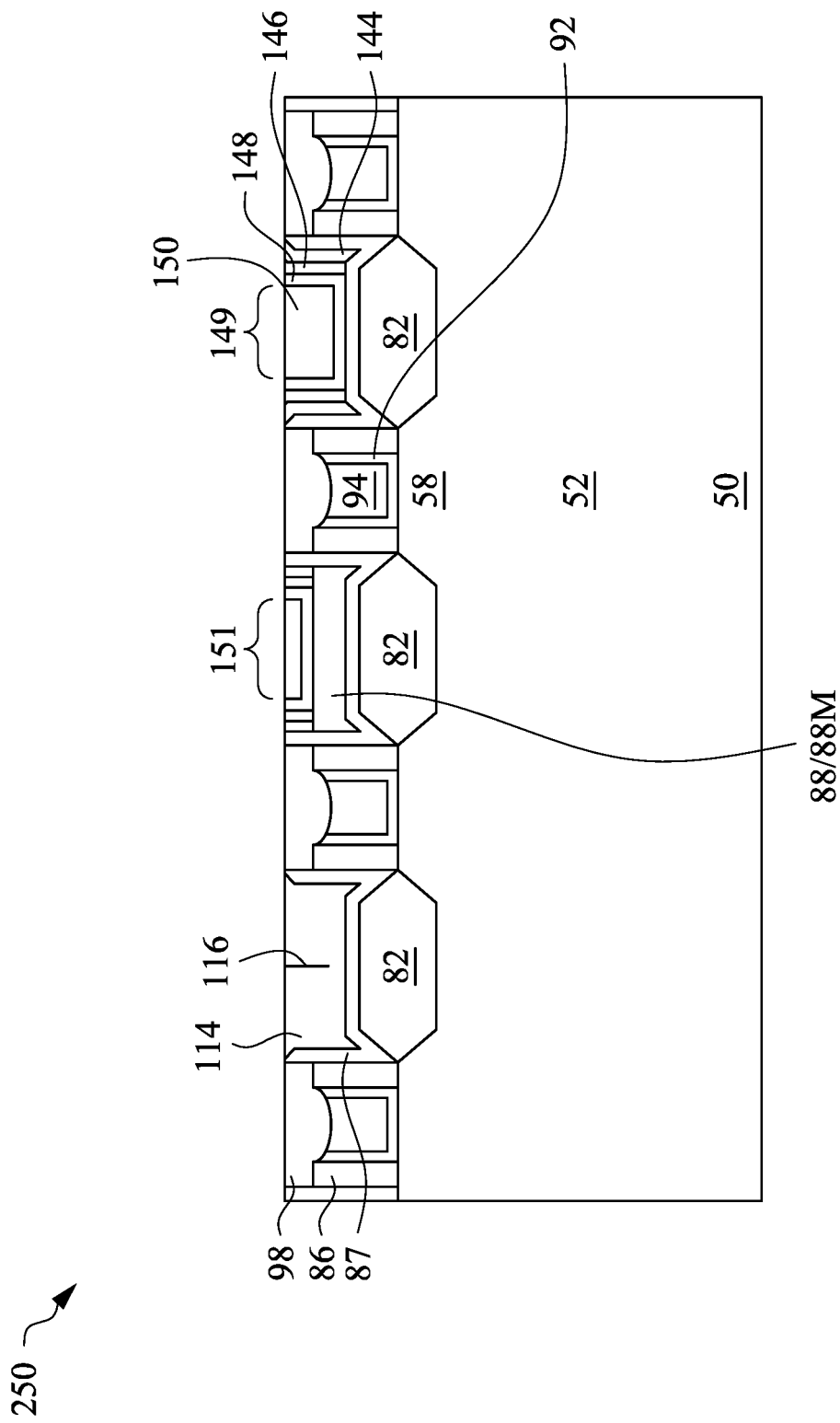
Figure 36B:
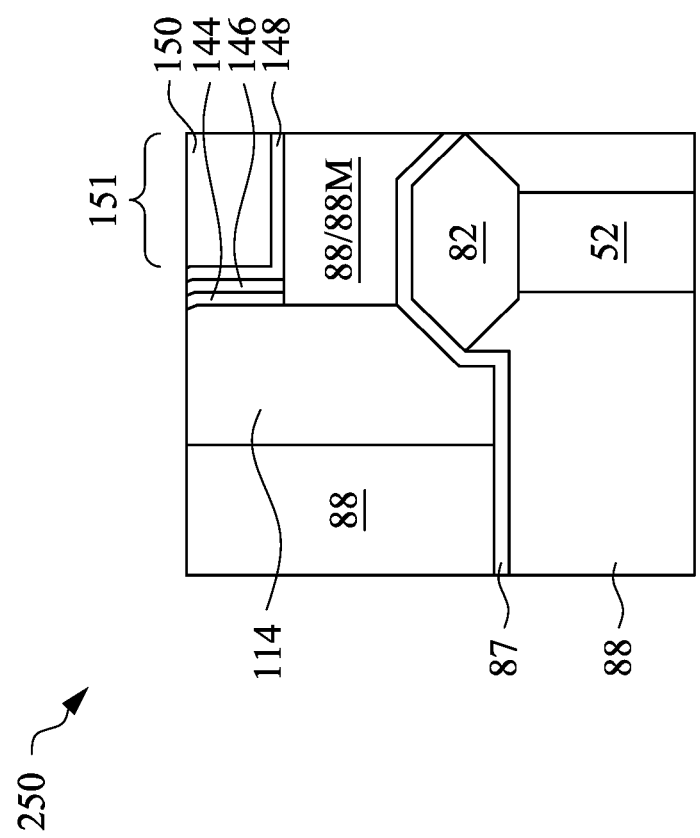

In FIGS. 36A and 36B, a planarization process, such as CMP, is performed to remove excess portions of the conductive material 150 and to level top surfaces of the conductive material 150 with top surfaces of the contact mask 114, the gate masks 98, the metal layer 148, the dielectric spacers 146 and the semiconductor spacers 144. The remaining portions of the conductive material 150 form a source/drain contact 149 in the recess 142 and a source/drain contact 151 in the recess 143, respectively. The source/drain contact 151 overlaps both the first fin 52 and the second fin 52 (e.g., extends over the first fin 52 and the second fin 52 shown previously in FIG. 15B). The source/drain contact 151 is oriented in a direction that is perpendicular to the direction of the first fin 52 and the second fin 52.

Figure 37A:
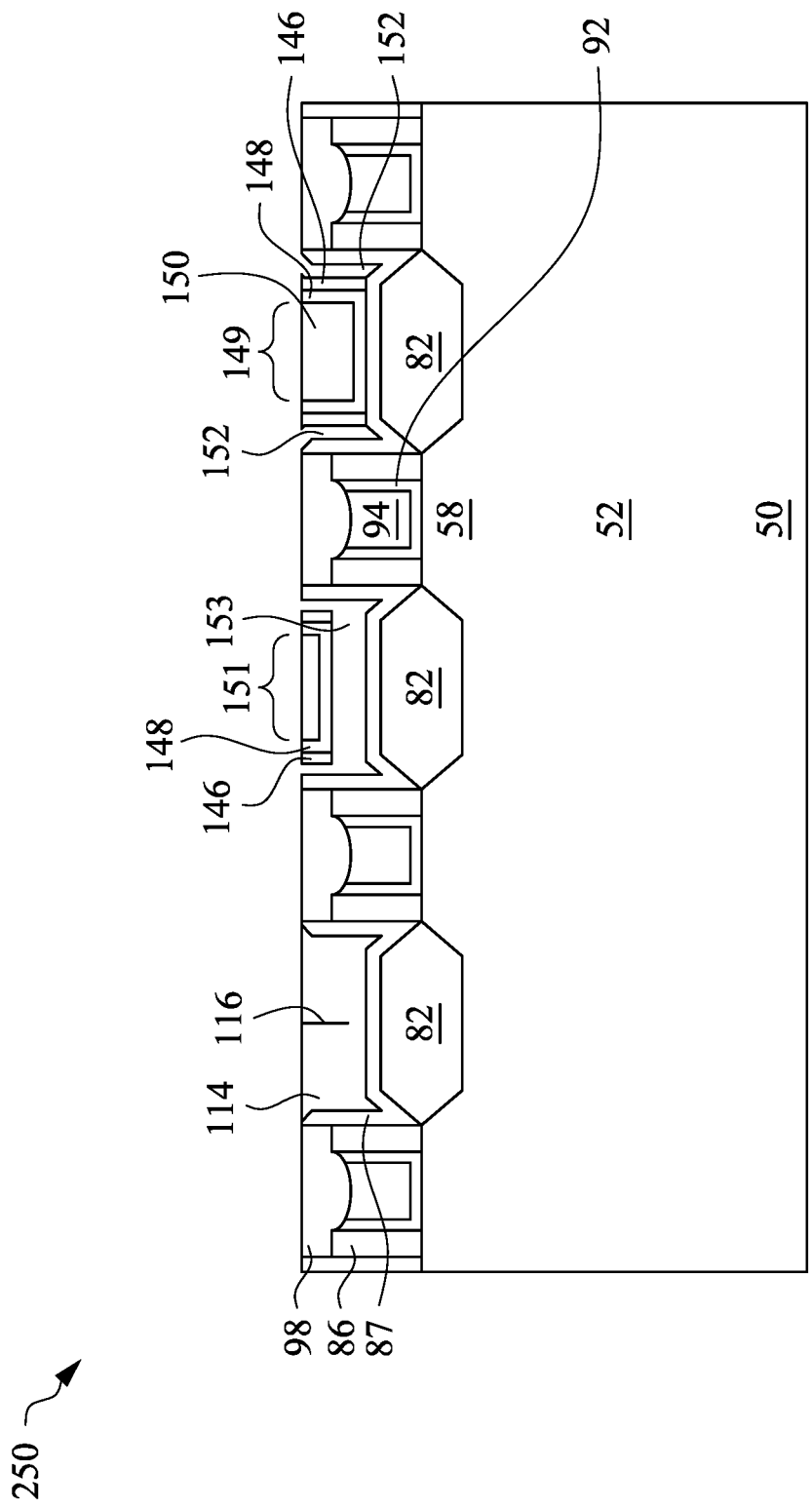
Figure 37B:
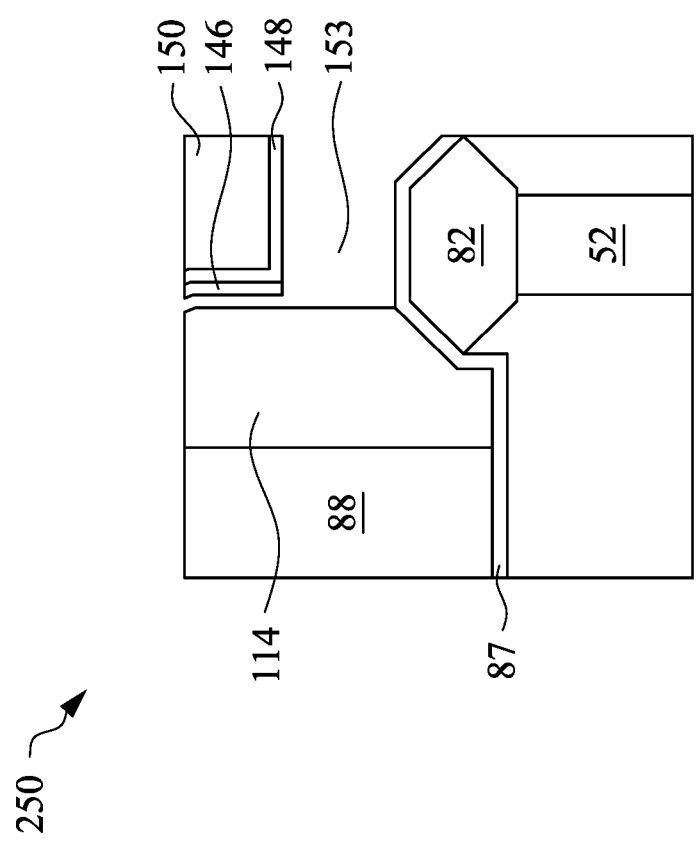

In FIGS. 37A and 37B, an etching process is performed to remove the semiconductor spacers 144 and the first ILD 88. The etching process may use an etchant that is selective to (e.g., having a higher etch rate for) the impurity which was implanted in the first ILD 88M and the spacer material of the semiconductor spacers 144 (e.g., silicon), such that the etchant selectively etches materials having a higher silicon concentration (e.g., the first ILD 88M and the semiconductor spacers 144) at a faster rate than materials having lower silicon concentrations (e.g., the CESL 87, the gate masks 98, the contact mask 114, the conductive material 150 and the dielectric spacers 146). The etching process may be a wet etch process that is performed with mixture of nitric acid ($HNO_3$) and hydrofluoric acid (HF), or the like as etchants. The etching process may also comprise a combination of dry and wet etch process, where dry etching fluorinated gas such as $XeF_2$ or $CF_4$, or the like are used. In an embodiment, the etching may be isotropic.

The use of the etching process to remove the semiconductor spacers 144 results in the formation of an air-gap 152 that surrounds sidewalls of the source/drain contact 149, the metal layer 148 and the dielectric spacers 146. The removal of the semiconductor spacers 144 also results in a first portion of an air-gap 153 that surrounds the sidewalls of the source/drain contact 151, the metal layer 148 and the dielectric spacers 146. In addition the use of the etching process to remove the first ILD 88M results in a second portion of the air-gap 153 that extends below a portion of the source/drain contact 151.

Advantages can be achieved as a result of the formation of the source/drain contact 151 that overlaps a first fin 52 and a second fin 52 that are adjacent to each other. A first portion of the source/drain contact 151 is formed over the first ILD 88M, and the semiconductor spacers 144 are formed on the sidewalls of the source/drain contact 151. The first ILD 88M, which was implanted with silicon impurities, and the semiconductor spacers 144 are selectively etched to form the air-gap 153 along sidewalls and under the first portion of the source/drain contact 151. The dielectric layer 154 is then formed over the source/drain contact 151 and the air-gap 153 to form an air-gap seal. These advantages include a reduction in parasitic capacitance while still maintaining adequate isolation and device reliability as a result of the presence of the air-gap 153 under the source/drain contact 151. In addition, the disclosed method may be integrated easily into existing processes and therefore provides a solution while allowing for lower manufacturing costs.

Figure 38A:
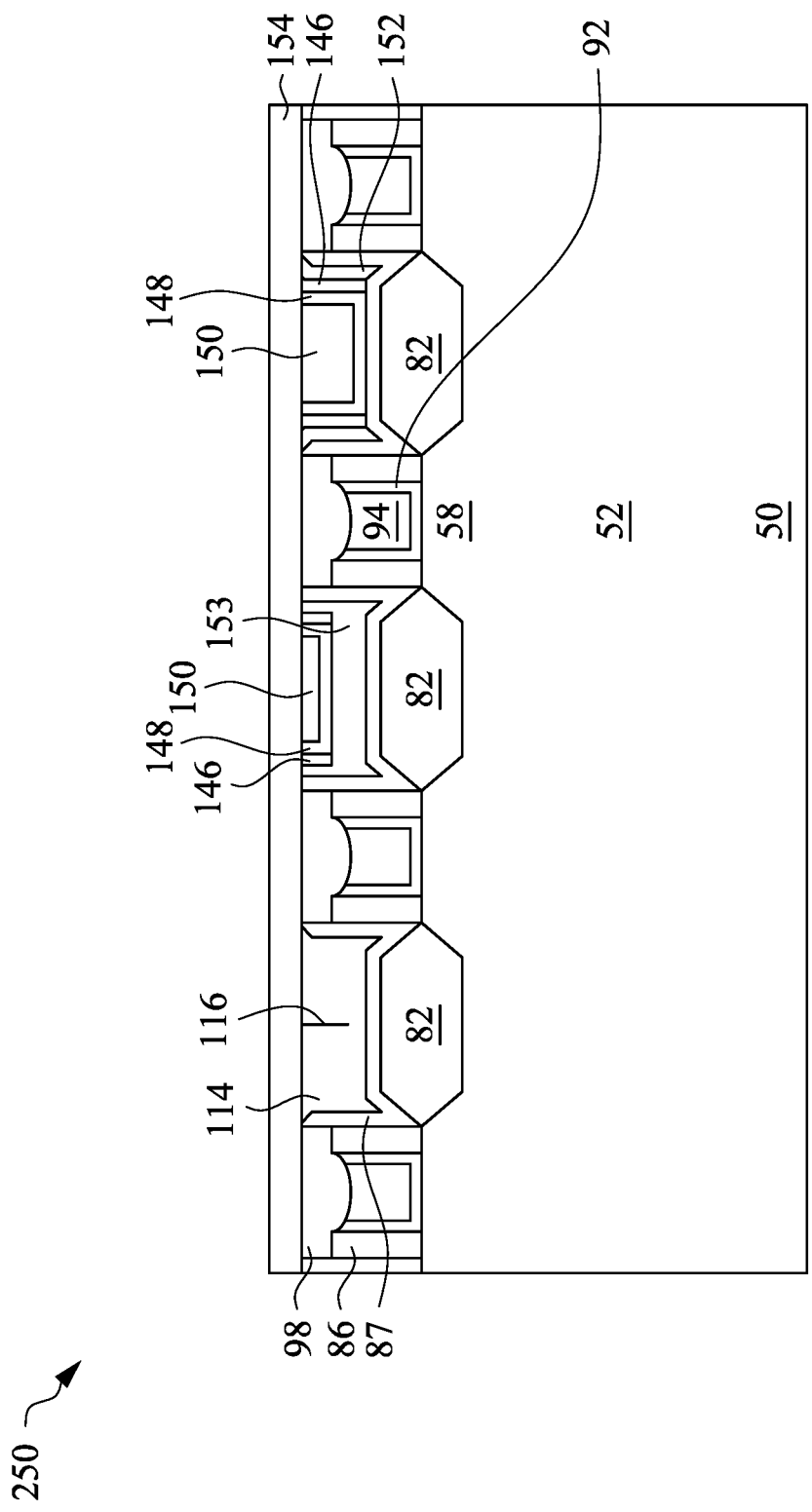
Figure 38B:
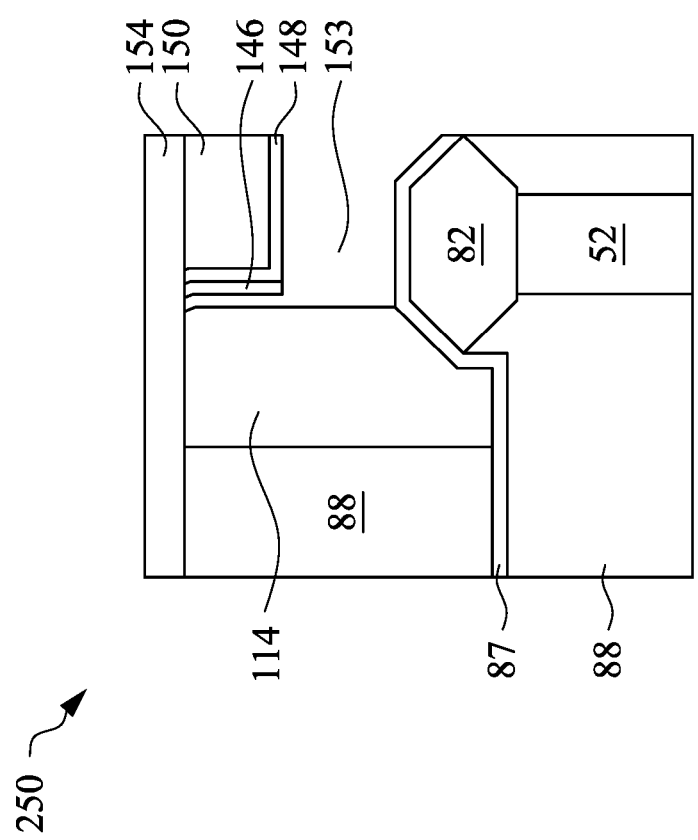

In FIGS. 38A and 38B, a dielectric layer 154 is deposited over the CESL 87, the source/drain contact 149, the source/drain contact 151, the contact mask 114, the gate masks 98, the metal layer 148, the dielectric spacers 146, the air-gap 152 and the air-gap 153. The dielectric layer 154 may be deposited by any suitable method, such as CVD, PECVD, or the like and may comprise SiN, SiOCN, SiCN, or the like. The dielectric layer functions as an air-gap sealing layer for the air-gap 152 and the air-gap 153, and confines the air-gap 152 and the air-gap 153 within the enclosed spaces of the air-gap 152 and air-gap 153, respectively. Thus, the air-gap 152 and the air-gap 153 are sealed and may contain air within the enclosed spaces of the air-gap 152 and the air-gap 153. In an embodiment, top surfaces of the source/drain contact 151, the source/drain contact 149, the contact mask 114, the gate masks 98, the metal layer 148 and the dielectric spacers 146 may be level with topmost points of the air-gap 152 and the air-gap 153. In other embodiments, the air-gap 152 and the air-gap 153 may contain an inert gas or the like. In yet other embodiments, the air-gap 152 and the air-gap 153 may be voids that each comprise a vacuum.

Figure 39A:
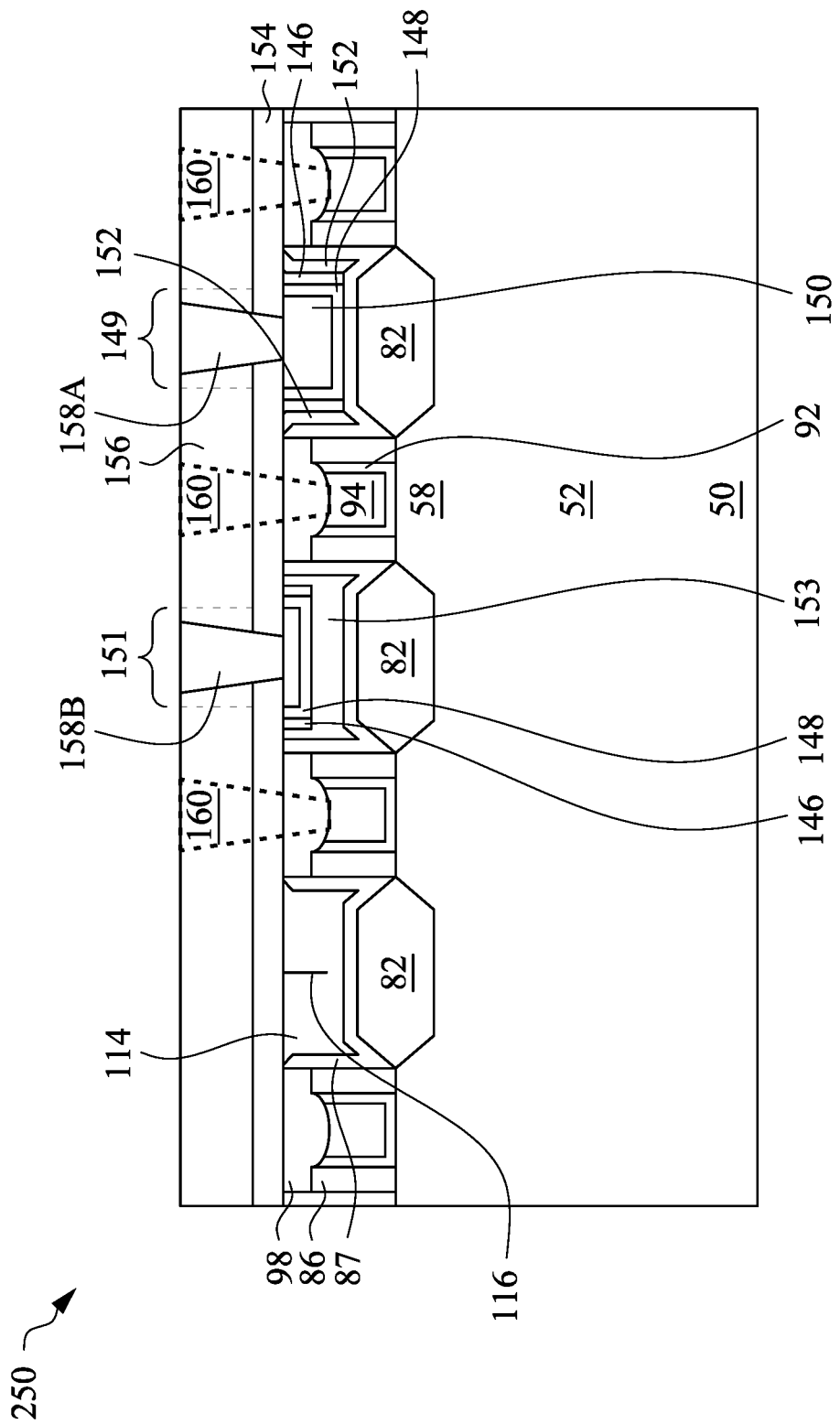
Figure 39B:
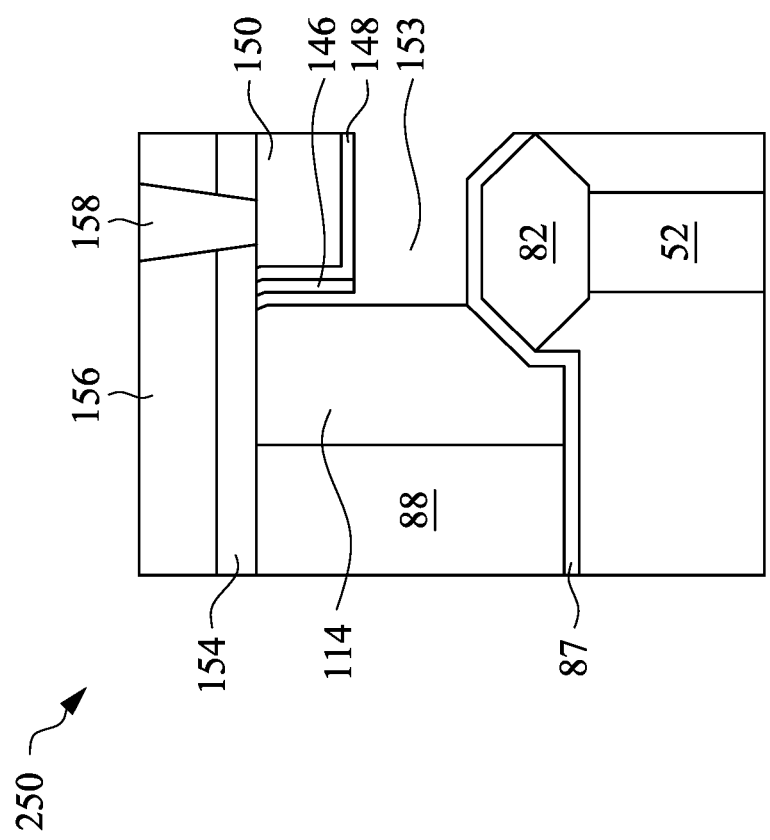

In FIGS. 39A and 39B, a second ILD 156 is deposited over the dielectric layer 154. In some embodiments, the second ILD 156 is a flowable film formed by a flowable CVD method. In some embodiments, the second ILD 156 is formed of a dielectric material such as PSG, BSG, BPSG, USG, or the like, and may be deposited by any suitable method, such as CVD and PECVD. Contacts 158 are formed through the second ILD 156 and the dielectric layer 154, and gate contacts 160 (shown in ghost) are formed through the second ILD 156, the gate masks 98 and the dielectric layer 154, in accordance with some embodiments. The contacts 158 include a contact 158A connected to the source/drain contact 149 and a contact 158B connected to the source/drain contact 151.

As an example for forming the contacts 158 and the gate contacts 160, openings for the contacts 158 may be formed through the second ILD 156 and the dielectric layer 154, and openings for the gate contacts 160 may also be formed through the second ILD 156, the dielectric layer 154 and the gate masks 98. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 156. The remaining liner and conductive material form the contacts 158 and the gate contacts 160 in the openings.

Referring further to FIGS. 39A and 39B, the contacts 158 and the gate contacts 160 may be formed in different processes, or may be formed in the same process. In some embodiments, top surfaces of the second ILD 156, the contacts 158 and the gate contacts 160 are coplanar (within process variations). As shown by the ghost in FIG. 39A, the contacts 158 and the gate contacts 160 may be formed in different cross-sections.

Figure 40A:
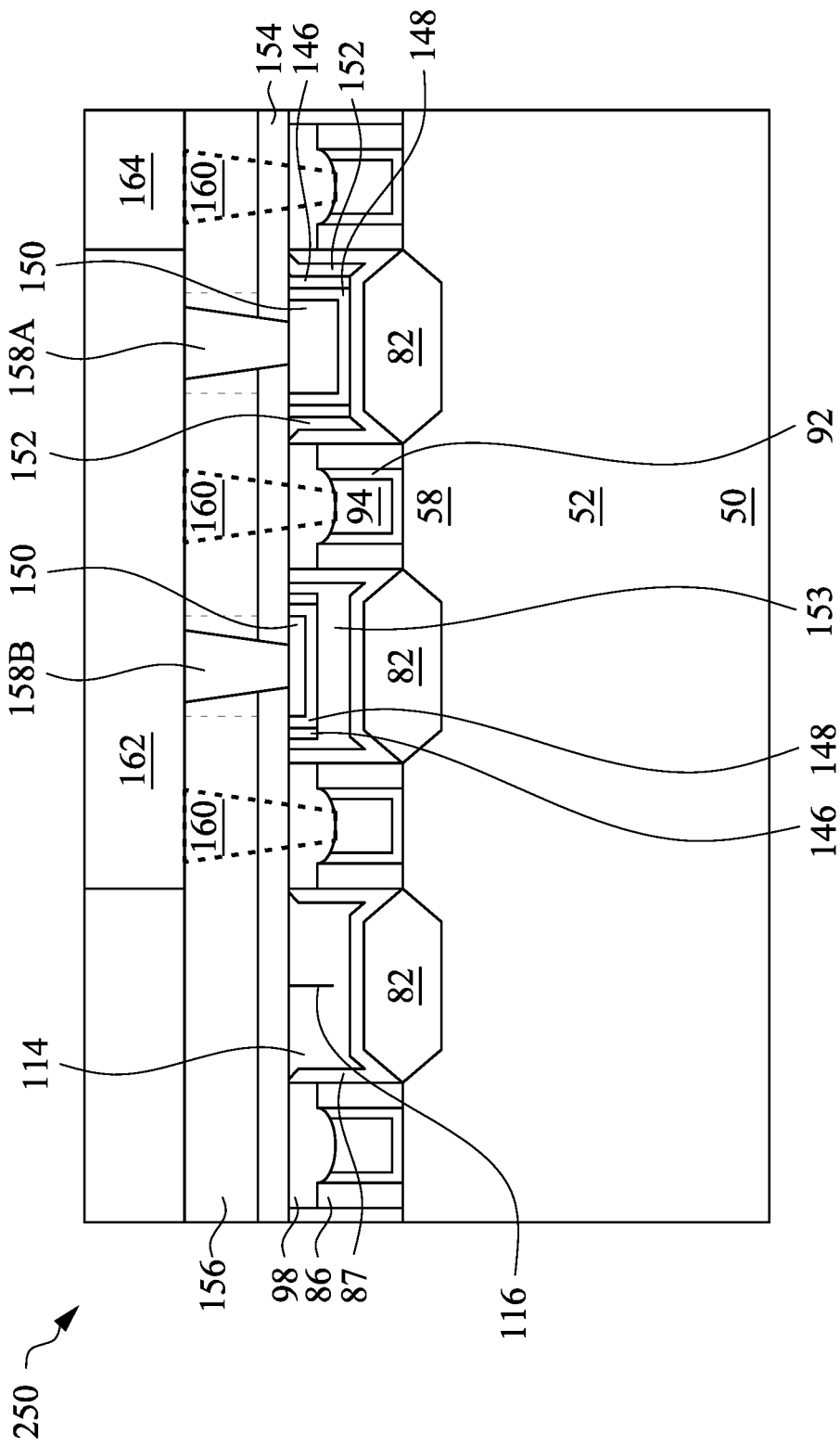
Figure 40B:
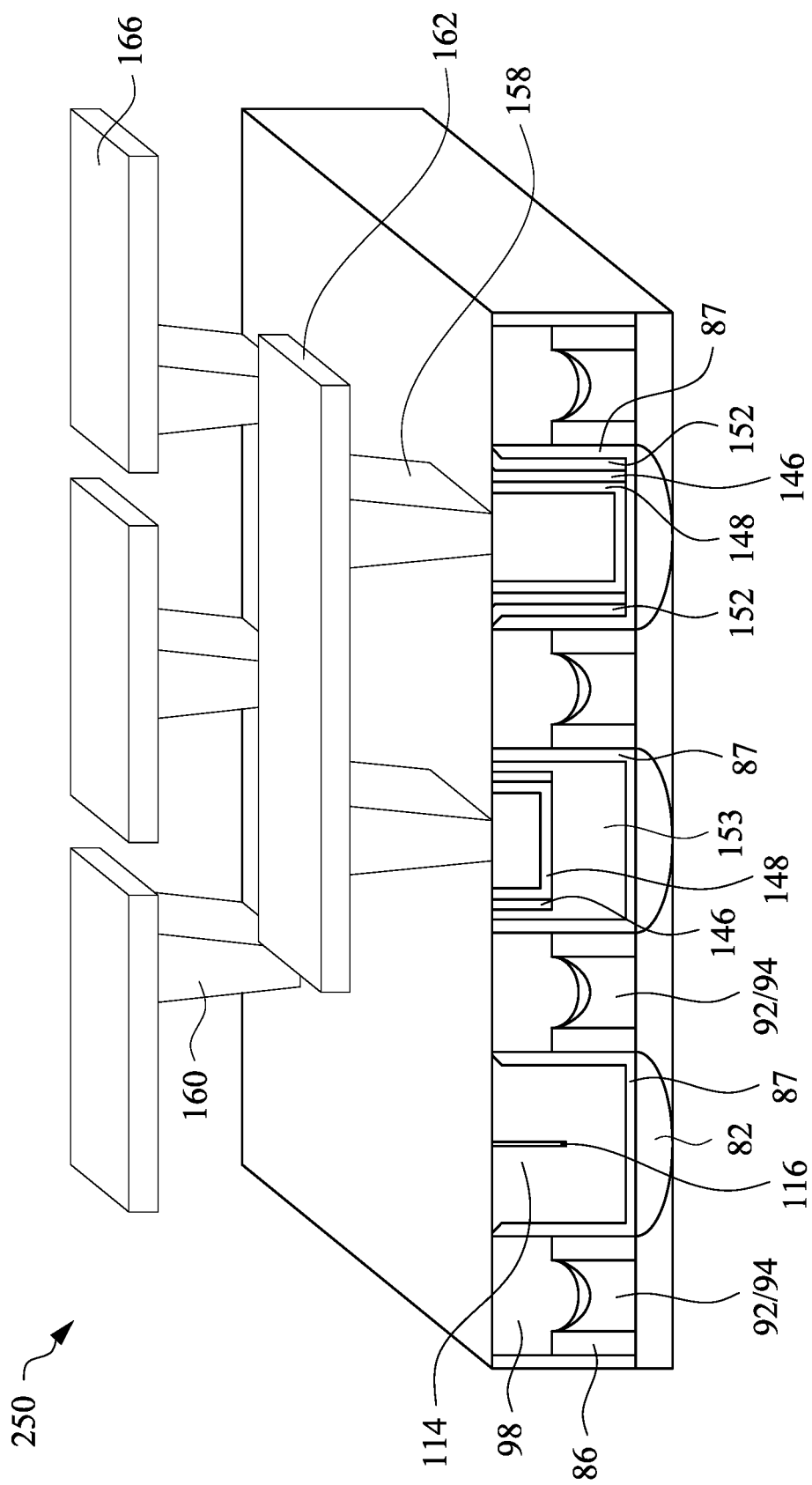
FIGS. 40B-40F are various views of a semiconductor device, in accordance with some embodiments.
Figure 40C:
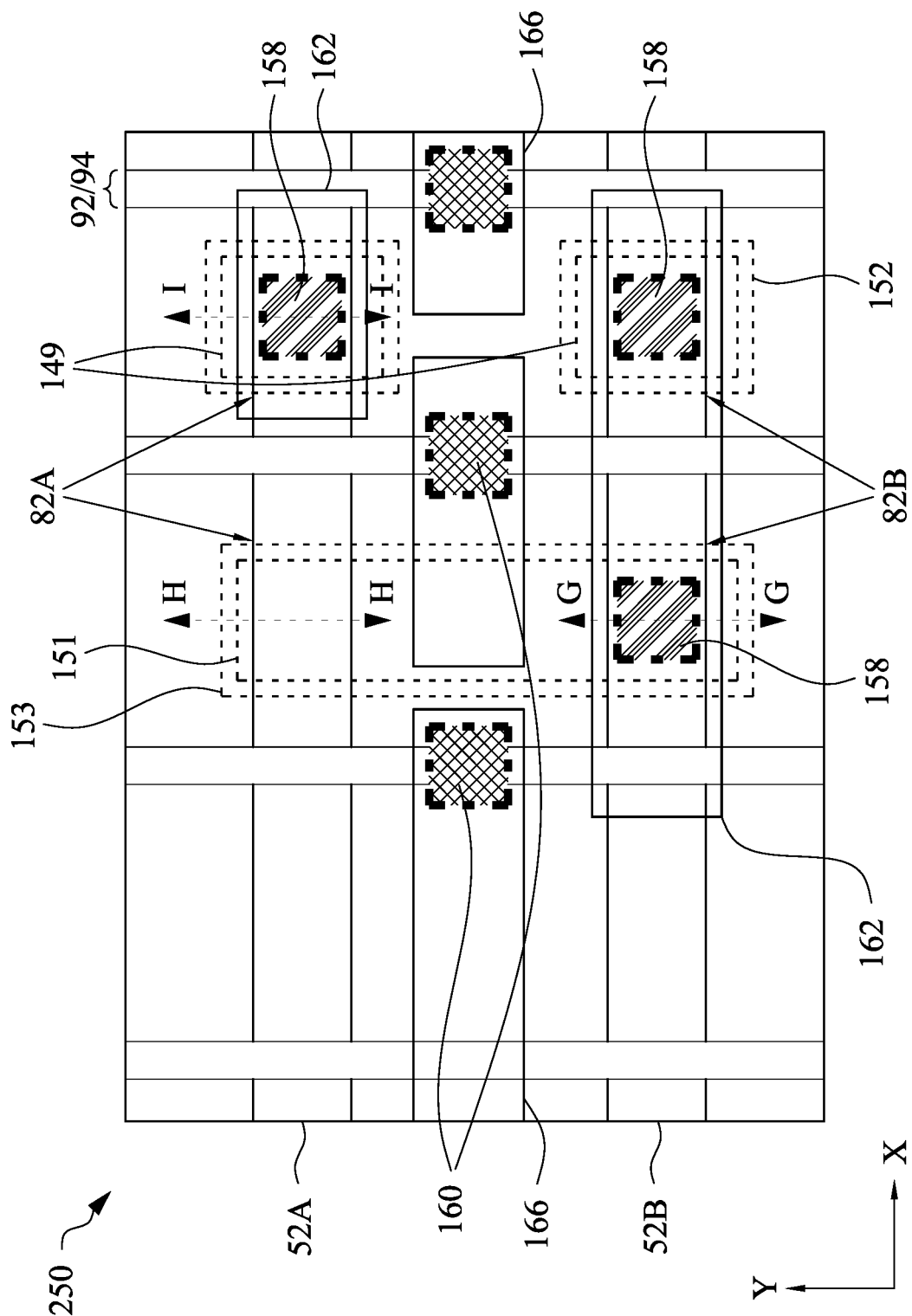
Figure 40E:
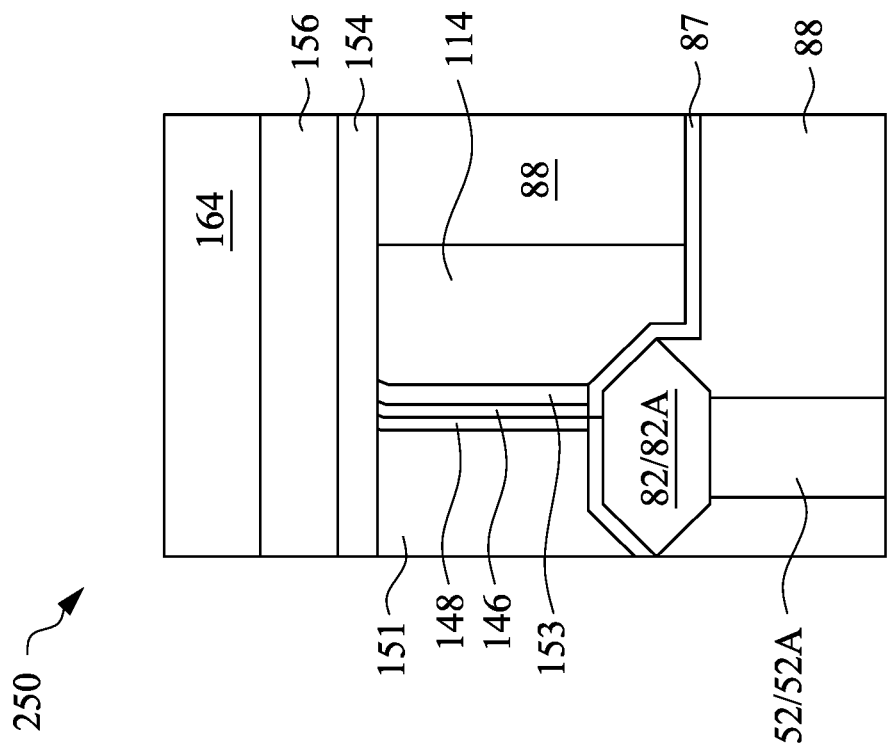
Figure 40D:
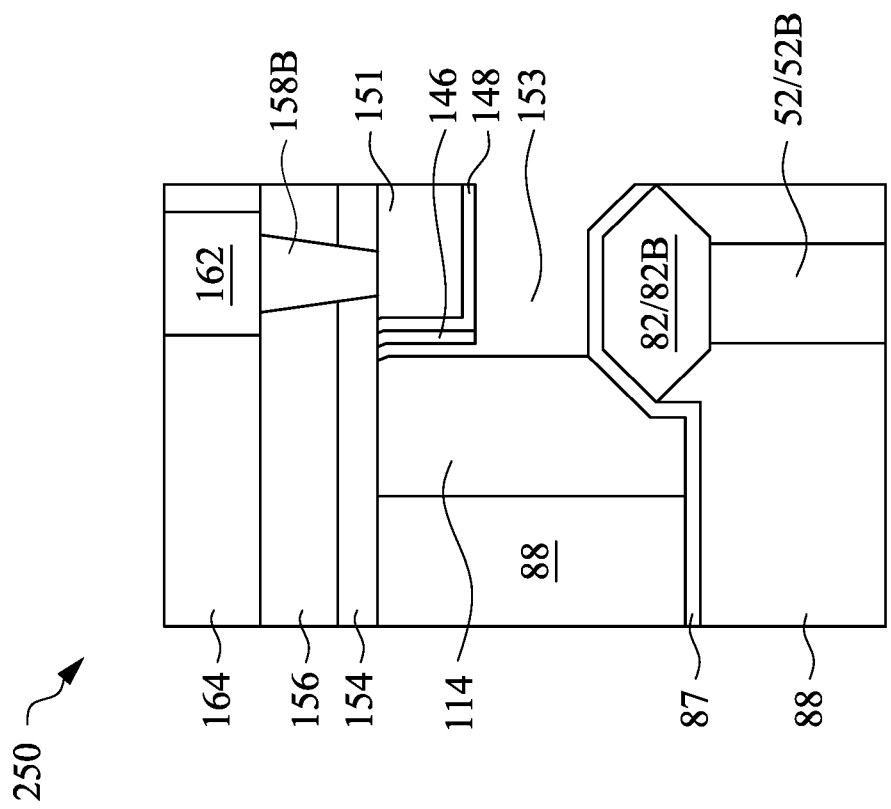
Figure 40F:
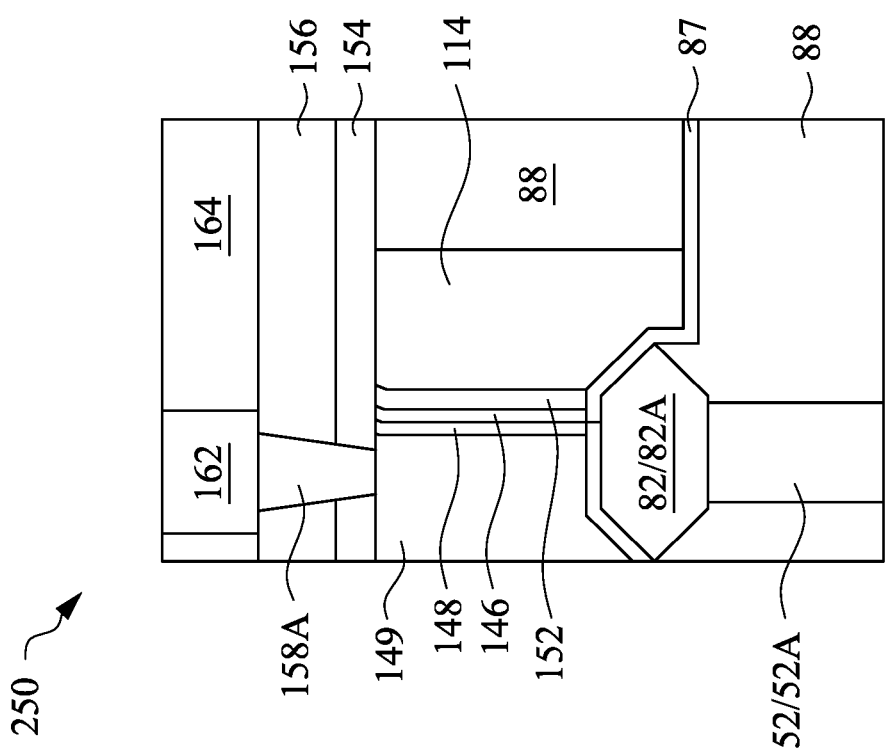

FIGS. 40A and 40B illustrate the formation of conductive line 162 and conductive lines 166 in a first inter-metal dielectric (IMD) 164 over the second ILD 156, in accordance with some embodiments. FIG. 40B shows a perspective view of the semiconductor device 250 after the formation of the conductive line 162 and the conductive lines 166. The conductive line 162 is physically and electrically coupled to the contacts 158 and the conductive lines 166 are physically and electrically coupled to the gate contacts 160.

As an example of forming the conductive lines 162 and 166, the first IMD 164 may be formed over the second ILD 156, the contacts 158 and the gate contacts 160. The first IMD 164 may be similar to the second ILD 156, and may be formed using similar techniques. Other materials or techniques are possible. An optional etch stop layer (not shown) may be formed between the second ILD 156 and the first IMD 164. Openings corresponding to pattern of the conductive line 162 and the conductive lines 166 may then be patterned in the first IMD 164, with the openings exposing surfaces of the contacts 158 and the gate contacts 160. A conductive material may be deposited within the openings to form the conductive line 162 and the conductive lines 166. The conductive material may be similar to those described for the contacts 158 and the gate contacts 160, and may be formed in a similar manner. Other conductive materials or deposition techniques are possible. A planarization process may be performed to remove excess conductive material from the first IMD 164. FIGS. 40A and 40B show the conductive line 162 and the conductive lines 166 as having substantially vertical sidewalls, but the conductive line 162 and the conductive lines 166 may have sloped sidewalls, curved sidewalls, or another sidewall profile in other embodiments.

FIG. 40C illustrates a top-down view of the semiconductor device 250 in accordance with an example embodiment of the present disclosure. Semiconductor device 250 has a first fin 52A and a second fin 52B that are adjacent to each other. The first fin 52A and the second fin 52B are oriented in a first direction (e.g., the X-direction). The semiconductor device 250 has four gate structures (each gate structure including a gate electrode 94 and a gate dielectric layer 92) extending over and along sidewalls of channel region 58 of the first fin 52A and the second fin 52B. Source/drain contacts 149 (shown in ghost) and contacts 158 electrically and physically connect first epitaxial source/drain regions 82A in the first fin 52A and second epitaxial source/drain regions 82B in the second fin 52B to conductive lines 162. Source/drain contact 151 (shown in ghost) and a contact 158 electrically and physically connect first epitaxial source/drain regions 82A in the first fin 52A to conductive line 162. Gate contacts 160 electrically and physically connect each gate structure to a conductive line 166. The source/drain contact 151 may be used to apply a voltage to one of the first epitaxial source/drain regions 82A in the first fin 52A, but is isolated (e.g., due to the presence of the air-gap 153) from and does not apply a voltage to the second epitaxial source/ drain regions 82B in the second fin 52B. The source/drain contact 151 is electrically coupled to the conductive line 162 that overlaps the second fin 52B through the contact 158, wherein the conductive line 162 that overlaps the second fin 52B has the same orientation (e.g., the X-direction) as the second fin 52B. The conductive line 162 that overlaps the second fin 52B is also electrically coupled to the source/drain contact 149 that is used to apply a voltage to one of the second epitaxial source/drain regions 82B in the second fin 52B through another contact 158.

FIG. 40D is cross-sectional view of the semiconductor device 250 along a cross-section G-G illustrated in FIG. 40C. As seen in FIGS. 40A, 40C and 40D, a first portion of an air-gap 153 (e.g., a vertical portion) extends along the sidewalls of the source/drain contact 151, the metal layer 148 and the dielectric spacers 146. In addition a second portion of the air-gap 153 (e.g., a horizontal portion) extends below a portion of the source/drain contact 151 and isolates the source/drain contact 151 from the second epitaxial source/drain regions 82B in the second fin 52B. FIG. 40E is cross-sectional view of the semiconductor device 250 along a cross-section H-H illustrated in FIG. 40C. As seen in FIGS. 40A, 40C and 40E, the first portion of the air-gap 153 extends along the sidewalls of the source/drain contact 151, the metal layer 148 and the dielectric spacers 146. In addition, a portion of the source/drain contact 151 is physically and electrically connected to the first epitaxial source/drain regions 82A in the first fin 52A. FIG. 40F is cross-sectional view of the semiconductor device 250 along a cross-section I-I illustrated in FIG. 40C. As seen in FIGS. 40A, 40C and 40F, a portion of an air-gap 152 surrounds the sidewalls of the source/drain contact 149, the metal layer 148 and the dielectric spacers 146. In addition, a portion of each source/drain contact 149 is physically and electrically connected to first epitaxial source/drain regions 82A the first fin 52A or second epitaxial source/drain regions 82B in the second fin 52B.

Advantages can be achieved as a result of the formation of the first source/drain contact 151 that overlaps the first fin 52A and the second fin 52B that are adjacent to each other. A first portion of the source/drain contact 151 is formed over the first ILD 88M, and the semiconductor spacers 144 are formed on the sidewalls of the source/drain contact 151. The first ILD 88M, which was implanted with silicon impurities, and the semiconductor spacers 144 are selectively etched to form the air-gap 153 along sidewalls and under the first portion of the source/drain contact 151. The air-gap 153 separates the source/drain contact 151 from the second epitaxial source/drain regions 82B in the second fin 52B (see FIG. 40D). The first fin 52A and the second fin 52B are oriented in a first direction (e.g., the X-direction) and the source/drain contact 151 is oriented in a second direction (e.g., the Y-direction) perpendicular to the first direction. The source/drain contact 151 is used to apply a voltage to the first epitaxial source/drain regions 82A in the first fin 52A (see FIG. 40E), but is isolated from and does not apply a voltage to the second epitaxial source/drain regions 82B in the second fin 52B (see FIG. 40D). The source/drain contact 151 is electrically coupled to the conductive line 162 that overlaps the second fin 52B through contact 158, wherein the conductive line 162 has the same orientation (e.g., the X-direction) as the second fin 52B. The conductive line 162 may thus be connected to the first epitaxial source/drain regions 82A in the first fin 52A, even though the conductive line 162 is disposed over the second fin 52B. The presence of the air-gap 153 under the source/drain contact 151 results in a reduction in parasitic capacitance while still maintaining adequate isolation and device reliability. Further, the disclosed method may be integrated easily into existing processes and therefore provides a solution while allowing for lower manufacturing costs.

In accordance with an embodiment, a method includes depositing an interlayer dielectric (ILD) over a source/drain region; implanting impurities into a portion of the ILD; recessing the portion of the ILD to form a trench; forming spacers on sidewalls of the trench, the spacers including a spacer material; forming a source/drain contact in the trench; and removing the spacers and the portion of the ILD with an etching process to form an air-gap, the air-gap disposed under and along sidewalls of the source/drain contact, where the etching process selectively etches the spacer material and the impurity. In an embodiment, the impurities are silicon impurities. In an embodiment, the spacer material is silicon. In an embodiment, the etching process includes etching the spacers and the portion of the ILD with a mixture of nitric acid ($HNO_3$) and hydrofluoric acid (HF) as etchants. In an embodiment, the method further includes depositing a dielectric layer over the air-gap and the source/drain contact to seal the air-gap. In an embodiment, the source/drain region is disposed in a first fin, the first fin being adjacent to a second fin, the method further including forming a gate structure over the first fin and the second fin, where the source/drain contact overlaps the first fin and the second fin. In an embodiment, the air-gap is disposed between the source/drain contact and the source/drain region.

In accordance with an embodiment, a method includes forming a first dielectric layer over an interlayer dielectric (ILD) and a gate structure, the interlayer dielectric (ILD) surrounding the gate structure; etching the first dielectric layer to form a first portion of a trench and expose the ILD; performing an implantation process on the exposed ILD; etching the ILD to form a second portion of the trench; forming a semiconductor layer on sidewalls of the second portion of the trench; forming a source/drain contact in the second portion of the trench; and removing the semiconductor layer and the ILD to form an air-gap, a first portion of the air-gap extending along sidewalls of the source/drain contact, a second portion of the air-gap disposed under the source/drain contact. In an embodiment, the method further includes recessing the gate structure below a top surface of the ILD; and forming a gate mask over the recessed gate structure, where a top surface of the gate mask is level with a top surface of the ILD. In an embodiment, the materials of the ILD and the gate mask are different. In an embodiment, the method further includes forming a second dielectric layer in the second portion of the trench, where sidewalls of the second dielectric layer are disposed between the semiconductor layer and the source/drain contact; and forming a metal layer in the second portion of the trench, where sidewalls of the metal layer are disposed between the second dielectric layer and the source/drain contact. In an embodiment, the semiconductor layer includes silicon. In an embodiment, performing the implantation process on the exposed ILD introduces silicon impurities into the ILD. In an embodiment, removing the semiconductor layer and the ILD further includes performing an etching process that is selective to silicon and silicon doped materials. In an embodiment, the etching process includes a wet etch process performed with a mixture of nitric acid ($HNO_3$) and hydrofluoric acid (HF) as etchants.

In accordance with an embodiment, a device includes a first fin protruding from a semiconductor substrate; a first source/drain region in the first fin; a second fin protruding from the semiconductor substrate; a second source/drain region in the second fin; a source/drain contact overlapping the first source/drain region and the second source/drain region, the source/drain contact connected to the first source/drain region; and an air-gap having a first portion extending along sidewalls of the source/drain contact and having a second portion under the source/drain contact, where the air-gap separates the source/drain contact from the second source/drain region. In an embodiment, the device further includes a conductive line electrically connected to the first source/drain region through the source/drain contact, where the conductive line overlaps and has a same orientation as the second fin. In an embodiment, the device further includes a dielectric layer over the air-gap and the source/drain contact, the dielectric layer sealing the air-gap. In an embodiment, the device further includes a gate structure over the first fin and the second fin; and a gate mask disposed between the gate structure and the dielectric layer, where a top surface of the gate mask, a top surface of the source/drain contact, and a topmost point of the air-gap are at the same level. In an embodiment, the device further includes a dielectric spacer disposed between the sidewalls of the source/drain contact and the first portion of the air-gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing an interlayer dielectric (ILD) over a source/drain region;
implanting impurities into a portion of the ILD;
recessing the portion of the ILD to form a trench;
forming spacers on sidewalls of the trench, the spacers comprising a spacer material;
forming a source/drain contact in the trench; and
removing the spacers and the portion of the ILD with an etching process to form an air-gap, the air-gap disposed under and along sidewalls of the source/drain contact, wherein the etching process selectively etches the spacer material and the impurity, and wherein the air-gap is disposed between the source/drain contact and the source/drain region.

2. The method of claim 1, wherein the impurities are silicon impurities.

3. The method of claim 1, wherein the spacer material is silicon.

4. The method of claim 3, wherein the etching process comprises etching the spacers and the portion of the ILD with a mixture of nitric acid (HNO$_3$) and hydrofluoric acid (HF) as etchants.

5. The method of claim 1 further comprising depositing a dielectric layer over the air-gap and the source/drain contact to seal the air-gap.

6. The method of claim 1, wherein the source/drain region is disposed in a first fin, the first fin being adjacent to a second fin, the method further comprising:

forming a gate structure over the first fin and the second fin, wherein the source/drain contact overlaps the first fin and the second fin.

7. The method of claim 1, wherein the spacers on the sidewalls of the trench are disposed above a topmost surface of the source/drain region.

8. A method comprising:
forming a first dielectric layer over an interlayer dielectric (ILD), a source/drain region, and a gate structure, the interlayer dielectric (ILD) surrounding the gate structure;
etching the first dielectric layer to form a first portion of a trench and expose the ILD;
performing an implantation process on the exposed ILD;
etching a first portion of the ILD to form a second portion of the trench;
forming a semiconductor layer on sidewalls of the second portion of the trench;
forming a second dielectric layer in the second portion of the trench;
forming a source/drain contact in the second portion of the trench, wherein sidewalls of the second dielectric layer are disposed between the semiconductor layer and the source/drain contact, wherein a second portion of the ILD is disposed between the second dielectric layer and the source/drain region, and between the source/drain contact and the source/drain region; and
removing the semiconductor layer and the second portion of the ILD to form an air-gap, a first portion of the air-gap extending along sidewalls of the source/drain contact, a second portion of the air-gap disposed under the source/drain contact.

9. The method of claim 8 further comprising:
recessing the gate structure below a top surface of the ILD; and
forming a gate mask over the recessed gate structure, wherein a top surface of the gate mask is level with a top surface of the ILD.

10. The method of claim 9, wherein the materials of the ILD and the gate mask are different.

11. The method of claim 10 further comprising:
forming a metal layer in the second portion of the trench, wherein sidewalls of the metal layer are disposed between the second dielectric layer and the source/drain contact.

12. The method of claim 8, wherein the semiconductor layer comprises silicon.

13. The method of claim 12, wherein performing the implantation process on the exposed ILD introduces silicon impurities into the ILD.

14. The method of claim 13, wherein removing the semiconductor layer and the second portion of the ILD further comprises performing an etching process that is selective to silicon and silicon doped materials.

15. The method of claim 14, wherein the etching process comprises a wet etch process performed with a mixture of nitric acid (HNO$_3$) and hydrofluoric acid (HF) as etchants.

16. A method comprising:
forming an interlayer dielectric (ILD) over a source/drain region;
modifying a top portion of the ILD by introducing impurities into the top portion of the ILD;
selectively etching the top portion of the ILD to form a trench that is disposed over a bottom portion of the ILD;
forming first spacers on sidewalls of the trench;

forming second spacers on sidewalls of the first spacers in the trench;

forming a source/drain contact in the trench, wherein the bottom portion of the ILD is disposed between the source/drain contact and the source/drain region, and between the first spacers and the source/drain region; and etching the first spacers to form a first portion of an air-gap extending along sidewalls of the source/drain contact.

17. The method of claim 16 further comprising etching the bottom portion of the ILD to form a second portion of the air-gap that is disposed under the source/drain contact.

18. The method of claim 16, wherein the impurities are silicon impurities.

19. The method of claim 18, wherein after modifying the top portion of the ILD, an impurity concentration of the ILD is in a range from $5 \times 10^{20}$ atoms/cm$^3$ to $3 \times 10^{21}$ atoms/cm$^3$.

20. The method of claim 16, wherein the first spacers comprise silicon.

* * * * *